US008787511B2

(12) United States Patent
Brunn et al.

(10) Patent No.: US 8,787,511 B2
(45) Date of Patent: *Jul. 22, 2014

(54) FREQUENCY AND Q-FACTOR TUNABLE FILTERS USING FREQUENCY TRANSLATABLE IMPEDANCE STRUCTURES

(71) Applicant: Marvell World Trade Ltd., St. Michael (BB)

(72) Inventors: Brian Brunn, Bee Cave, TX (US); Gregory Uehara, Kaneohe, HI (US); Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/060,119

(22) Filed: Oct. 22, 2013

(65) Prior Publication Data
US 2014/0044224 A1 Feb. 13, 2014

Related U.S. Application Data

(60) Continuation of application No. 13/412,753, filed on Mar. 6, 2012, now Pat. No. 8,565,349, which is a division of application No. 12/018,933, filed on Jan. 24, 2008, now Pat. No. 8,130,872.

(60) Provisional application No. 60/886,440, filed on Jan. 24, 2007, provisional application No. 60/888,183, filed on Feb. 5, 2007, provisional application No. 60/893,462, filed on Mar. 7, 2007, provisional application No. 60/893,753, filed on Mar. 8, 2007, provisional application No. 60/908,265, filed on Mar. 27, 2007, provisional application No. 60/910,861, filed on Apr. 10, 2007, provisional application No. 60/916,075, filed on May 4, 2007, provisional application No. 60/939,968, filed on May 24, 2007.

(51) Int. Cl.
*H04B 1/10* (2006.01)

(52) U.S. Cl.
CPC .............. *H04B 1/109* (2013.01); *H04B 1/1036* (2013.01)
USPC ...................................................... 375/350

(58) Field of Classification Search
CPC .......... H04B 1/109; H04B 1/036; H04B 1/06; H04B 1/10
USPC .................. 375/316, 130, 140, 141, 346, 350
See application file for complete search history.

(56) References Cited

U.S. PATENT DOCUMENTS 6,791,372 B2 9/2004 Jaussi
8,565,349 B2 * 10/2013 Brunn et al. ................... 375/316

(Continued)

FOREIGN PATENT DOCUMENTS

EP 0829135 A1 3/1998
WO WO-01/26215 A2 4/2001

OTHER PUBLICATIONS

The International Search Report and the Written opinion of the International Searching Authority, or the Declaration datead Jun. 27, 2008, for International Application No. PCT/US2008/000903, filed Jan. 24, 2008; 11 pages.

(Continued)

*Primary Examiner* — Kevin M Burd

(57) ABSTRACT

A system including a filter and a downconverter. The filter is configured to receive, from a node, (i) a first signal and (ii) a second signal, and filter the second signal. The filter includes a first input impedance. The filter comprises a first plurality of switches and a first circuit. The first plurality of switches is configured to communicate with the node. The first plurality of switches is clocked at a first frequency. The first frequency is based on a frequency of the first signal. The first circuit is configured to communicate with an output of the plurality of switches. The first circuit includes a second input impedance. The second input impedance is different than the first input impedance. The downconverter is configured to (i) receive the first signal and (ii) downconvert the first signal. The filter and the downconverter are connected in parallel to the node.

19 Claims, 33 Drawing Sheets

(56) References Cited

U.S. PATENT DOCUMENTS

2003/0078028 A1     4/2003    Shimada et al.
2005/0176393 A1     8/2005    Mizumasa et al.
2008/0125058 A1     5/2008    Rofougaran et al.

OTHER PUBLICATIONS

What is Q?; www.k.ext.ti.com/SRVS/Data/ti/KnowledgeBases/analog/document/faqs/q.htm; Feb. 6, 2007; 2 pages.

Application Note 1838 Mixeer 2x2 Spurious Response and IP2 Relationship; Dallas Semiconductor MAXIM; www.maxim-ic.com/appnotes.cfm/appnote_number/1838; Feb. 5, 2007; 5 pages.

Understanding Surface Acoustic Wave (SAW) Devices for Mobile and Wireless Applications and Design Techniques; Section 18: "An Overview of SAW Devices for Mobile/Wireless Communications"; (68 Questions and Answers for Year 2007); (Including Real-Time SAW Fourier Transformers); Colin K. Campbell, Ph.D., D.Sc.; www3.sympatico.ca/colin.kydd.campbell/; Febrary 2, 2007; 37 pages.

Oualkadi et al., "Fully Integrated High-Q Switched Capacitor Bandpass Filter with Center Frequency and Bandwidth Tuning", IEEE Radio Frequency Integrated Circuits Symposium; Sep. 2007.

Paillot et al., "Switched Capacitor Bandpass Filter Tuned by Ring VCO in CMOS 0.35µm"; IEEE Radio Frequency Integrated Circuits Symposium; Mar. 2003.

Soer et al., "A 0.2-to-2.0GHz 65nm CMOS Receiver Without LNA Achieving>11dBm IIP3 and <6.5 db NF"; IEEE International Solid-State Circuits Conference; Feb. 2009.

Mirzaie et al., "A 65nm CMOS Quad-Band SAW-less Receiver for GSM/GPRS/EDGE"; IEEE 2010 Symposium on VLSI Circuits; 2010; pp. 179-180.

Taiwanese Office Action dated Mar. 20, 2014 for Taiwanese Patent Application No. 097102738; 9 Pages.

\* cited by examiner

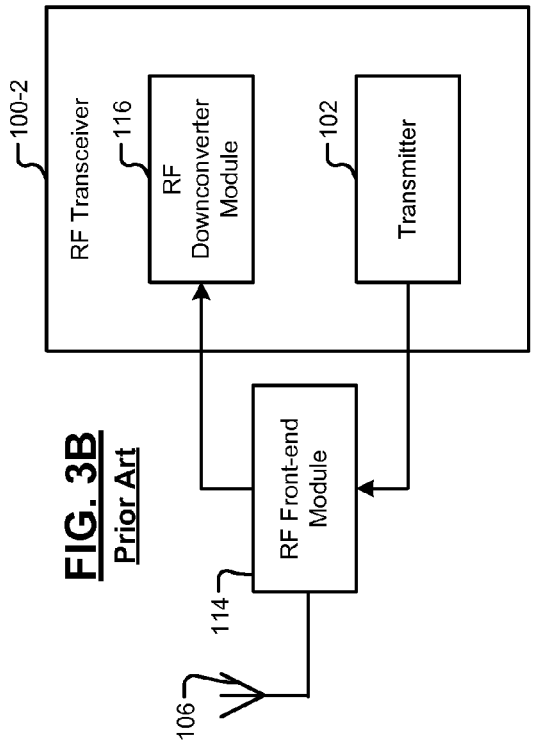
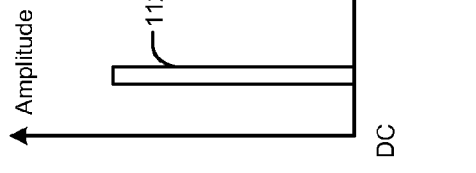
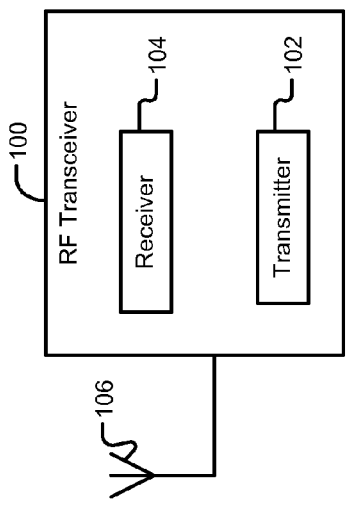
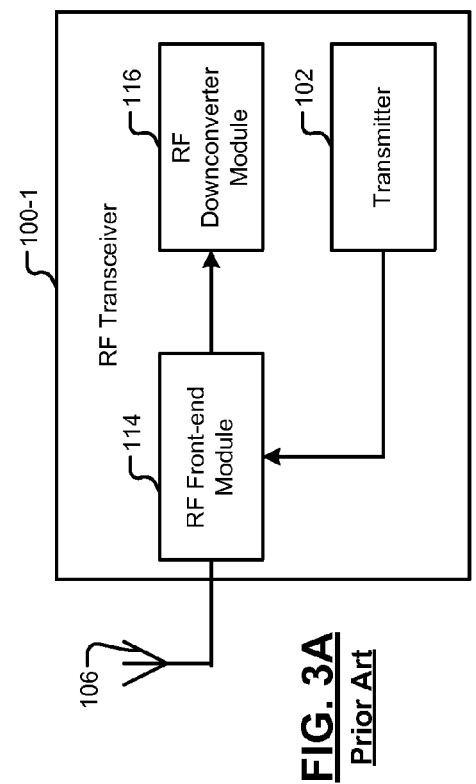

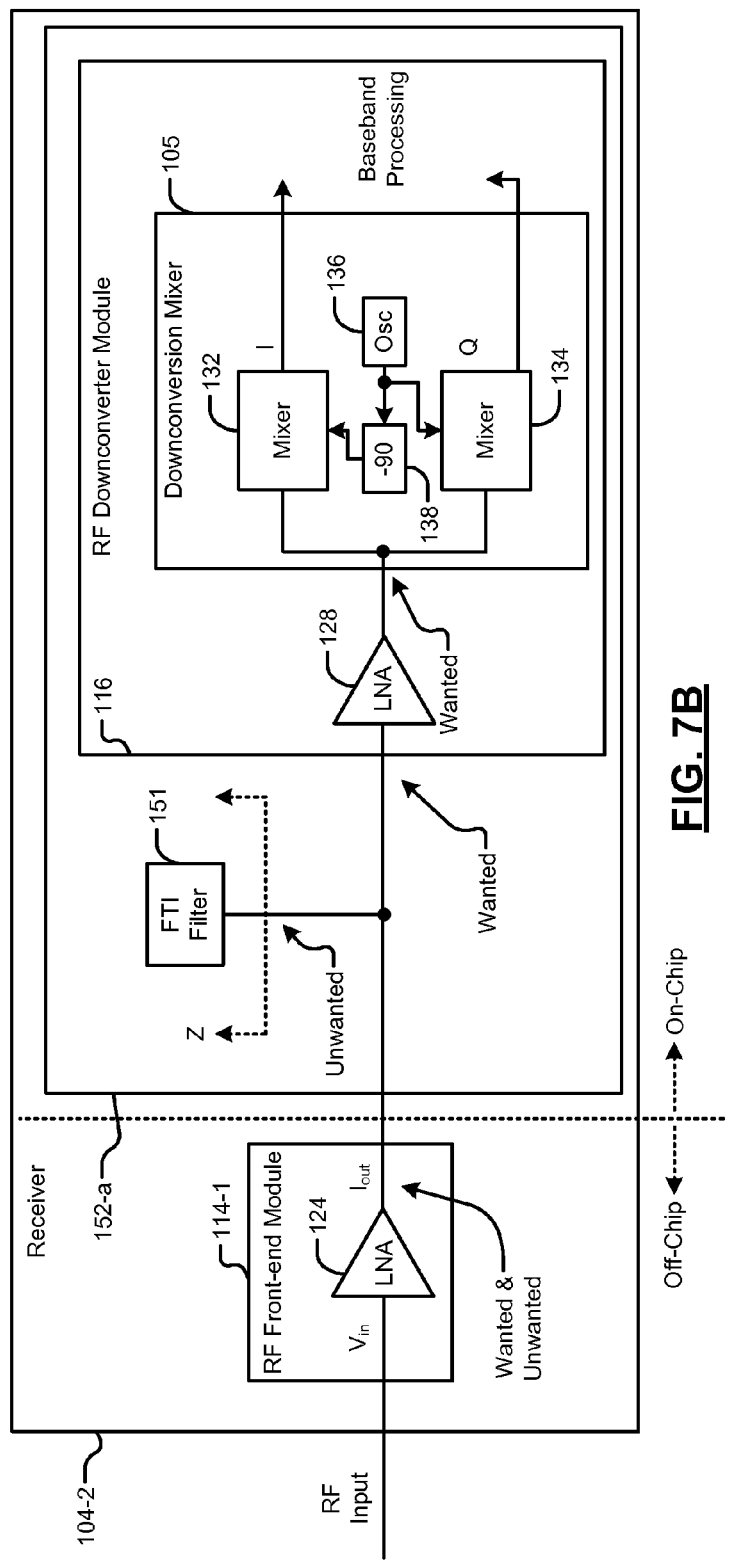
FIG. 7B
FIG. 7C
FIG. 7D

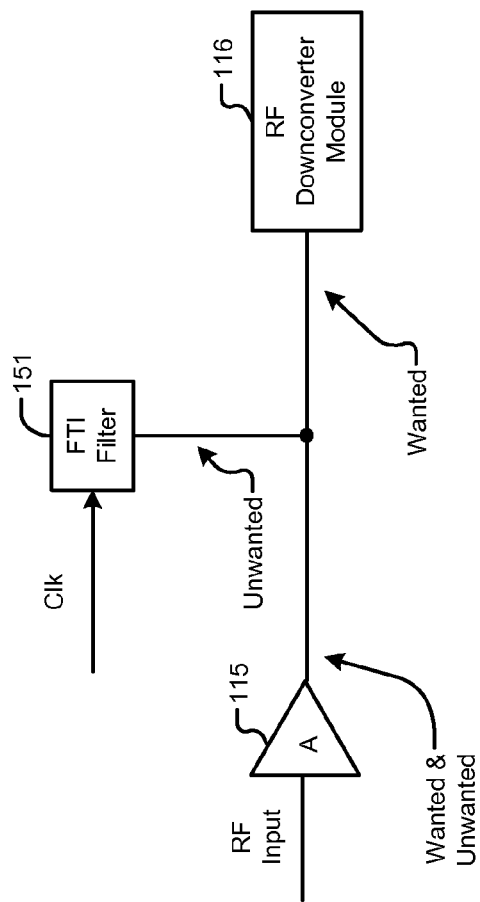
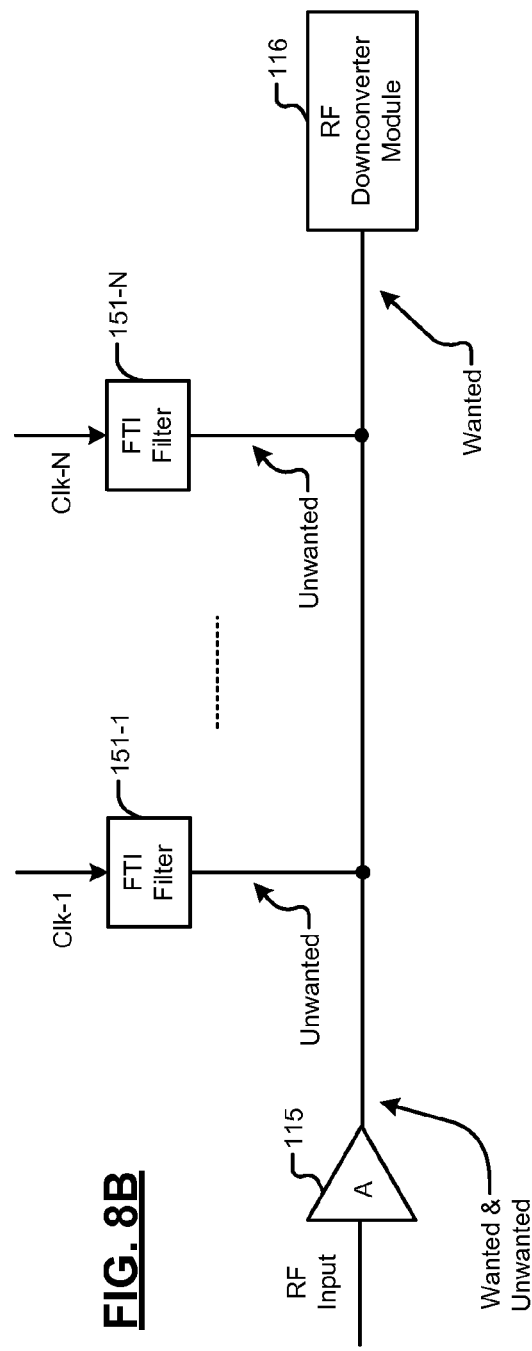
FIG. 8A
FIG. 8B

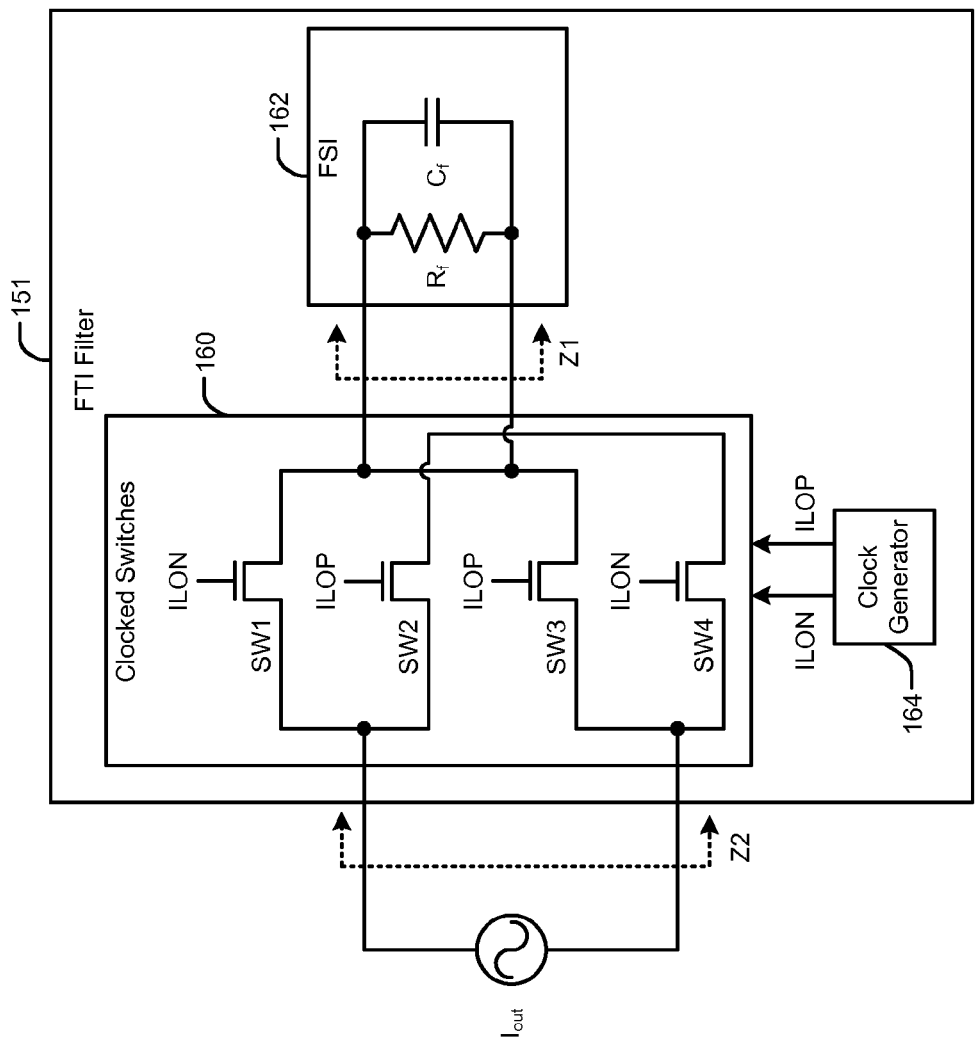
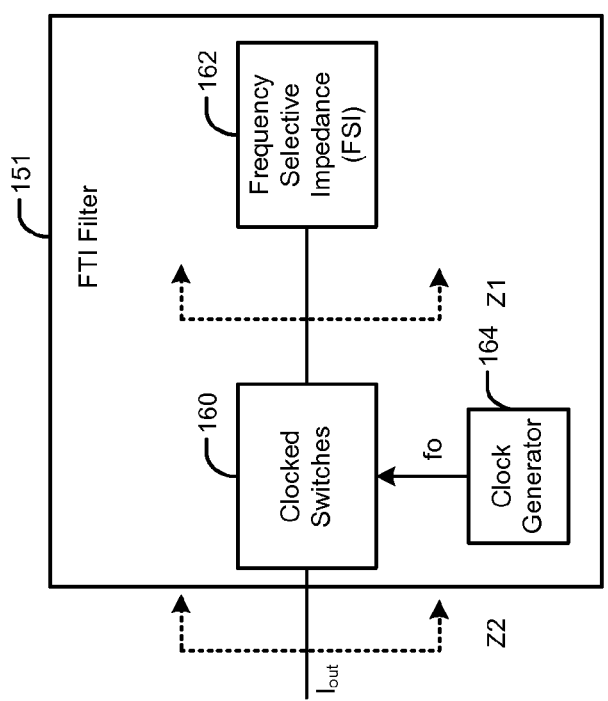
FIG. 9B
FIG. 9A

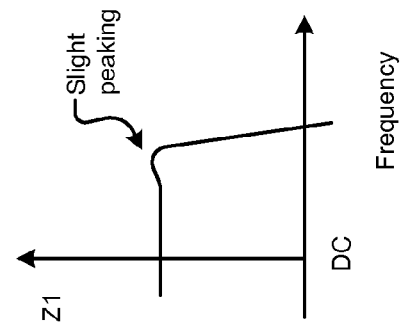
FIG. 10C
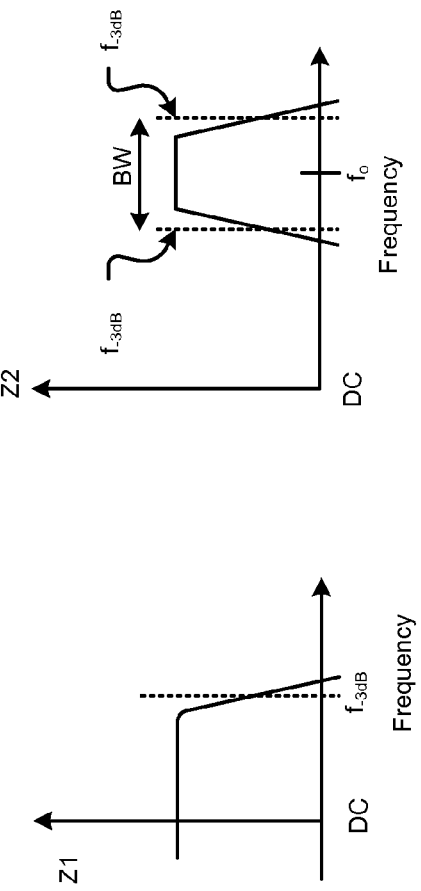
FIG. 10B
FIG. 10A
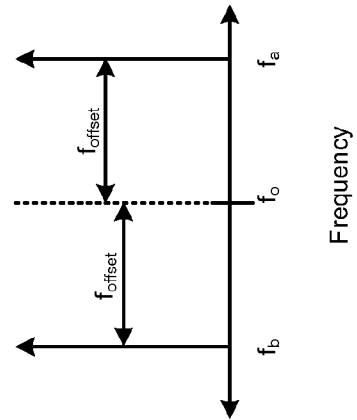
FIG. 11B
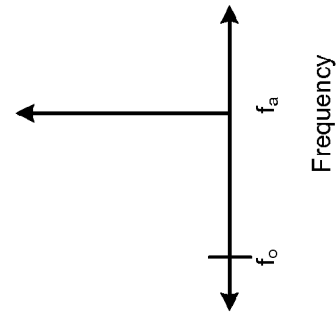
FIG. 11A

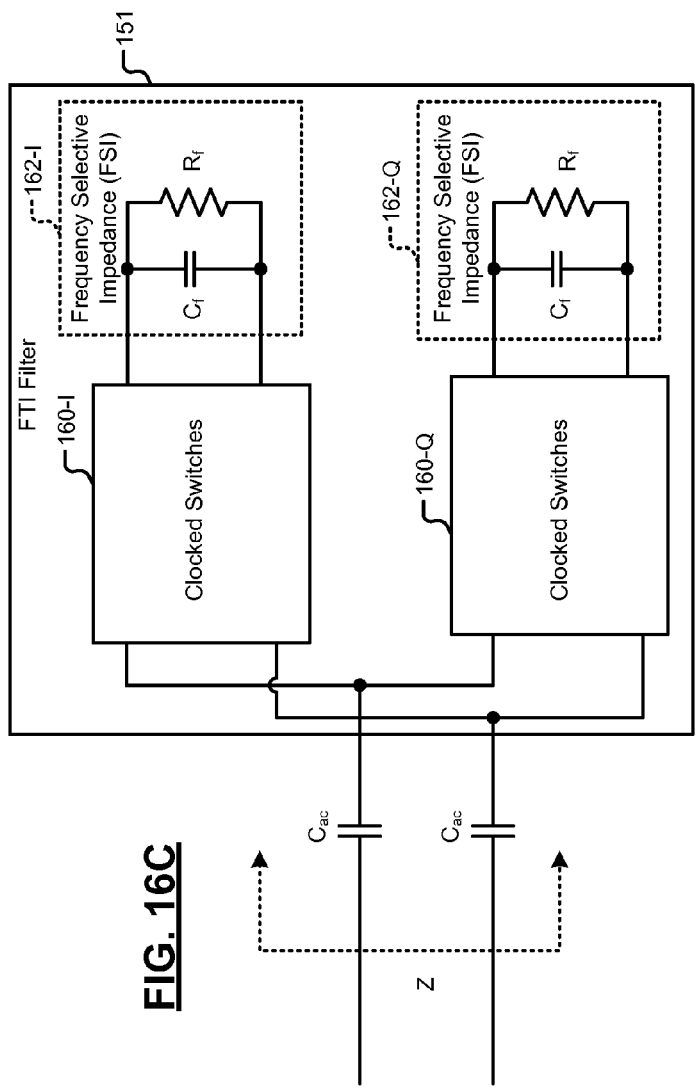
FIG. 16C
FIG. 16D
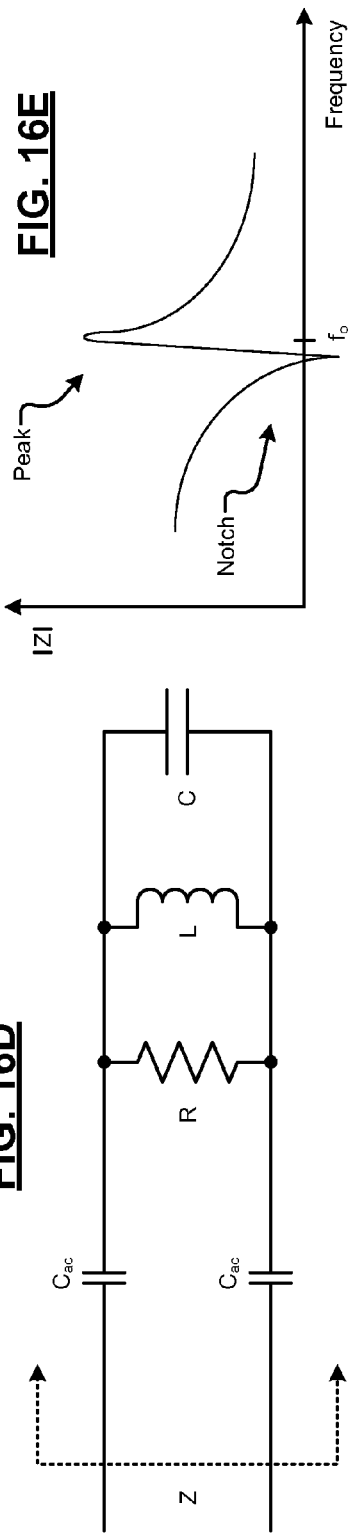
FIG. 16E

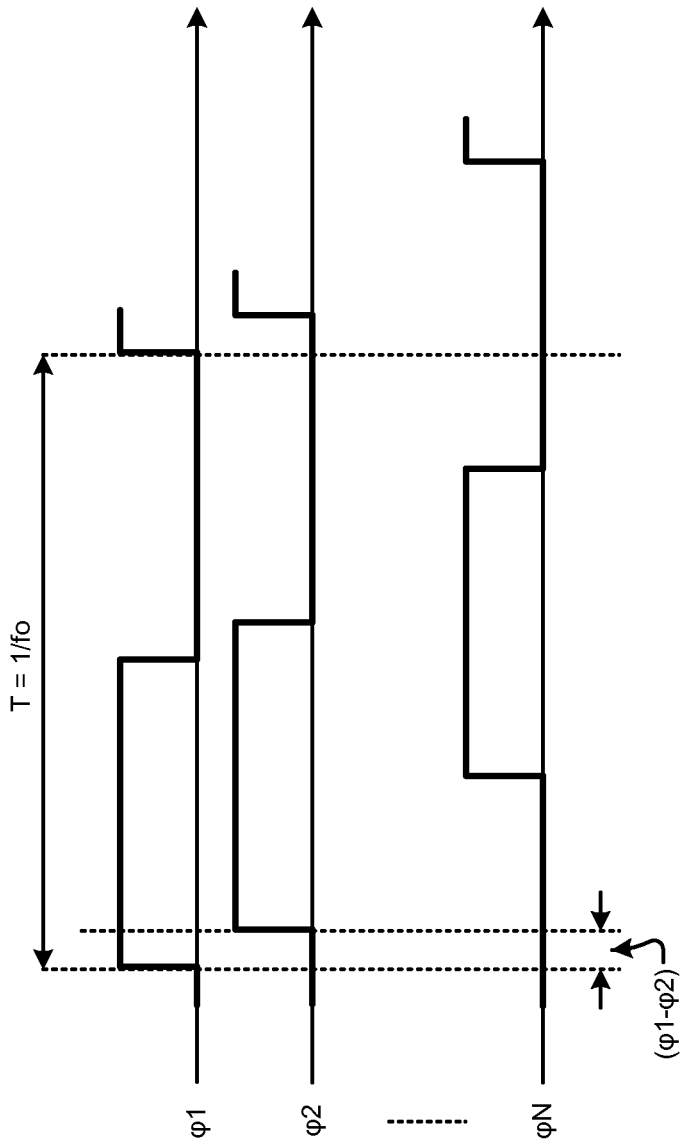

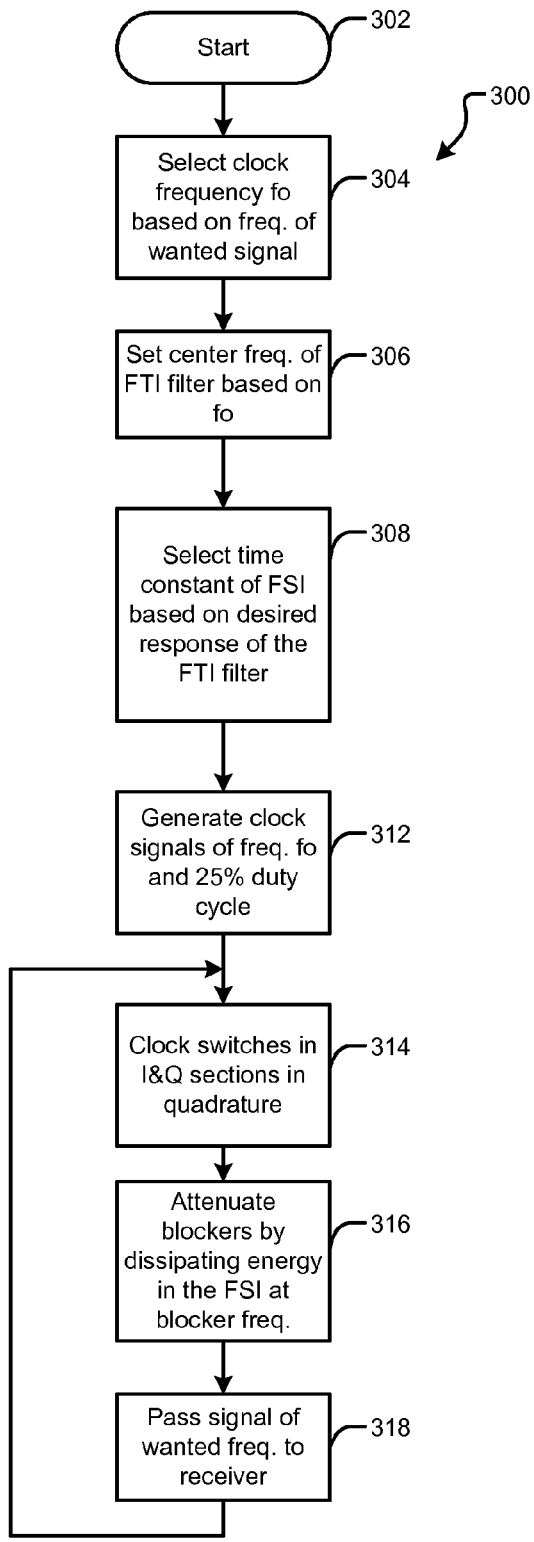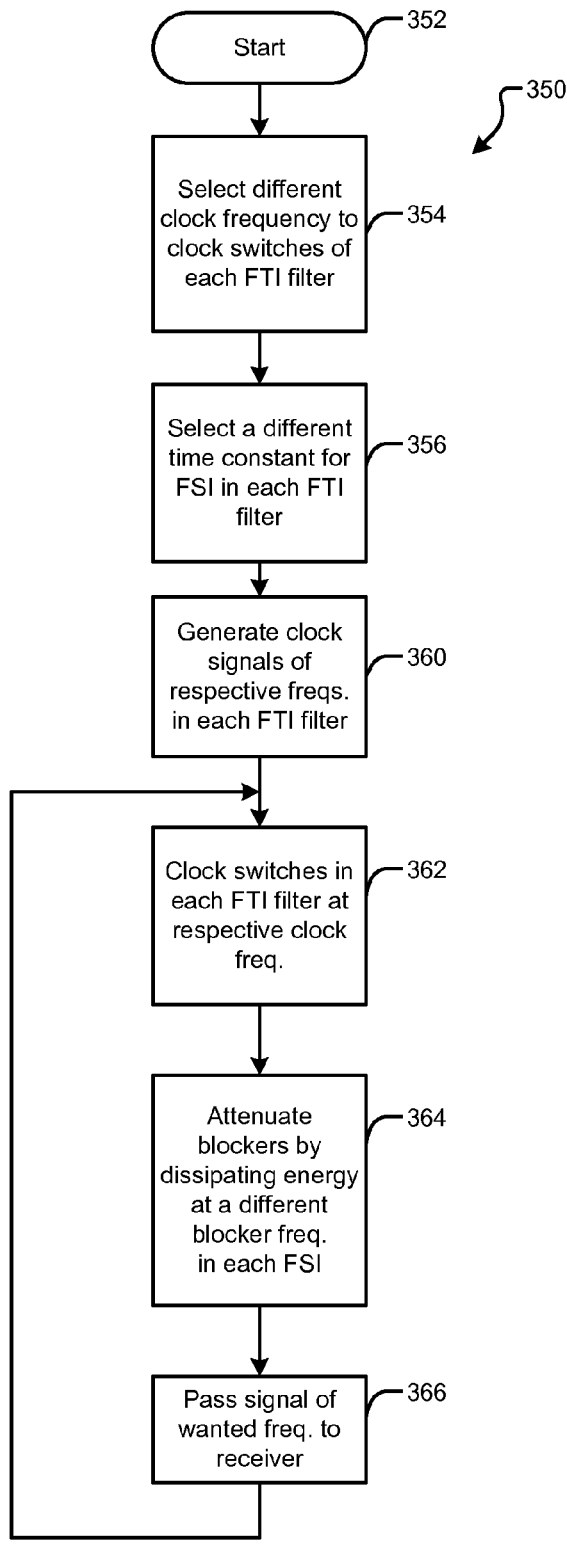
FIG. 19
FIG. 20

US 8,787,511 B2

FREQUENCY AND Q-FACTOR TUNABLE FILTERS USING FREQUENCY TRANSLATABLE IMPEDANCE STRUCTURES

CROSS-REFERENCE TO RELATED APPLICATIONS

This is a continuation of U.S. patent Ser. No. 13/412,753 (now U.S. Pat. No. 8,565,349), filed on Mar. 6, 2012, which is a divisional of U.S. application Ser. No. 12/018,933 (now U.S. Pat. No. 8,130,872), filed on Jan. 24, 2008, which claims the benefit of U.S. Provisional Application No. 60/886,440, filed on Jan. 24, 2007, U.S. Provisional Application No. 60/893,462, filed on Mar. 7, 2007, U.S. Provisional Application No. 60/893,753, filed on Mar. 8, 2007, U.S. Provisional Application No. 60/888,183, filed on Feb. 5, 2007, U.S. Provisional Application No. 60/908,265, filed on Mar. 27, 2007, U.S. Provisional Application No. 60/910,861, filed on Apr. 10, 2007, U.S. Provisional Application No. 60/916,075, filed on May 4, 2007, and U.S. Provisional Application No. 60/939,968, filed on May 24, 2007. The entire disclosures of the above applications are incorporated herein by reference.

FIELD

The present disclosure relates to communication systems, and more particularly to filter circuits.

BACKGROUND

The background description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

Referring now to FIGS. 1-6B, wireless network devices typically transmit and receive radio frequency (RF) signals via RF transceivers. FIG. 1 shows an exemplary RF transceiver. FIG. 2 shows exemplary RF signals including wanted and unwanted RF signals that an RF transceiver may receive via a source such as an antenna. FIGS. 3A and 3B show different exemplary configurations of RF transceivers that can simultaneously transmit and receive RF signals. FIG. 3C shows a duplexer that may be a source of unwanted RF signals. FIGS. 4-6B show different exemplary filter configurations that may be used to filter some of the unwanted RF signals.

In FIG. 1, an RF transceiver 100 that transmits and receives RF signals in wireless communication systems is shown. The RF transceiver 100 may transmit and receive RF signals in a desired frequency band. The RF transceiver 100 may comprise a transmitter 102 that transmits RF signals and a receiver 104 that receives RF signals via an antenna 106. The transmitter 102 may be a super-heterodyne transmitter, a direct conversion transmitter, or other suitable transmitter. The receiver 104 may be a super-heterodyne receiver, a direct conversion receiver, or other suitable receiver. The RF transceiver 100 may be implemented by an integrated circuit (IC).

Transmitters and receivers generate unwanted signal components called intermodulation components due to non-linearity of circuit blocks. For example, receivers may generate intermodulation components due to non-linearity of low-noise amplifiers, transconductors, mixers, amplifiers, and filters. Mixers are a significant source of nonlinearity, particularly in direct conversion receivers.

When receivers receive a wanted channel at a small power level together with unwanted signals with relatively larger power, intermodulation components may fall on or near the wanted channel and reduce receiver performance. Receivers typically use mixers to convert input signals associated with one carrier frequency to output signals having another carrier frequency called an intermediate frequency (IF) or to baseband as in receivers employing direct conversion architecture. Generally, receivers may receive unwanted input signals having relatively large power from different sources.

In FIG. 2, the receiver 104 may receive signals having different frequencies and amplitudes via the antenna 106. For example, the receiver 104 may receive wanted signal 108 having frequencies in the desired frequency band. Additionally, the receiver 104 may receive unwanted or interfering signals called blockers. Blockers may be of two types: In-band blockers 110 that have frequencies in the desired frequency band and out-of-band blockers 112 that have frequencies outside the desired frequency band. The power of the blockers 110, 112 may be greater than the power of the wanted channel 108. Consequently, the blockers 110, 112 may generate unwanted intermodulation components when received by the receiver 104.

Additionally, signals transmitted by the transmitter 102 may be a source of blockers in some systems. For example, in wideband code division multiple access (WCDMA) systems, RF transceivers may comprise RF front-end modules that include duplexers. The RF transceivers may simultaneously transmit and receive data using the duplexers.

In FIG. 3A, a WCDMA transceiver 100-1 may comprise an RF front-end module 114, an RF downconverter module 116, and the transmitter 102. In some implementations, the RF front-end module 114 may comprise filter circuits and may be implemented external to an RF transceiver 100-2 as shown in FIG. 3B. The RF front-end module 114 may refer to components housed in a single enclosure or may be a functional grouping of such components.

In FIGS. 3A and 3B, the RF front-end module 114 may communicate with the antenna 106, the RF downconverter module 116, and the transmitter 102. The RF downconverter module 114 may include mixers (not shown) that downconvert the RF signals received from the antenna 106. The RF front-end module 114 may comprise filters, amplifiers, etc. that the receiver 104 and/or the transmitter 102 may utilize. Accordingly, the receiver 104 may include the RF downconverter module 116 and a portion of the RF front-end module 114 that the receiver 104 may utilize.

In FIG. 3C, the RF front-end module 114 may comprise a duplexer 120 and a power amplifier 122. The RF transceiver 100-2 may simultaneously transmit and receive data via the duplexer 120. The power amplifier 122 may amplify signals output by the transmitter 102. When the RF transceiver 100-2 transmits data, the duplexer 120 may output the amplified signals received from the power amplifier 122 to the antenna 106.

When the RF transceiver 100-2 receives data, the duplexer 120 may receive RF signals from the antenna 106 and may output the signals received from the antenna 106 to the RF downconverter module 116. Additionally, the duplexer 120 may inject residual signals, which are attenuated portions of the amplified signals output by the power amplifier 122, into the RF downconverter module 116.

Despite being attenuated, the residual signals may have a power level significantly greater than the power of the wanted channel received from the antenna 106. Consequently, the residual signals may appear as large blockers at the input of the RF downconverter module 116 and may result in the generation of unwanted intermodulation components in the RF downconverter module 116.

Unwanted intermodulation components may be minimized by using highly linear circuit blocks (i.e., circuits with high second-order input intercept point (IIP2) and third-order input intercept point (IIP3) ratings). Generally, the relationship between the power of blocker(s) to the power of the wanted channel and their relative frequencies determines the IIP2 and IIP3 ratings required for the circuit blocks. The greater the ratio of the power of the blocker(s) to the wanted channel, the higher the IIP2 and IIP3 ratings required for the circuit blocks to generate acceptably low-power unwanted intermodulation components.

In receivers using direct conversion architectures, mixers with high IIP2 ratings are typically required. The implementation of highly linear mixers may, however, be impractical due to design and cost constraints. Calibration methods may be utilized to achieve highly linear mixers. However, even after calibration is performed, intermittent calibration or background calibration may be required to track temperature and power supply variations. This can be problematic in some applications where continuous operation is required.

Instead, the unwanted intermodulation components may be minimized by attenuating blockers relative to the wanted channel using filters that precede the mixers so that mixers with relaxed IIP2 and IIP3 ratings may be used. Generally, the lower the power (i.e., the greater the attenuation) of the blocker(s), the lower the IIP2 and IIP3 ratings necessary for the mixers. For example, attenuating blockers before the input of a mixer by 1 dB may decrease the IIP2 rating of the mixer by 2 dB.

Blockers may be attenuated by using a variety of filters. Typically, RF transceivers implemented by integrated circuits (ICs) may have on-chip filters. The on-chip filters, however, may be unable to adequately filter blockers relative to the wanted channel to provide significant relaxation of the linearity requirements of the circuit blocks. As a result, additional filters may be arranged external to the ICs comprising the RF transceivers to attenuate blockers. For example, filters including surface acoustic wave (SAW) filters, film bulk acoustic resonator (FBAR) filters, and/or LC tank filters can be used preceding circuit blocks to attenuate blockers and relax linearity requirements for the circuit blocks that follow.

In FIGS. 4-6B, different exemplary filter configurations for attenuating blockers are shown. In FIG. 4, a SAW filter 126 is arranged externally to the IC comprising the RF transceiver 100-2 to attenuate blockers. An RF front-end module 114-1 may comprise a low-noise amplifier (LNA) 124 that communicates with the duplexer 120 and amplifies the signals received from the duplexer 120. The LNA 124 may amplify both the RF signals received by the duplexer 120 via the antenna 106 and the residual signals. The LNA 124 may output the amplified signals including amplified residual signals to the RF downconverter module 116. The SAW filter 126 may attenuate the amplified residual signals.

Alternatively, SAW filters and/or LC tank filters (e.g., band-pass or notch filters) may be included in RF front-end modules as shown in FIGS. 5 and 6A, respectively. In some implementations, the SAW filter 126 alone may precede the RF downconverter module 116 as shown in FIG. 6B.

In FIGS. 5-6B, the RF downconverter module 116 may comprise a downconversion mixer 105. The downconversion mixer 105 may include an LNA 128 and mixers 132 and 134. The mixers 132 and 134 may be arranged in a quadrature configuration. An oscillator 136 and a 90-degree phase shifter 138 may generate clock signals that clock the mixers 132 and 134, respectively. The mixers 132 and 134 may generate in-phase (I) and quadrature (Q) outputs, respectively. The I and Q outputs may be input to baseband processing circuits (not shown) for further processing.

In FIG. 5, an RF front-end module 114-2 may include the SAW filter 126. The SAW filter 126 may receive input from the LNA 124, may attenuate blockers, and may generate an output that is input to the LNA 128. The LNA 128 may amplify wanted signals that are input to the mixers 132 and 134. In FIG. 6A, an LC tank filter 130 may be included in an RF front-end module 114-3 to attenuate blockers. To substantially attenuate blockers, however, filters such as the LC tank filter 130 may need to have a very high Q-factor (e.g., Q of the order of 100 or greater).

SUMMARY

A system comprises an input node, a frequency translatable impedance (FTI) filter, and a radio frequency (RF) downconverter module. The input receives an input signal having first and second components. The FTI filter filters the second components. The RF downconverter module receives the first components and downconverts the first components. The FTI filter and the RF downconverter module both communicate with the input node.

In other features, the second components include at least one of intermodulation components and interference signals. The FTI filter has a first input impedance. The FTI filter comprises first clocked switches and a first frequency selective impedance (FSI). The first clocked switches communicate with the input node and are clocked at a first frequency. The first FSI communicates with an output of the first clocked switches and has a second input impedance that is different than the first input impedance. The first clocked switches comprise first switches that communicate with the input node, and the system comprises a clock generator that generates first clock signals that have the first frequency and that clock the first switches at a duty cycle.

In still other features, the first and second input impedances have first and second frequency responses, respectively, and the first frequency response is based on the second frequency response translated to the first frequency and mirrored around the first frequency. The first frequency is based on a frequency of the first components of the input signal. The first FSI has one of a low-pass, a high-pass, and a notch frequency response. The first input impedance has a band-pass frequency response when the second input impedance has a low-pass frequency response. The first input impedance has a notch frequency response when the second input impedance has a high-pass frequency response. The first FSI has a first time constant, and a quality factor (Q-factor) of the FTI filter is based on the first time constant and the first frequency. The Q-factor is at least 100.

In other features, the FTI filter further comprises second clocked switches and a second FSI. The second clocked switches communicate with the input node and are clocked at the first frequency. The second FSI communicates with an output of the second clocked switches and has a third input impedance that is different than the first input impedance. The second clocked switches comprise second switches that communicate with the input node, and wherein the clock generator generates second clock signals that have the first frequency and that switch the second switches at the duty cycle. The second clock signals have a phase that is offset relative to the first clock signals, and the duty cycle is 25%. The third input impedance has a third frequency response, and the first frequency response is based on at least one of the second and third frequency responses translated to the first frequency and mirrored around the first frequency. The second FSI has one of a low-pass, a high-pass, and a notch frequency response. The first input impedance has a band-pass frequency response when at least one of the second and third input impedances has a low-pass frequency response. The first input impedance has a notch frequency response when at least one of the second and third input impedances has a high-pass frequency response. The second FSI has a second time constant, and a quality factor (Q-factor) of the FTI filter is based on the second time constant and the first frequency. The Q-factor is at least 100.

In other features, an integrated circuit (IC) comprises the system. A receiver comprises the IC. A system comprises the IC and further comprises a transmitter, wherein the second components include portions of signals transmitted by the transmitter. The first and second clocked switches are coupled to the input node via first and second coupling capacitances, respectively. The first input impedance has a notch frequency response at frequencies less than the first frequency. The system further comprises a bias generator that generates a bias voltage that biases the first and second FSIs. The first and second FSIs comprise a filter capacitance and first and second filter resistances. The filter capacitance is connected in parallel to a series connection of the first and second filter resistances. The bias voltage is applied at an interconnection of the first and second filter resistances.

In other features, the first and second FSIs comprise a filter capacitance. The first and second clocked switches have first and second ends. The first ends of the first and second clocked switches communicate with the first coupling capacitance. The second ends of the first and second clocked switches communicate with the second coupling capacitance. The system further comprises first and second filter resistances that are connected in series and third and fourth filter resistances that are connected in series. The bias voltage is applied at an interconnection of the first and second filter resistances and at an interconnection of the third and fourth filter resistances. The first ends of the first and second clocked switches communicate with the first and third filter resistances. The second ends of the first and second clocked switches communicate with the second and fourth filter resistances.

In other features, the system further comprises first and second filter resistances that are connected in series. The bias voltage is applied at an interconnection of the first and second filter resistances. The first ends of the first and second clocked switches communicate with the first filter resistance. The second ends of the first and second clocked switches communicate with the second filter resistance. The system further comprises first and second coupling resistances that are connected in series. The bias voltage is applied at an interconnection of the first and second coupling resistances. The first ends of the first and second clocked switches communicate with the first coupling resistance. The second ends of the first and second clocked switches communicate with the second coupling resistance. The system further comprises first and second filter resistances that are connected in series, wherein the first filter resistance communicates with the input node and the first coupling capacitance, and wherein the second filter resistance communicates with the input node and the second coupling capacitance.

In other features, the system further comprises a differential input low-noise amplifier (LNA) that generates the input signal, wherein the LNA includes an output stage that includes filter resistances of the first and second FSIs as load resistances. The system further comprises a single-ended input low-noise amplifier (LNA) that generates the input signal, wherein the LNA includes an output stage that includes a balun. The system further comprises a differential input low-noise amplifier (LNA) that generates the input signal, wherein the LNA includes an output stage that includes biasing circuits. Each of the biasing circuits includes a biasing impedance, where a time constant of the FTI filter is based on the biasing impedance and the second and third input impedances. The biasing circuits include one of resistances, current sources having common-mode feedback, and inductances. The duty cycle is $(25\pm n)$ %, where $n\leq 5$. The first and second clock signals overlap.

A method comprises receiving an input signal having first and second components via an input node. The method further comprises filtering the second components using a frequency translatable impedance (FTI) filter that is connected to the input node. The method further comprises connecting a radio frequency (RF) downconverter module to the input node. The method further comprises receiving the first components from the input node and downconverting the first components using the RF downconverter module.

In other features, the second components include at least one of intermodulation components and interference signals. The method further comprises communicating with the input node via first clocked switches of the FTI filter, wherein the FTI filter has a first input impedance, and communicating with an output of the first clocked switches via a first frequency selective impedance (FSI) of the FTI filter, wherein the first FSI has a second input impedance that is different than the first input impedance. The method further comprises communicating with the input node via first switches of the first clocked switches, generating first clock signals having a first frequency, and clocking the first switches at a duty cycle. The first and second input impedances have first and second frequency responses, respectively, the first frequency response is based on the second frequency response, and the method further comprises translating the second frequency response to the first frequency and mirroring the second frequency response around the first frequency.

In other features, the method further comprises selecting the first frequency based on a frequency of the first components of the input signal. The method further comprises configuring the first FSI to have one of a low-pass, a high-pass, and a notch frequency response. The first input impedance has a band-pass frequency response when the second input impedance has a low-pass frequency response. The first input impedance has a notch frequency response when the second input impedance has a high-pass frequency response. The method further comprises selecting a first time constant of the first FSI and a quality factor (Q-factor) of the FTI filter based on the first time constant and the first frequency. The Q-factor is at least 100.

In other features, the method further comprises communicating with the input node via second clocked switches of the FTI filter, and communicating with an output of the second clocked switches via a second FSI of the FTI filter, wherein the second FSI has a third input impedance that is different than the first input impedance. The method further comprises communicating with the input node via second switches of the second clocked switches, generating second clock signals having the first frequency, and switching the second switches at the duty cycle using the second clock signals.

In still other features, the method further comprises offsetting a phase of the second clock signals relative to the first clock signals, and setting the duty cycle to 25%. The third input impedance has a third frequency response, the first frequency response is based on at least one of the second and third frequency responses, and the method further comprises translating the at least one of the second and third frequency responses to the first frequency, and mirroring the at least one of the second and third frequency responses around the first frequency. The method further comprises configuring the second FSI to have one of a low-pass, a high-pass, and a notch frequency response. The first input impedance has a band-pass frequency response when the at least one of the second and third impedances has a low-pass frequency response. The first input impedance has a notch frequency response when the at least one of the second and third impedances has a high-pass frequency response.

In other features, the method further comprises selecting a second time constant of the second FSI and a quality factor (Q-factor) of the FTI filter based on the second time constant and the first frequency. The Q-factor is at least 100. The method further comprises integrating the FTI filter and the RF downconverter module in an integrated circuit (IC). The method further comprises communicating with a transmitter, wherein the second components include portions of signals transmitted by the transmitter. The method further comprises coupling the first and second clocked switches to the input node via first and second coupling capacitances, respectively. The first input impedance has a notch frequency response at frequencies less than the first frequency. The method further comprises generating a bias voltage and biasing the first and second FSIs using the bias voltage. The method further comprises configuring the first and second FSIs to include a filter capacitance and first and second filter resistances, connecting the first and second filter resistances in series, connecting the filter capacitance in parallel to a series connection of the first and second filter resistances, and applying the bias voltage at an interconnection of the first and second filter resistances.

In other features, the method further comprises configuring the first and second FSIs to include a filter capacitance, communicating with the first coupling capacitance via first ends of the first and second clocked switches, and communicating with the second coupling capacitance via second ends of the first and second clocked switches.

In other features, the method further comprises connecting first and second filter resistances in series, connecting third and fourth filter resistances in series, applying the bias voltage at an interconnection of the first and second filter resistances and at an interconnection of the third and fourth filter resistances, communicating with the first and third filter resistances via the first ends of the first and second clocked switches, and communicating with the second and fourth filter resistances via the second ends of the first and second clocked switches.

In other features, the method further comprises connecting first and second filter resistances in series, applying the bias voltage at an interconnection of the first and second filter resistances, communicating with the first filter resistance via the first ends of the first and second clocked switches, and communicating with the second filter resistance via the second ends of the first and second clocked switches. The method further comprises connecting first and second coupling resistances in series, applying the bias voltage at an interconnection of the first and second coupling resistances, communicating with the first coupling resistance via the first ends of the first and second clocked switches, and communicating with the second coupling resistance via the second ends of the first and second clocked switches.

In other features, the method further comprises connecting first and second filter resistances in series, communicating with the input node and the first coupling capacitance via the first filter resistance, and communicating with the input node and the second coupling capacitance via the second filter resistance.

In other features, the method further comprises generating the input signal using a differential input low-noise amplifier (LNA) and configuring an output stage of the LNA to include filter resistances of the first and second FSIs as load resistances. The method further comprises generating the input signal using a single-ended input low-noise amplifier (LNA) and configuring an output stage of the LNA to include balun. The method further comprises generating the input signal using a differential input low-noise amplifier (LNA) and configuring an output stage of the LNA to include biasing circuits. The method further comprises configuring each of the biasing circuits to include a biasing impedance, wherein a time constant of the FTI filter is based on the biasing impedance and the second and third input impedances. The method further comprises configuring the biasing circuits to include one of resistances, current sources having common-mode feedback, and inductances. The method further comprises setting the duty cycle to (25±n) %, where n≤5. The method further comprises overlapping the first and second clock signals.

In still other features, a system comprises an input node for receiving an input signal having first and second components. The system further comprises frequency translatable impedance (FTI) filtering means for filtering the second components and radio frequency (RF) downconverter means for receiving the first components and downconverting the first components, wherein the FTI filtering means and the RF downconverter means both communicate with the input node.

In other features, the second components include at least one of intermodulation components and interference signals. The FTI filtering means has a first input impedance. The FTI filtering means comprises first clocked switching means for communicating with the input node, wherein the first clocked switching means is clocked at a first frequency. The FTI filtering means further comprises first frequency selective impedance (FSI) means for communicating with an output of the first clocked switching means, wherein the first FSI means has a second input impedance that is different than the first input impedance. The first clocked switching means comprises first switching means for communicating with the input node, and the system comprises clock generator means for generating first clock signals that have the first frequency and that clock the first switching means at a duty cycle. The first and second input impedances have first and second frequency responses, respectively, and the first frequency response is based on the second frequency response translated to the first frequency and mirrored around the first frequency. The first frequency is based on a frequency of the first components of the input signal. The first FSI means has one of a low-pass, a high-pass, and a notch frequency response. The first input impedance has a band-pass frequency response when the second input impedance has a low-pass frequency response. The first input impedance has a notch frequency response when the second input impedance has a high-pass frequency response. The first FSI means has a first time constant, and a quality factor (Q-factor) of the FTI filtering means is based on the first time constant and the first frequency. The Q-factor is at least 100.

In other features, the FTI filtering means further comprises second clocked switching means for communicating with the input node, wherein the second clocked switching means is clocked at the first frequency. The FTI filtering means further comprises second FSI means for communicating with an output of the second clocked switching means, wherein the second FSI means has a third input impedance that is different than the first input impedance.

In other features, the second clocked switching means comprises second switching means for communicating with the input node, and the clock generator means generates second clock signals that have the first frequency and that switch the second switching means at the duty cycle. The second clock signals have a phase that is offset relative to the first clock signals, and wherein the duty cycle is 25%. The third input impedance has a third frequency responses, and wherein the first frequency response is based on at least one of the second and third frequency responses translated to the first frequency and mirrored around the first frequency. The second FSI means has one of a low-pass, a high-pass, and a notch frequency response. The first input impedance has a bandpass frequency response when at least one of the second and third input impedances has a low-pass frequency response. The first input impedance has a notch frequency response when at least one of the second and third input impedances has a high-pass frequency response. The second FSI means has a second time constant, and a quality factor (Q-factor) of the FTI filtering means is based on the time second constant and the first frequency. The Q-factor is at least 100.

In other features, an integrated circuit (IC) comprises the system. A receiver comprises the IC. A system comprises the IC and further comprises a transmitter, wherein the second components include portions of signals transmitted by the transmitter. The first and second clocked switching means are coupled to the input node via first and second coupling capacitances, respectively. The first input impedance has a notch frequency response at frequencies less than the first frequency. The system further comprises bias generator means for generating a bias voltage and biasing the first and second FSI means using the bias voltage. The first and second FSI means comprise a filter capacitance and first and second filter resistances, wherein the filter capacitance is connected in parallel to a series connection of the first and second filter resistances. The bias voltage is applied at an interconnection of the first and second filter resistances.

In other features, the first and second FSI means comprise a filter capacitance, and the first and second clocked switching means have first and second ends. The first ends of the first and second clocked switching means communicate with the first coupling capacitance. The second ends of the first and second clocked switching means communicate with the second coupling capacitance.

In other features, the system further comprises first and second filter resistances that are connected in series and third and fourth filter resistances that are connected in series. The bias voltage is applied at an interconnection of the first and second filter resistances and at an interconnection of the third and fourth filter resistances. The first ends of the first and second clocked switching means communicate with the first and third filter resistances. The second ends of the first and second clocked switching means communicate with the second and fourth filter resistances.

In other features, the system further comprises first and second filter resistances that are connected in series. The bias voltage is applied at an interconnection of the first and second filter resistances. The first ends of the first and second clocked switching means communicate with the first filter resistance. The second ends of the first and second clocked switching means communicate with the second filter resistance. The system further comprises first and second coupling resistances that are connected in series. The bias voltage is applied at an interconnection of the first and second coupling resistances. The first ends of the first and second clocked switching means communicate with the first coupling resistance. The second ends of the first and second clocked switching means communicate with the second coupling resistance.

In other features, the system further comprises first and second filter resistances that are connected in series, wherein the first filter resistance communicates with the input node and the first coupling capacitance, and wherein the second filter resistance communicates with the input node and the second coupling capacitance. The system further comprises differential input low-noise amplifier (LNA) means for generating the input signal, wherein the LNA means includes an output stage that includes filter resistances of the first and second FSI means as load resistances. The system further comprises single-ended input low-noise amplifier (LNA) means for generating the input signal, wherein the LNA means includes an output stage that includes a balun. The system further comprises differential input low-noise amplifier (LNA) means for generating the input signal, wherein the LNA means includes an output stage that includes biasing means for generating a direct current (DC) bias voltage.

In other features, each of the biasing means includes a biasing impedance, wherein a time constant of the FTI filtering means is based on the biasing impedance and the second and third input impedances. The biasing means include one of resistances, current sources having common-mode feedback, and inductances. The duty cycle is (25±n) %, where n≤5. The first and second clock signals overlap.

A filter comprises an input node, first clocked switches of the filter, and a first frequency selective impedance (FSI). The first clocked communicate with the input node and receive first clock signals having a first frequency, wherein the filter has a first input impedance. The first frequency selective impedance (FSI) communicates with an output of the first clocked switches and has a second input impedance that is different than the first input impedance. The first and second input impedances are frequency-dependent impedances, the first input impedance is based on the second input impedance and the first frequency.

In other features, both the filter and a radio frequency (RF) downconverter module of a receiver communicate with the input node. The first clocked switches comprise first switches that communicate with the input node, wherein the filter further comprises a clock generator that generates the first clock signals, and the first switches are switched by the first clock signals at a duty cycle. The first and second input impedances have first and second frequency responses, respectively, and the first frequency response is based on the second frequency response translated to the first frequency and mirrored around the first frequency. The input node receives an input signal having first and second components, the first frequency is based on a frequency of the first components of the input signal, and the filter filters the second components. The second components include at least one of intermodulation components and interference signals. The first FSI has one of a low-pass, a high-pass, and a notch frequency response. The first input impedance has a bandpass frequency response when the second input impedance has a low-pass frequency response. The first input impedance has a notch frequency response when the second input impedance has a high-pass frequency response. The first FSI has a first time constant, and a quality factor (Q-factor) of the filter is based on the first time constant and the first frequency. The Q-factor is at least 100. The filter further comprises second clocked switches and a second FSI. The second clocked switches communicate with the input node and are clocked at the first frequency. The second FSI communicates with an output of the second clocked switches and has a third input impedance that is different than the first input impedance. The third input impedance is a frequency-dependent impedance, and the first input impedance is based on the first frequency and at least one of the second and third input impedances.

In other features, the input node receives an input signal having first and second components, and the filter filters the second components having a first frequency that is an image of a second frequency of the first components. The second clocked switches comprise second switches that communicate with the input node, and the clock generator generates second clock signals at the first frequency that clock the second switches at the duty cycle. The second clock signals have a phase that is offset relative to the first clock signals and wherein the duty cycle is 25%. The third input impedance has a third frequency response, and the first frequency response is based on at least one of the second and third frequency responses translated to the first frequency and mirrored around the first frequency. The second FSI has one of a low-pass, a high-pass, and a notch frequency response. The first input impedance has a band-pass frequency response when at least one of the second and third input impedances has a low-pass frequency response. The first input impedance has a notch frequency response when at least one of the second and third input impedances has a high-pass frequency response. The second FSI has a second time constant, and a quality factor (Q-factor) of the filter is based on the second time constant and the first frequency. The Q-factor is at least 100.

In other features, an integrated circuit (IC) comprises the filter and further comprises the RF downconverter module. An integrated circuit (IC) comprises the filter and further comprises a radio frequency (RF) downconverter module of a receiver, wherein both the filter and the RF downconverter module communicate with the input node. A system comprises a plurality of the filters and further comprises at least one of a transmitter and a radio frequency (RF) downconverter module of a receiver, wherein both the filters and the RF downconverter module communicate with the input node. A time constant of the first FSI in one of the plurality of filters is different than the time constant of the first FSI in another of the plurality of filters.

In other features, the first frequency in one of the plurality of filters is different than the first frequency in another of the plurality of filters. A phase of the first clock signals in one of the plurality of filters is offset relative to another of the plurality of filters. An integrated circuit (IC) comprises the system.

In other features, the first and second clocked switches are coupled to the input node via first and second coupling capacitances, respectively. The first input impedance has a notch frequency response at frequencies less than the first frequency. The filter further comprises a bias generator that generates a bias voltage that biases the first and second FSIs. The first and second FSIs comprise a filter capacitance and first and second filter resistances, wherein the filter capacitance is connected in parallel to a series connection of the first and second filter resistances, and the bias voltage is applied at an interconnection of the first and second filter resistances.

In other features, the first and second FSIs comprise a filter capacitance, and the first and second clocked switches have first and second ends. The first ends of the first and second clocked switches communicate with the first coupling capacitance. The second ends of the first and second clocked switches communicate with the second coupling capacitance. The filter further comprises first and second filter resistances that are connected in series and third and fourth filter resistances that are connected in series. The bias voltage is applied at an interconnection of the first and second filter resistances and at an interconnection of the third and fourth filter resistances. The first ends of the first and second clocked switches communicate with the first and third filter resistances. The second ends of the first and second clocked switches communicate with the second and fourth filter resistances.

In other features, the filter further comprises first and second filter resistances that are connected in series. The bias voltage is applied at an interconnection of the first and second filter resistances. The first ends of the first and second clocked switches communicate with the first filter resistance. The second ends of the first and second clocked switches communicate with the second filter resistance. The filter further comprises first and second coupling resistances that are connected in series. The bias voltage is applied at an interconnection of the first and second coupling resistances. The first ends of the first and second clocked switches communicate with the first coupling resistance. The second ends of the first and second clocked switches communicate with the second coupling resistance. The filter further comprises first and second filter resistances that are connected in series, wherein the first filter resistance communicates with the input node and the first coupling capacitance, and wherein the second filter resistance communicates with the input node and the second coupling capacitance.

In other features, a system comprises the filter and further comprises a differential input low-noise amplifier (LNA) that generates the input signal, wherein the LNA includes an output stage that includes filter resistances of the first and second FSIs as load resistances. A system comprises the filter and further comprises a single-ended input low-noise amplifier (LNA) that generates the input signal, wherein the LNA includes an output stage that includes a balun. A system comprises the filter and further comprises a differential input low-noise amplifier (LNA) that generates the input signal, wherein the LNA includes an output stage that includes biasing circuits. Each of the biasing circuits includes a biasing impedance, where a time constant of the filter is based on the biasing impedance and the second and third input impedances.

In other features, the biasing circuits include one of resistances, current sources having common-mode feedback, and inductances. The duty cycle is $(25 \pm n)\%$, where $n \leq 5$. The first and second clock signals overlap.

A method comprises communicating with an input node via first clocked switches of a filter, wherein the filter has a first input impedance. The method further comprises providing first clock signals having a first frequency to the first clocked switches. The method further comprises communicating with an output of the first clocked switches via a first frequency selective impedance (FSI) of the filter, wherein the first FSI has a second input impedance that is different than the first input impedance. The first and second input impedances are frequency-dependent impedances, and the first input impedance is based on the second input impedance and the first frequency.

In other features, the method further comprises connecting both the filter and a radio frequency (RF) downconverter module of a receiver to the input node. The method further comprises communicating with the input via first switches of the first clocked switches, generating the first clock signals, and switching the first switches using the first clock signals at a duty cycle. The first and second input impedances have first and second frequency responses, respectively, the first frequency response is based on the second frequency response, and the method further comprises translating the second frequency response to the first frequency and mirroring the second frequency response around the first frequency. The method further comprises receiving an input signal having first and second components via the input node, selecting the first frequency based on a frequency of the first components, and filtering the second components using the filter. The second components include at least one of intermodulation components and interference signals. The method further comprises configuring the first FSI to have one of a low-pass, a high-pass, and a notch frequency response. The first input impedance has a band-pass frequency response when the second input impedance has a low-pass frequency response.

In other features, the first input impedance has a notch frequency response when the second input impedance has a high-pass frequency response. The method further comprises selecting a first time constant of the first FSI and a quality factor (Q-factor) of the filter based on the first time constant and the first frequency. The Q-factor is at least 100. The method further comprises communicating with the input node via second clocked switches of the filter and communicating with an output of the second clocked switches via a second FSI of the filter, wherein the second FSI has a third input impedance that is different than the first input impedance. The third input impedance is a frequency-dependent impedance, and the first input impedance is based on the first frequency and at least one of the second and third input impedances. The method further comprises receiving an input signal having first and second components via the input node and filtering the second components having a first frequency that is an image of a second frequency of the first components using the filter. The method further comprises communicating with the input node via second switches of the second clocked switches, generating second clock signals having the first frequency, and clocking the second switches at the duty cycle using the second clock signals. The method further comprises offsetting a phase of the second clock signals relative to the first clock signals, and setting the duty cycle to 25%.

In other features, the third input impedance has a third frequency response, the first frequency response is based on at least one of the second and third frequency responses, and the method further comprises translating the at least one of the second and third frequency responses to the first frequency and mirroring the at least one of the second and third frequency responses around the first frequency. The method further comprises configuring the second FSI to have one of a low-pass, a high-pass, and a notch frequency response. The first input impedance has a band-pass frequency response when at least one of the second and third input impedances has a low-pass frequency response. The third input impedance has a notch frequency response when at least one of the second and third input impedances has a high-pass frequency response. The method further comprises selecting a second time constant of the second FSI and a quality factor (Q-factor) of the filter based on the second time constant and the first frequency. The Q-factor is at least 100. The method further comprises integrating the filter and the RF downconverter module in an integrated circuit (IC). The method further comprises integrating the filter and a radio frequency (RF) downconverter module of a receiver in an integrated circuit (IC) and connecting the filter and the RF downconverter module to the input node.

In other features, the method further comprises arranging a plurality of the filters and at least one of a transmitter and a radio frequency (RF) downconverter module of a receiver, wherein both the filters and the RF downconverter module communicate with the input node. The method further comprises selecting a time constant of the first FSI in one of the plurality of filters different than the time constant of the first FSI in another of the plurality of filters. The method further comprises setting the first frequency in one of the plurality of filters different than the first frequency in another of the plurality of filters. The method further comprises offsetting a phase of the first clock signals in one of the plurality of filters relative to another of the plurality of filters. The method further comprises coupling the first and second clocked switches to the input node via first and second coupling capacitances, respectively. The first input impedance has a notch frequency response at frequencies less than the first frequency. The method further comprises generating a bias voltage and biasing the first and second FSIs using the bias voltage. The method further comprises configuring the first and second FSIs to include a filter capacitance and first and second filter resistances, connecting the first and second filter resistances in series, connecting the filter capacitance in parallel to a series connection of the first and second filter resistances, and applying the bias voltage at an interconnection of the first and second filter resistances.

In other features, the method further comprises configuring the first and second FSIs to include a filter capacitance, communicating with the first coupling capacitance via first ends of the first and second clocked switches, and communicating with the second coupling capacitance via second ends of the first and second clocked switches.

In other features, the method further comprises connecting first and second filter resistances in series, connecting third and fourth filter resistances in series, applying the bias voltage at an interconnection of the first and second filter resistances and at an interconnection of the third and fourth filter resistances, communicating with the first and third filter resistances via the first ends of the first and second clocked switches, and communicating with the second and fourth filter resistances via the second ends of the first and second clocked switches.

In other features, the method further comprises connecting first and second filter resistances in series, applying the bias voltage at an interconnection of the first and second filter resistances, communicating with the first filter resistance via the first ends of the first and second clocked switches, and communicating with the second filter resistance via the second ends of the first and second clocked switches. The method further comprises connecting first and second coupling resistances in series, applying the bias voltage at an interconnection of the first and second coupling resistances, communicating with the first coupling resistance via the first ends of the first and second clocked switches, and communicating with the second coupling resistance via the second ends of the first and second clocked switches.

In other features, the method further comprises connecting first and second filter resistances in series, communicating with the input node and the first coupling capacitance via the first filter resistance, and communicating with the input node and the second coupling capacitance via the second filter resistance. The method further comprises generating the input signal using a differential input low-noise amplifier (LNA) and configuring an output stage of the LNA to include filter resistances of the first and second FSIs as load resistances.

In other features, the method further comprises generating the input signal using a single-ended input low-noise amplifier (LNA) and configuring an output stage of the LNA to include a balun. The method further comprises generating the input signal using a differential input low-noise amplifier (LNA) and configuring an output stage of the LNA to include biasing circuits. The method further comprises configuring each of the biasing circuits to include biasing impedance, wherein a time constant of the filter is based on the biasing impedance and the second and third input impedances. The method further comprises configuring the biasing circuits to include one of resistances, current sources having common-mode feedback, and inductances. The method further comprises setting the duty cycle to (25±n) %, where n≤5. The method further comprises overlapping the first and second clock signals.

A filter comprises an input node and first clocked switching means for communicating with the input node and receiving first clock signals having a first frequency, wherein the filter has a first input impedance. The filter further comprises first frequency selective impedance (FSI) means for communicating with an output of the first clocked switching means, wherein the first FSI means has a second input impedance that is different than the first input impedance. The first and second input impedances are frequency-dependent impedances, the first input impedance is based on the second input impedance and the first frequency.

In other features, both the filter and a radio frequency (RF) downconverter module of a receiver communicate with the input node. The first clocked switching means comprises first switching means for communicating with the input node, wherein the filter further comprises clock generator means for generating the first clock signals, and wherein the first switching means are switched by the first clock signals at a duty cycle. The first and second input impedances have first and second frequency responses, respectively, and the first frequency response is based on the second frequency response translated to the first frequency and mirrored around the first frequency. The input node receives an input signal having first and second components, the first frequency is based on a frequency of the first components of the input signal, and wherein the filter filters the second components. The second components include at least one of intermodulation components and interference signals. The first FSI means has one of a low-pass, a high-pass, and a notch frequency response.

In other features, the first input impedance has a band-pass frequency response when the second input impedance has a low-pass frequency response. The first input impedance has a notch frequency response when the second input impedance has a high-pass frequency response. The first FSI means has a first time constant, and a quality factor (Q-factor) of the filter is based on the first time constant and the first frequency. The Q-factor is at least 100. The filter further comprises second clocked switching means for communicating with the input node, wherein the second clocked switching means is clocked at the first frequency. The filter further comprises second FSI means for communicating with an output of the second clocked switching means, wherein the second FSI means has a third input impedance that is different than the first input impedance. The third input impedance is a frequency-dependent impedance, and wherein the first input impedance is based on the first frequency and at least one of the second and third input impedances.

In other features, the input node receives an input signal having first and second components, and the filter filters the second components having a first frequency that is an image of a second frequency of the first components. The second clocked switching means comprises second switching for communicating with the input node, and the clock generator means generates second clock signals at the first frequency that clock the second switching means at the duty cycle. The second clock signals have a phase that is offset relative to the first clock signals and wherein the duty cycle is 25%. The third input impedance has a third frequency response, and the first frequency response is based on at least one of the second and third frequency responses translated to the first frequency and mirrored around the first frequency.

In other features, the second FSI means has one of a low-pass, a high-pass, and a notch frequency response. The first input impedance has a band-pass frequency response when at least one of the second and third input impedances has a low-pass frequency response. The first input impedance has a notch frequency response when at least one of the second and third input impedances has a high-pass frequency response. The second FSI means has a second time constant, and a quality factor (Q-factor) of the filter is based on the second time constant and the first frequency. The Q-factor is at least 100.

In other features, an integrated circuit (IC) comprises the filter and further comprises the RF downconverter module. An integrated circuit (IC) comprises the filter and further comprises a radio frequency (RF) downconverter module of a receiver, wherein both the filter and the RF downconverter module communicate with the input node. A system comprises a plurality of the filters and further comprises at least one of a transmitter and a radio frequency (RF) downconverter module of a receiver, wherein both the filters and the RF downconverter module communicate with the input node. A time constant of the first FSI means in one of the plurality of filters is different than the time constant of the first FSI means in another of the plurality of filters. The first frequency in one of the plurality of filters is different than the first frequency in another of the plurality of filters. A phase of the first clock signals in one of the plurality of filters is offset relative to another of the plurality of filters. An integrated circuit (IC) comprises the system.

In other features, the first and second clocked switching means are coupled to the input node via first and second coupling capacitances, respectively. The first input impedance has a notch frequency response at frequencies less than the first frequency. The filter further comprises bias generator means for generating a bias voltage that biases the first and second FSI means. The first and second FSI means comprise a filter capacitance and first and second filter resistances, wherein the filter capacitance is connected in parallel to a series connection of the first and second filter resistances, and the bias voltage is applied at an interconnection of the first and second filter resistances. The first and second FSI means comprise a filter capacitance and the first and second clocked switching means have first and second ends. The first ends of the first and second clocked switching means communicate with the first coupling capacitance. The second ends of the first and second clocked switching means communicate with the second coupling capacitance.

In other features, the filter further comprises first and second filter resistances that are connected in series and third and fourth filter resistances that are connected in series. The bias voltage is applied at an interconnection of the first and second filter resistances and at an interconnection of the third and fourth filter resistances. The first ends of the first and second clocked switching means communicate with the first and third filter resistances. The second ends of the first and second clocked switching means communicate with the second and fourth filter resistances.

In other features, the filter further comprises first and second filter resistances that are connected in series. The bias voltage is applied at an interconnection of the first and second filter resistances. The first ends of the first and second clocked switching means communicate with the first filter resistance. The second ends of the first and second clocked switching means communicate with the second filter resistance. The filter further comprises first and second coupling resistances that are connected in series. The bias voltage is applied at an interconnection of the first and second coupling resistances. The first ends of the first and second clocked switching means communicate with the first coupling resistance. The second ends of the first and second clocked switching means communicate with the second coupling resistance.

In other features, the filter further comprises first and second filter resistances that are connected in series, wherein the first filter resistance communicates with the input node and the first coupling capacitance, and wherein the second filter resistance communicates with the input node and the second coupling capacitance. A system comprises the filter and further comprises differential input low-noise amplifier (LNA) means for generating the input signal, wherein the LNA means includes an output stage that includes filter resistances of the first and second filter circuits as load resistances. A system comprises the filter and further comprises single-ended input low-noise amplifier (LNA) means for generating the input signal, wherein the LNA means includes an output stage that includes a balun.

In other features, a system comprises the filter and further comprises differential input low-noise amplifier (LNA) means for generating the input signal, wherein the LNA means includes an output stage that includes biasing means for generating a direct current (DC) bias voltage. Each of the biasing means includes a biasing impedance, where a time constant of the filter is based on the biasing impedance and the second and third input impedances.

In other features, the biasing means include one of resistances, current sources having common-mode feedback, and inductances. The duty cycle is (25±n) %, where n≤5. The first and second clock signals overlap.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a functional block diagram of an exemplary radio frequency (RF) transceiver according to the prior art;

FIG. 2 is a graph of amplitude versus frequency of RF signals;

FIGS. 3A and 3B are functional block diagrams of exemplary RF transceivers according to the prior art;

FIGS. 7A and 7B are functional block diagrams of exemplary receivers utilizing an LNA and a frequency translatable impedance (FTI) filter that attenuates large unwanted signals according to the present disclosure;

FIGS. 7C and 7D depict exemplary frequency responses of the input impedance of the FTI filter of FIG. 7A according to the present disclosure;

FIGS. 8A and 8B show functional block diagrams of a FTI filter and multiple FTI filters connected in parallel, respectively, according to the present disclosure;

FIG. 9A is a functional block diagram of the FTI filter of FIG. 7A according to the present disclosure;

FIG. 9B is an exemplary schematic of the FTI filter of FIG. 9A according to the present disclosure;

FIG. 10A depicts an exemplary frequency response of the FSI of FIG. 9A according to the present disclosure;

FIG. 10B depicts an exemplary frequency response at the input of the FTI filter of FIG. 9A according to the present disclosure;

FIG. 10C depicts an exemplary frequency response of the FSI of FIG. 9D according to the present disclosure;

FIGS. 11A and 11B depict exemplary characteristics of the FTI filter of FIG. 9A according to the present disclosure;

FIG. 16C is a schematic of an AC-coupled FTI filter according to the present disclosure;

FIG. 16D is a schematic of a RLC circuit that is equivalent to the AC-coupled FTI filter of FIG. 16C according to the present disclosure;

FIG. 16E is a frequency response of the AC-coupled FTI filter of FIG. 16C according to the present disclosure;

FIG. 18C depicts exemplary clock signals used to clock switches of the FTI filters of FIG. 7B according to the present disclosure;

FIG. 19 is a flowchart of an exemplary method for attenuating large unwanted signals according to the present disclosure;

FIG. 20 is a flowchart of an exemplary method for attenuating large unwanted signals of different frequencies according to the present disclosure;

DETAILED DESCRIPTION

Figure 3C:
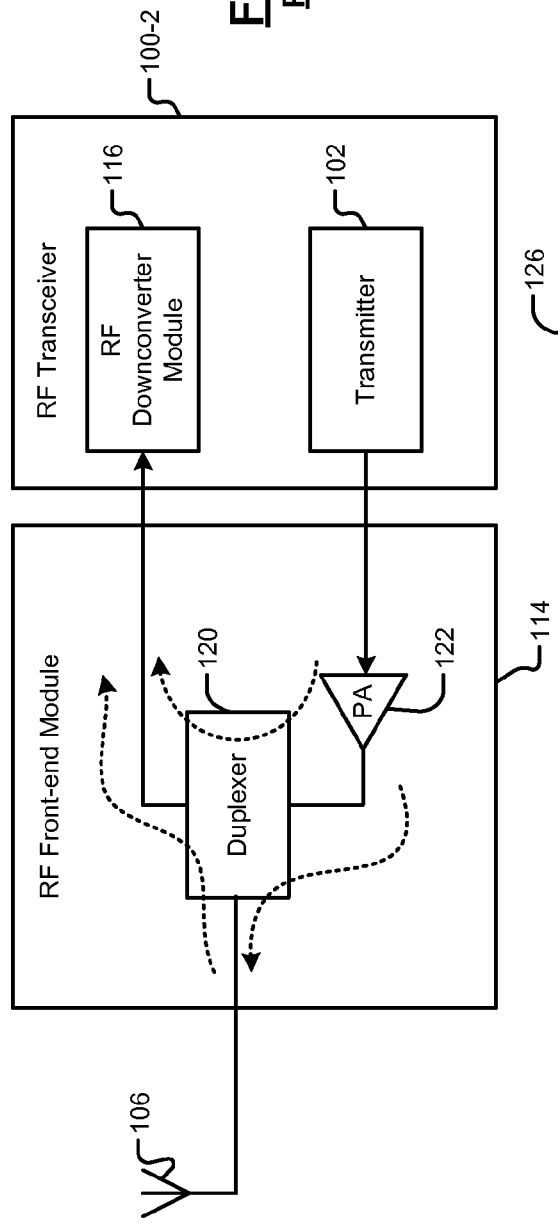
FIG. 3C is a functional block diagram of an exemplary RF transceiver utilizing a duplexer according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

Figure 4:
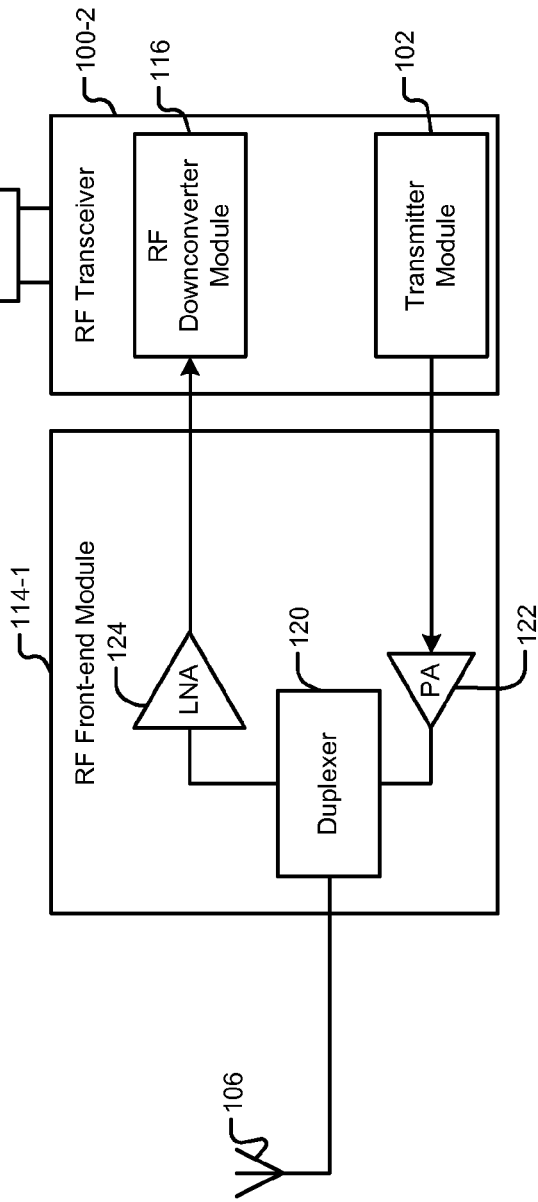
FIG. 4 is a functional block diagram of an exemplary RF transceiver utilizing a duplexer and a surface acoustic wave (SAW) filter according to the prior art.
Figure 5:
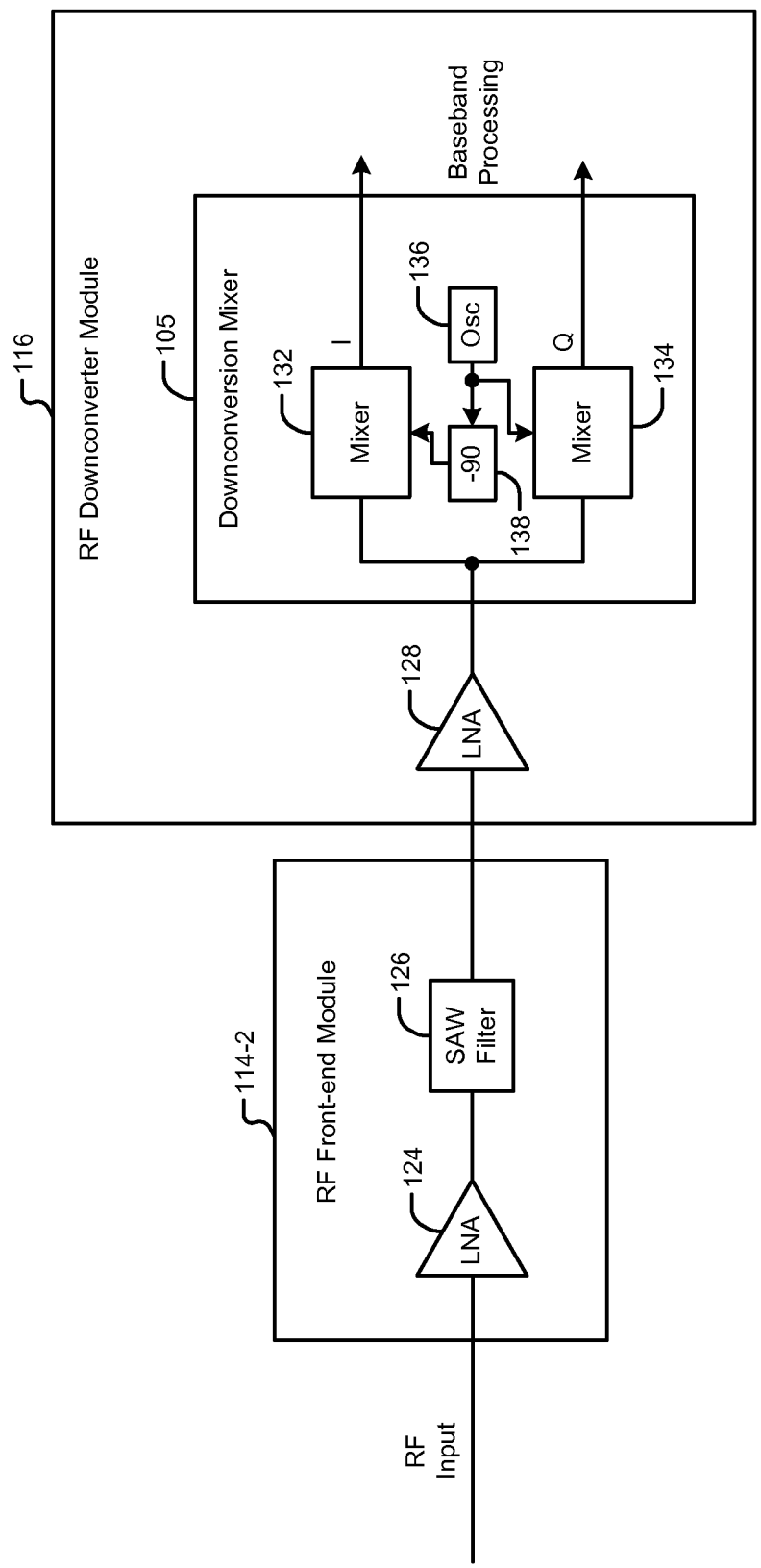
FIG. 5 is a functional block diagram of an exemplary RF receiver utilizing a low-noise amplifier (LNA) and a SAW filter according to the prior art.
Figures 6A, 6B:
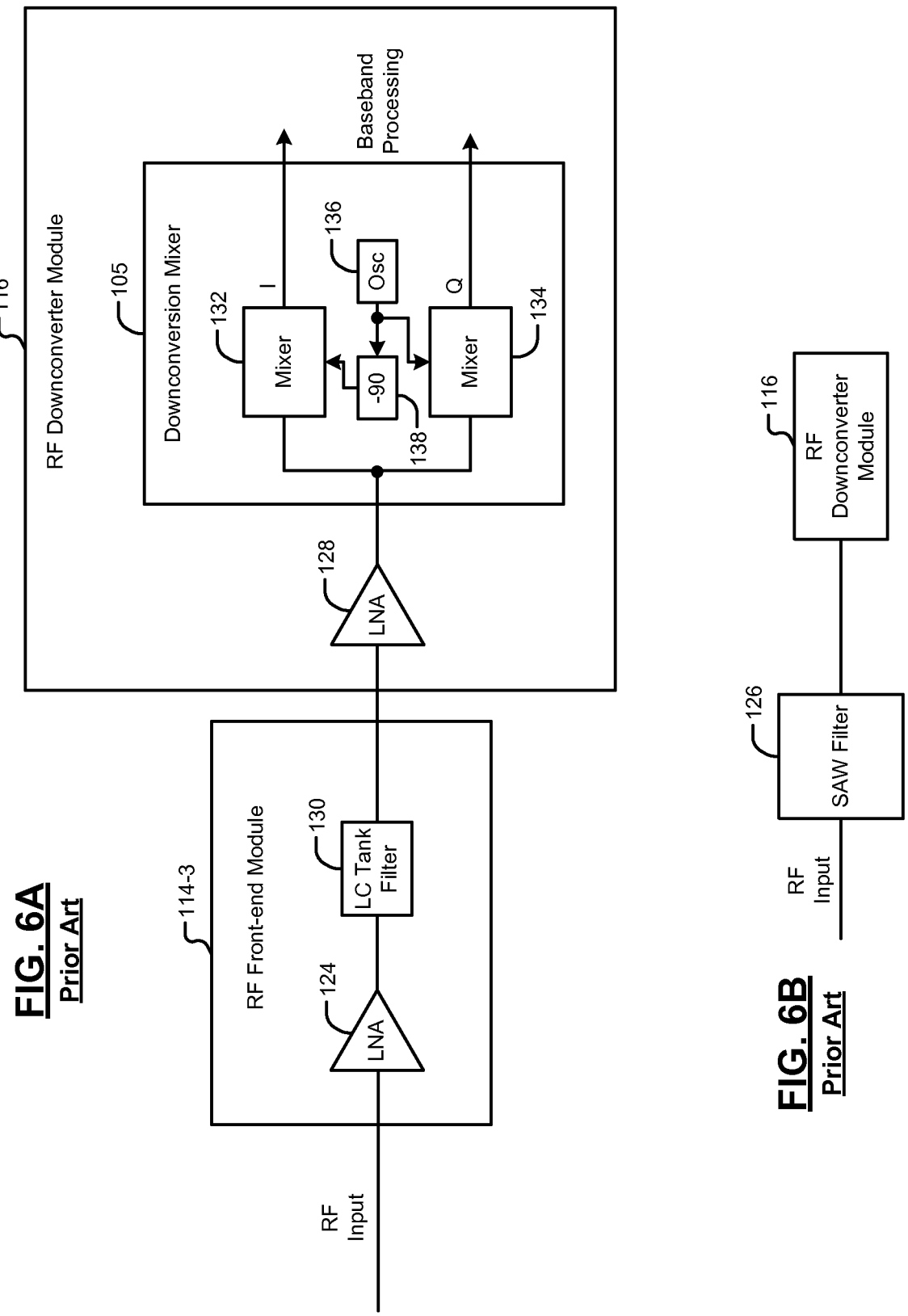
FIG. 6A is a functional block diagram of an exemplary RF receiver utilizing an LNA and a LC tank filter according to the prior art.
FIG. 6B is a functional block diagram of an exemplary RF receiver utilizing a SAW filter according to the prior art.

Filters including surface acoustic wave (SAW) filters and high-Q LC tank filters may be used in radio frequency (RF) receivers to attenuate blockers. These filters, however, have some disadvantages making it desirable to minimize their usage. For example, SAW filters cannot be implemented by or manufactured onto integrated circuits (ICs) using conventional IC manufacturing techniques. Furthermore, since SAW filters cannot be integrated onto ICs, SAW filters consume printed circuit board (PCB) space or package area. When SAW filters are used in some applications (e.g., FIG. 4), the devices that communicate with the SAW filters (e.g., transceivers) require additional pins to connect to the SAW filters. Accordingly, although SAW filters may provide beneficial filtering, the benefits come at added size and cost.

Additionally, to filter low-frequency blockers (e.g., blockers of 500 MHz or less), traditional LC tank filters may require components that are large in size compared to most active components that can be implemented by modern silicon technology. Consequently, LC tank filters that can attenuate low-frequency blockers may be impractical to implement in ICs and must be implemented off-chip. The LC tank filters that can be implemented on ICs are only able to achieve low Q-factors, and controlling center frequencies of on-chip LC tank filters requires additional tuning circuitry.

The present disclosure relates to filters called frequency translatable impedance (FTI) filters. FTI filters can have tunable center frequencies and Q-factors. Consequently, FTI filters can attenuate blockers of various frequencies. FTI filters can be implemented in ICs and can relax linearity requirements of the circuit blocks around it. In some applications, FTI filters may eliminate the need for SAW filters and other external high-Q LC tank filters that are traditionally used to attenuate blockers. Additionally, FTI filters may be used in conjunction with conventional RLC filter circuits and other conventional filters.

Specifically, FTI filters translate the impedance of frequency selective circuits centered on one frequency to another frequency determined by the frequency of clocks applied to the FTI filter. Multiple FTI filters can be used in parallel and may be clocked at different frequencies. A typical FTI filter may comprise clocked switches, a frequency selective impedance (FSI), and a clock generator. The FSI may have a low-pass, high-pass, notch, or a combination characteristic, and may be referred to as a low-pass FSI, high-pass FSI, notch FSI, or a combination FSI, respectively. The clock generator generates clock signals having a clock frequency that clock the clocked switches.

The clocked switches translate the response of the FSI in frequency. For example, when a low-pass FSI is used in an FTI filter, the low-pass FSI is frequency translated, resulting in a band-pass impedance. Additionally, the FTI filter is tunable in both frequency and bandwidth. For example, when the low-pass FSI is frequency translated to a bandpass impedance, the center frequency of the bandpass impedance will be at or near the clock frequency. The Q-factor (associated with the bandwidth and center frequency in the case of a bandpass characteristic) can be changed by modifying the low-pass FSI.

Hereinafter, FTI filters are discussed in more detail using FTI filters having bandpass characteristics for example only. It should be understood that FTI filters may have other characteristics such as notch, low-pass, and/or high-pass characteristics or combination thereof.

Figure 9D:
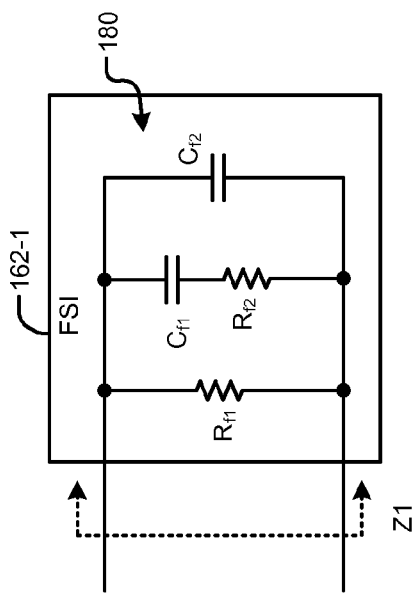
FIG. 9D illustrates a frequency selective impedance circuit including a second order passive filter.
Figure 9F:
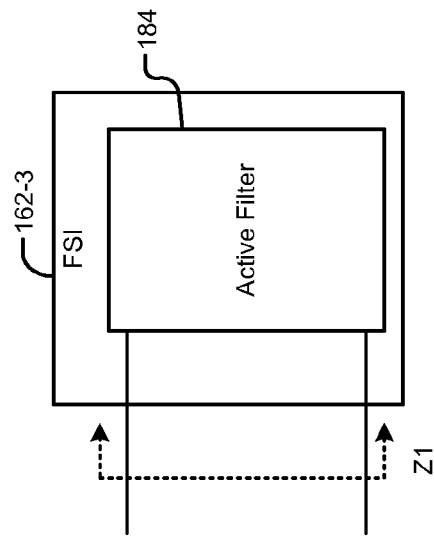
FIG. 9F illustrates a frequency selective impedance circuit including an $M^{th}$ order active filter.
Figure 9C:
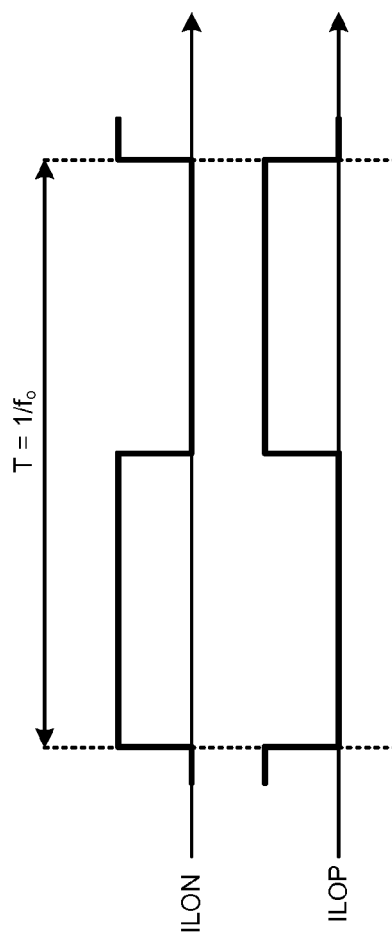
FIG. 9C depicts exemplary clock signals used to clock switches of the FTI filter of FIG. 9A according to the present disclosure.

Before a more detailed discussion is presented, a brief overview of the drawings is presented. FIGS. 7A-7D show an exemplary FTI filter and its frequency response. FIG. 7E shows an exemplary circuit using a FTI filter with an LCR filter circuit. FIGS. 8A and 8B an exemplary circuit using multiple FTI filters in parallel. FIGS. 9A-9C show exemplary schematics of FTI filters. FIGS. 10A-10B show an exemplary low-pass FSI translated by the clocked switches to a bandpass impedance of the FTI filter.

Figure 12A:
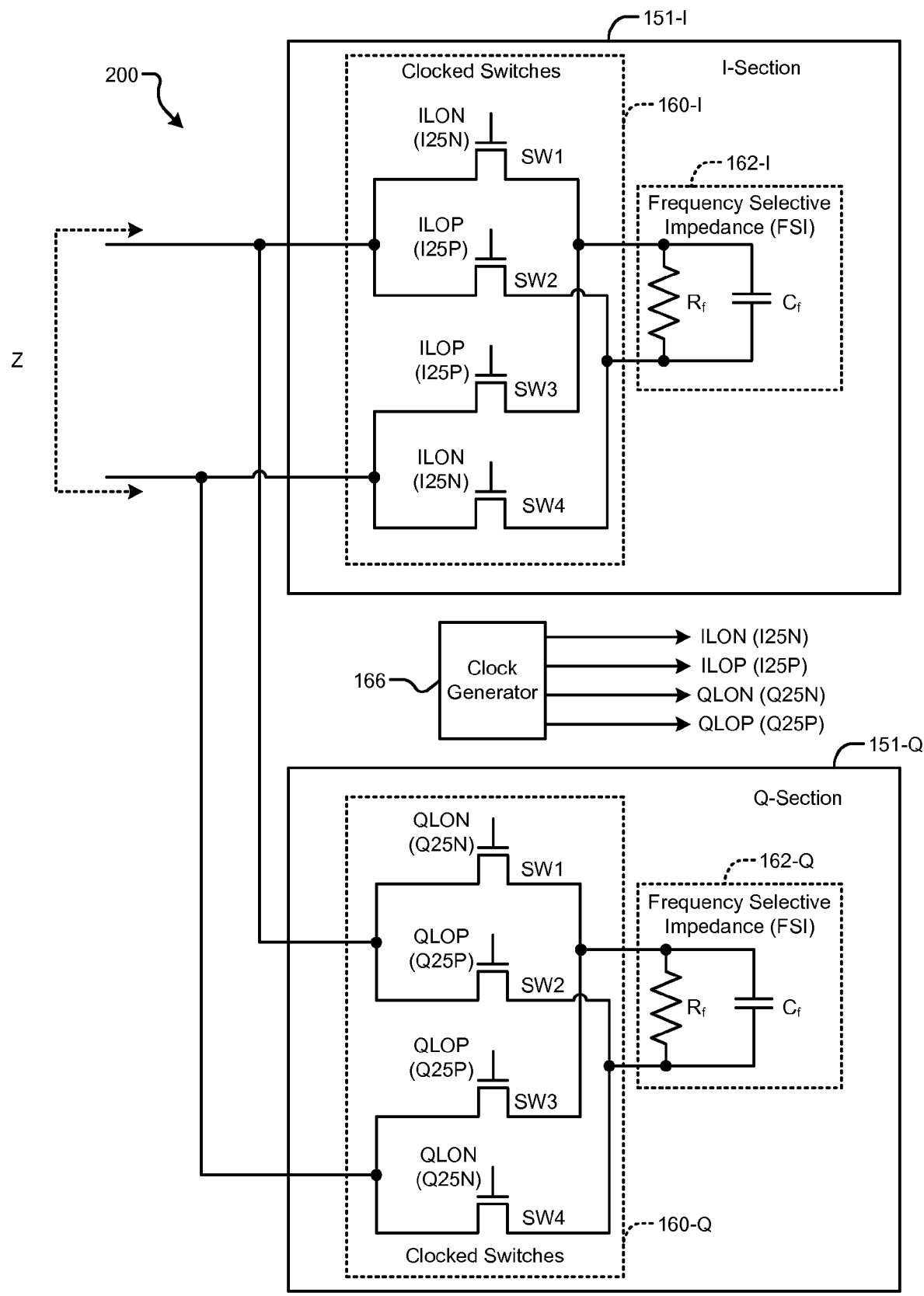
FIG. 12A is an exemplary schematic of an FTI filter using two sets of clocked switches and FSIs in a quadrature configuration.
Figure 13:
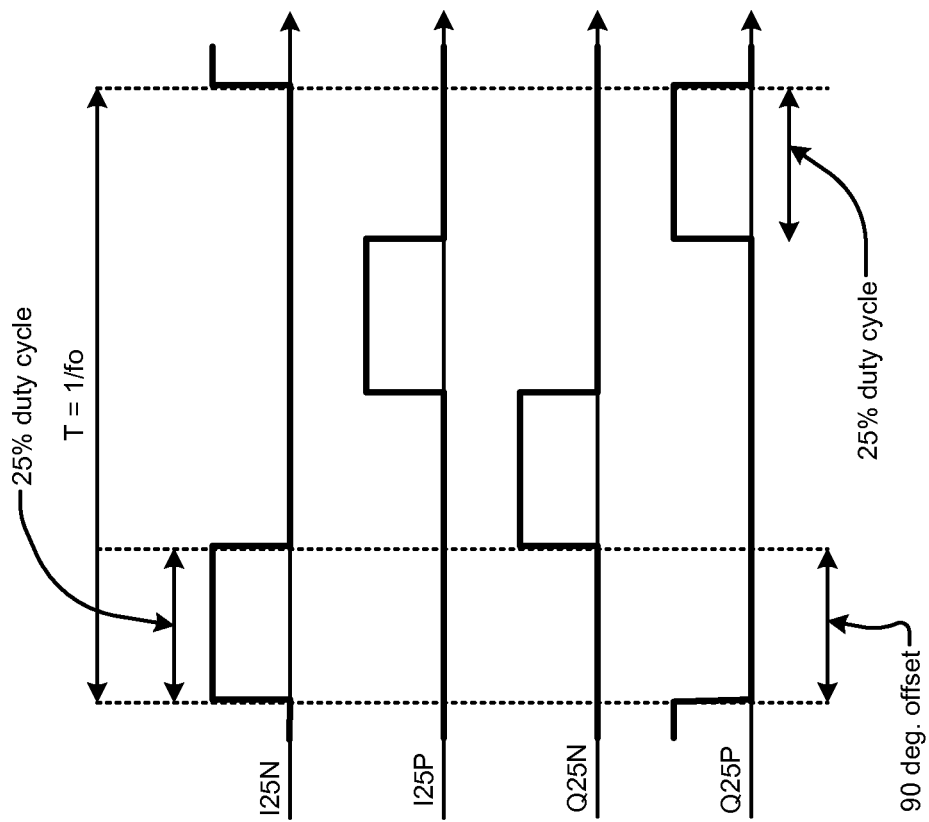
FIG. 13 depicts exemplary clock signals used to clock the switches of the FTI filter of FIG. 12A according to the present disclosure.
Figure 12B:
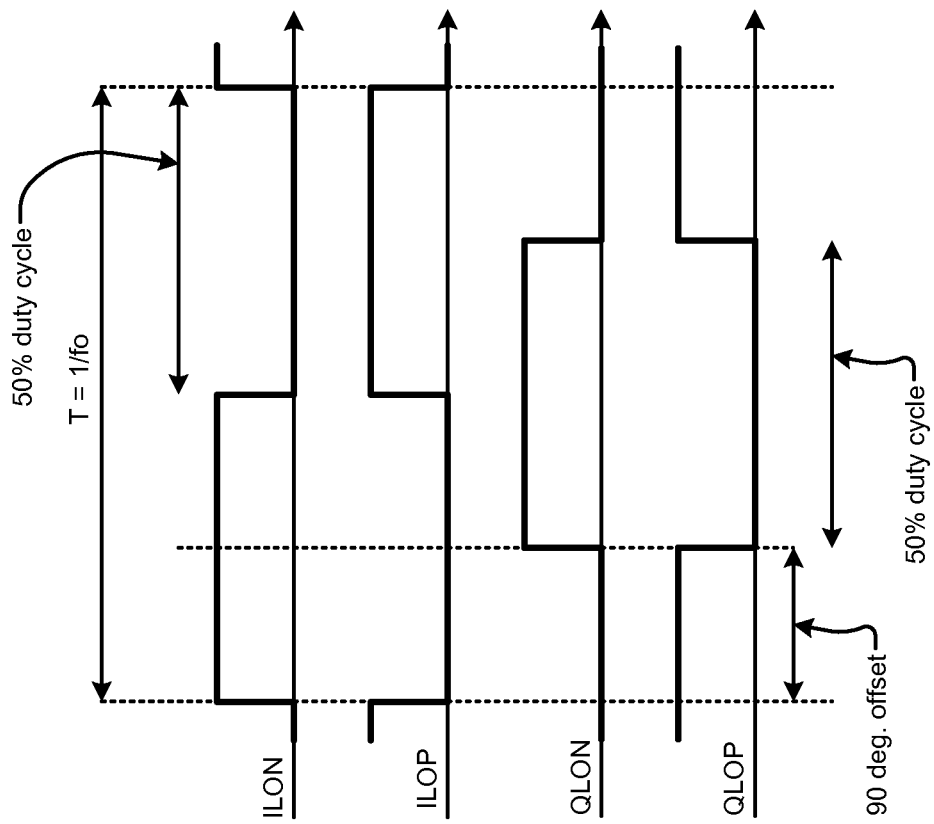
FIG. 12B depicts exemplary clock signals used to clock switches of the filter of FIG. 12A.

FIGS. 11A-11B show characteristics of the FTI filter including signal components at wanted and image frequencies. FIGS. 12A-12B and 13 show a FTI filter comprising two sets of clocked switches and FSIs arranged in a quadrature configuration.

Figure 14:
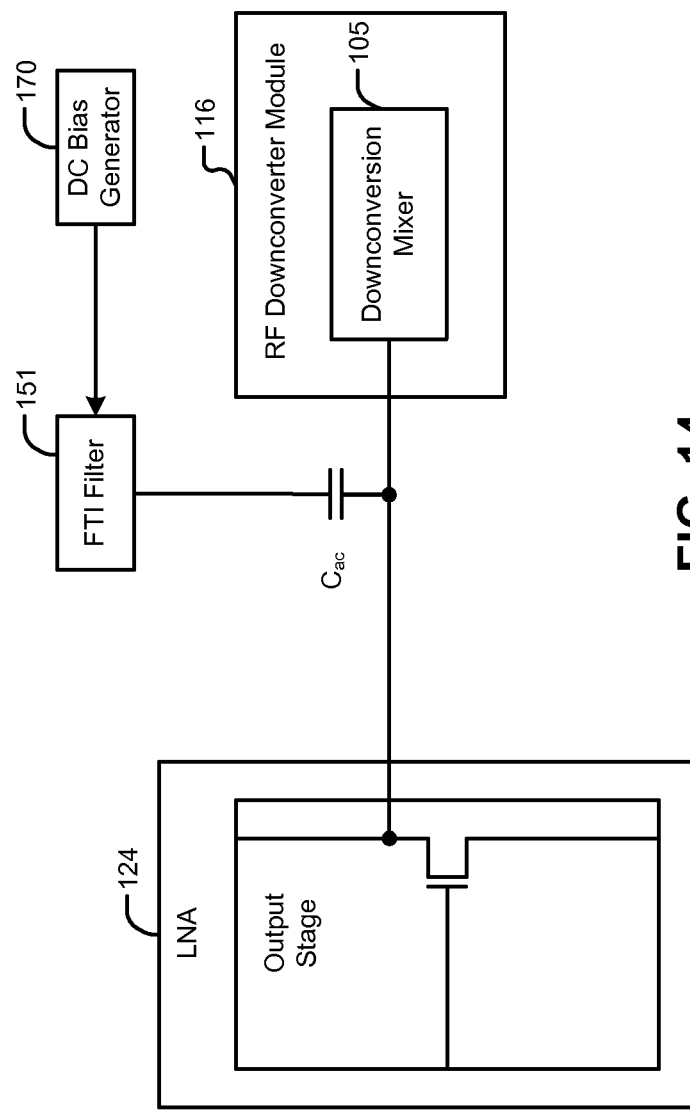
FIG. 14 is a functional block diagram of a FTI filter that is AC-coupled to a LNA according to the present disclosure.
Figure 15A:
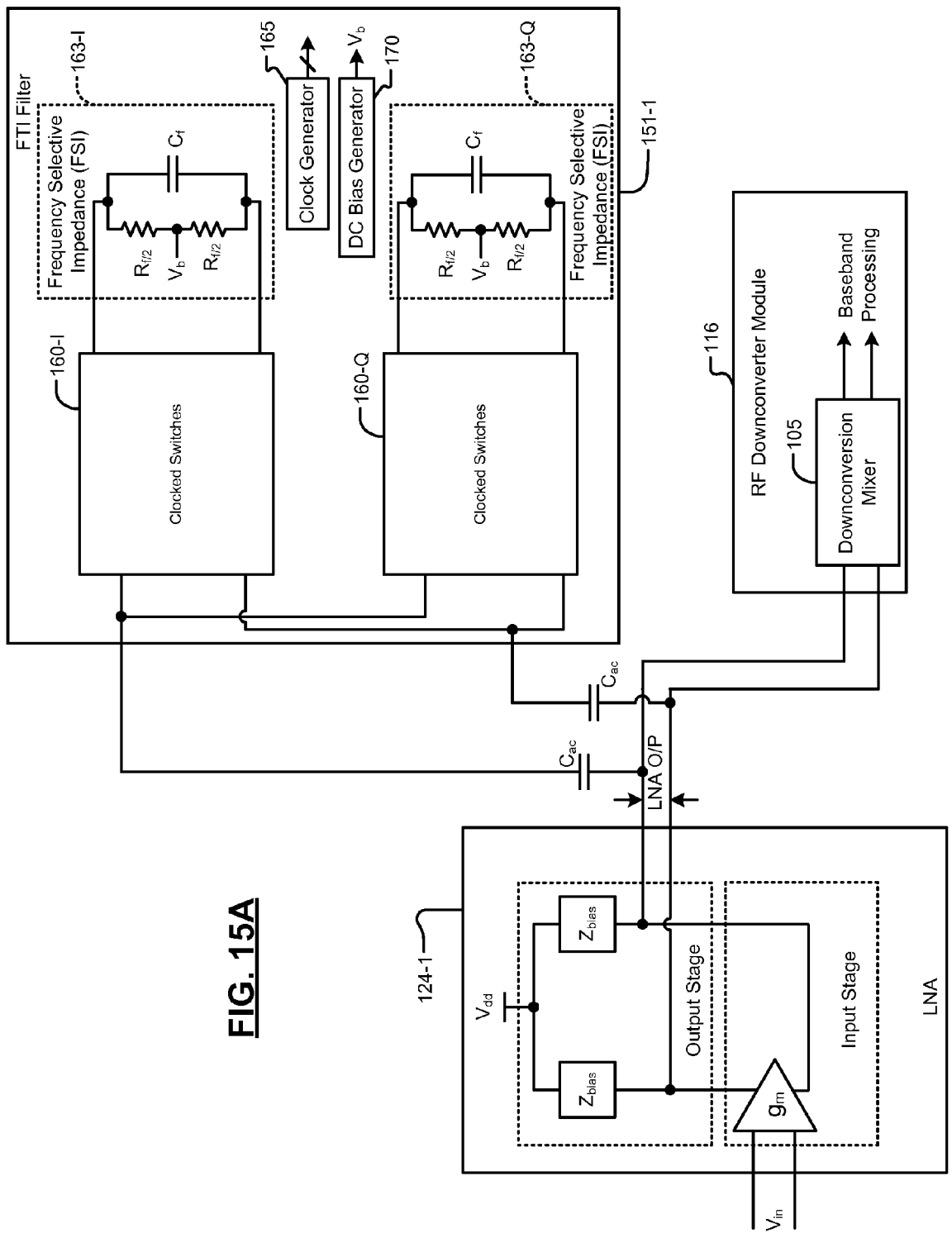
FIG. 15A is a functional block diagram of a FTI filter that is AC-coupled to an LNA having a differential input according to the present disclosure.
Figure 15B:
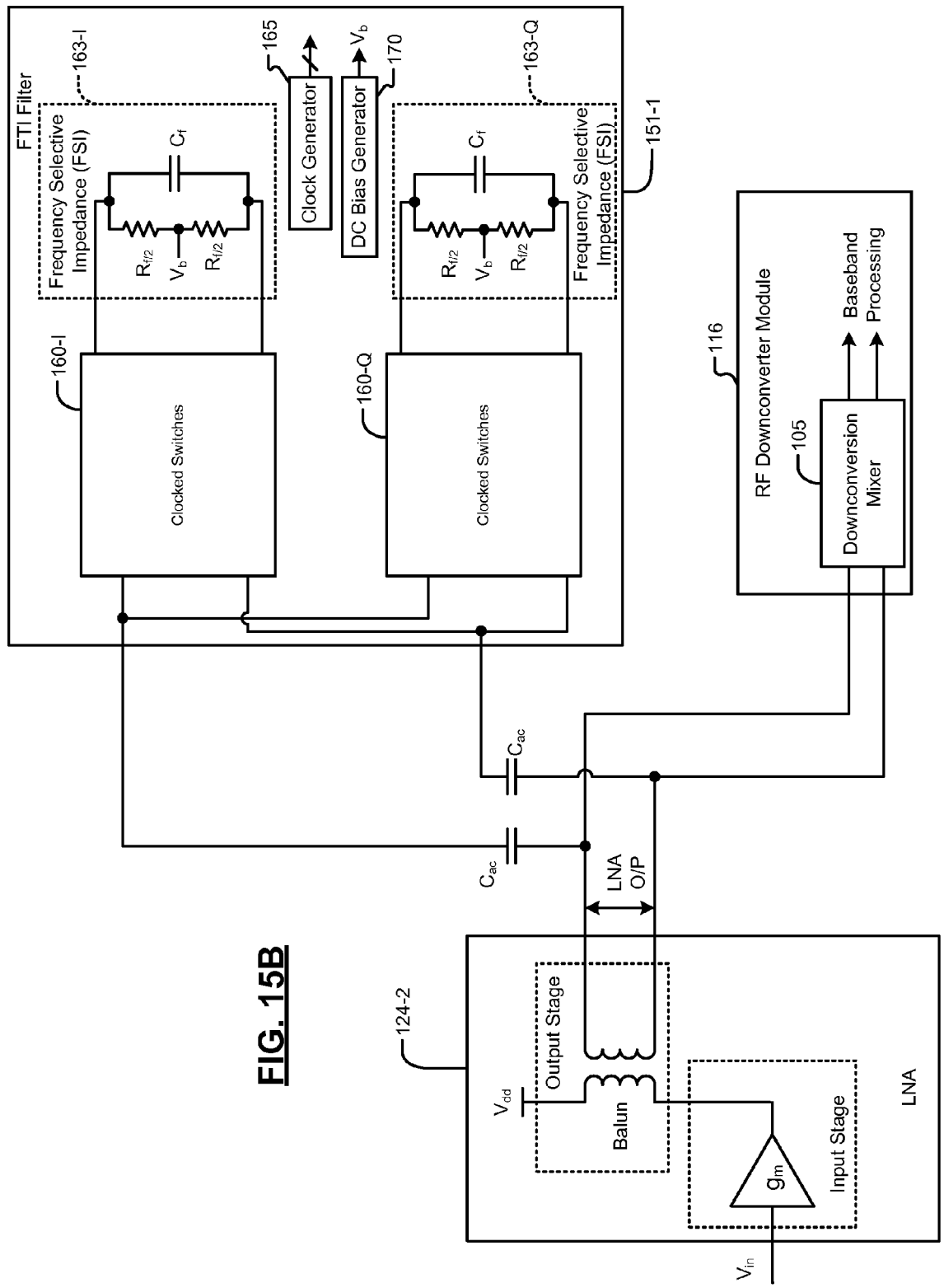
FIG. 15B is a functional block diagram of a FTI filter that is AC-coupled to an LNA having a single-ended input according to the present disclosure.

FIGS. 14, 15A and 15B show exemplary ways of connecting FTI filters to low-noise amplifiers (LNAs) using AC coupling. FIGS. 16A-16E show resonance characteristics of AC-coupled FTI filters. FIGS. 17A-17E show different exemplary configurations of FTI filters obtained by rearranging components of FSIs. FIGS. 18A-18C show multiple FTI filters used to attenuate blockers of different frequencies.

Figure 21:
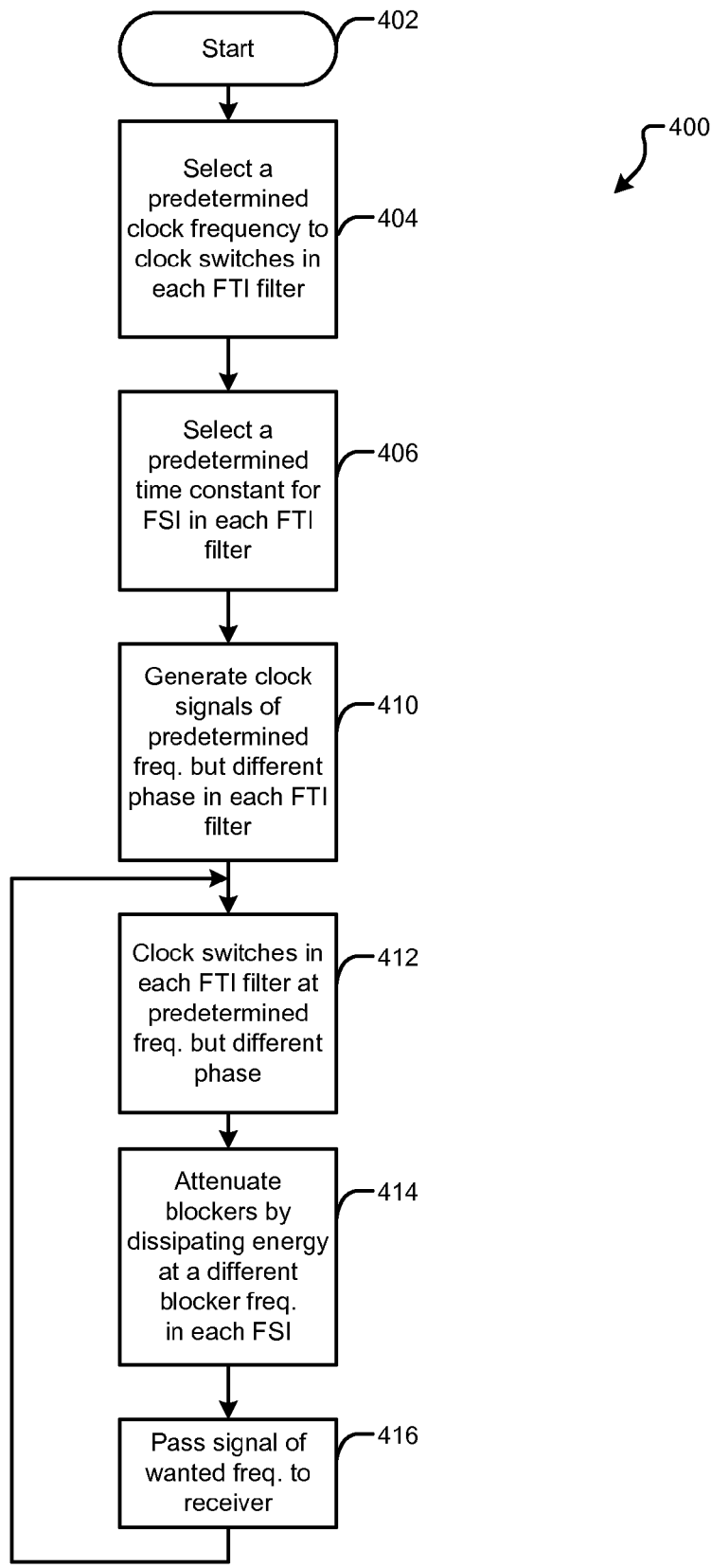
FIG. 21 is a flowchart of an exemplary method for attenuating large unwanted signals of different frequencies according to the present disclosure.

FIG. 19 shows a flowchart of a method for attenuating blockers by translating the frequency of blockers and by dissipating energy of the blockers at the translated frequency. FIG. 20 shows a flowchart of a method for attenuating blockers at multiple frequencies using multiple FTI filters, wherein clocked switches are clocked at different clock frequencies. FIG. 21 shows a flowchart of a method for attenuating blockers at multiple frequencies using multiple FTI filters, wherein clocked switches are clocked by clock signals having the same clock frequency but different phase. FIGS. 22A-23B show exemplary applications wherein receivers and transmitters may utilize the FTI filters to attenuate blockers.

Figure 7A:
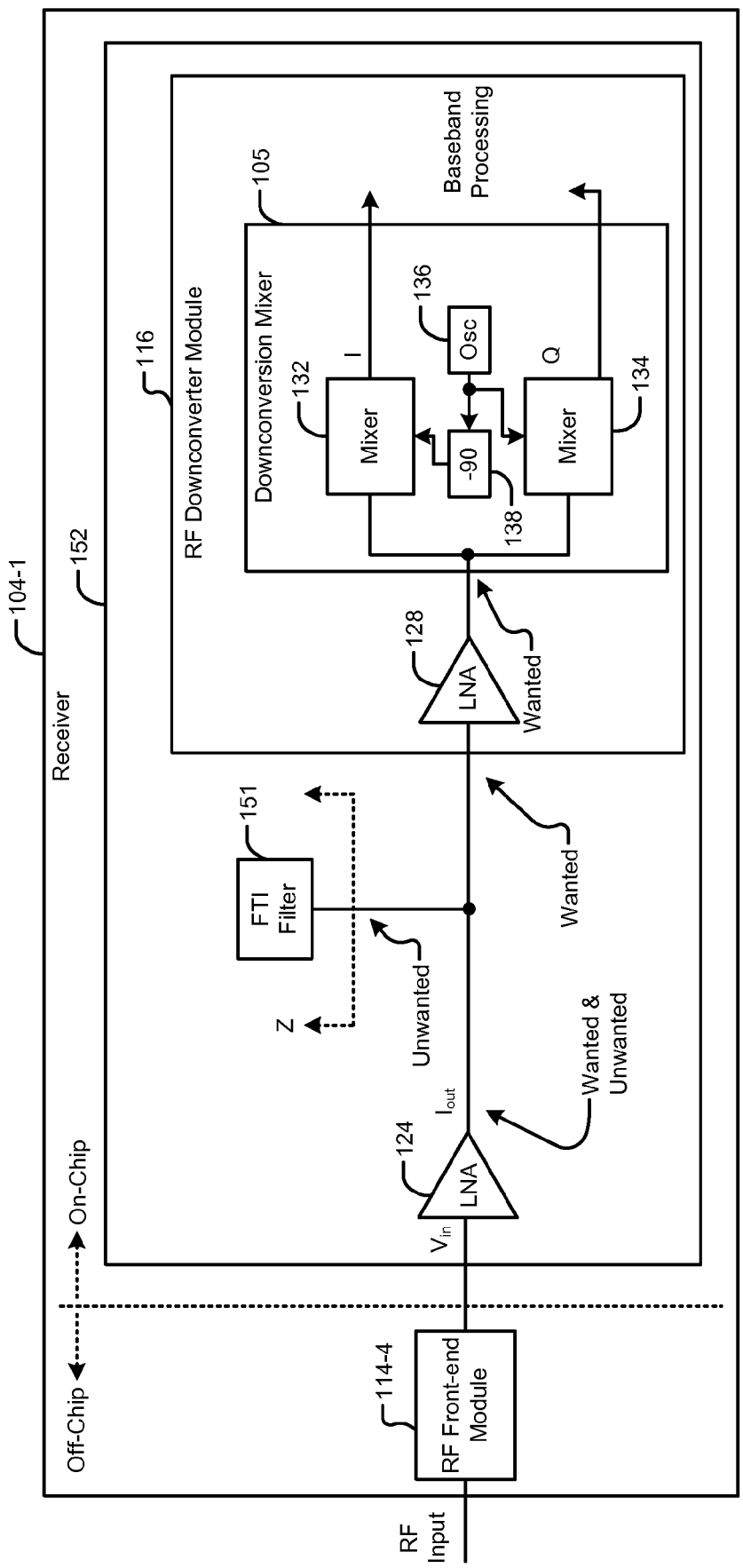
Figure 7E:
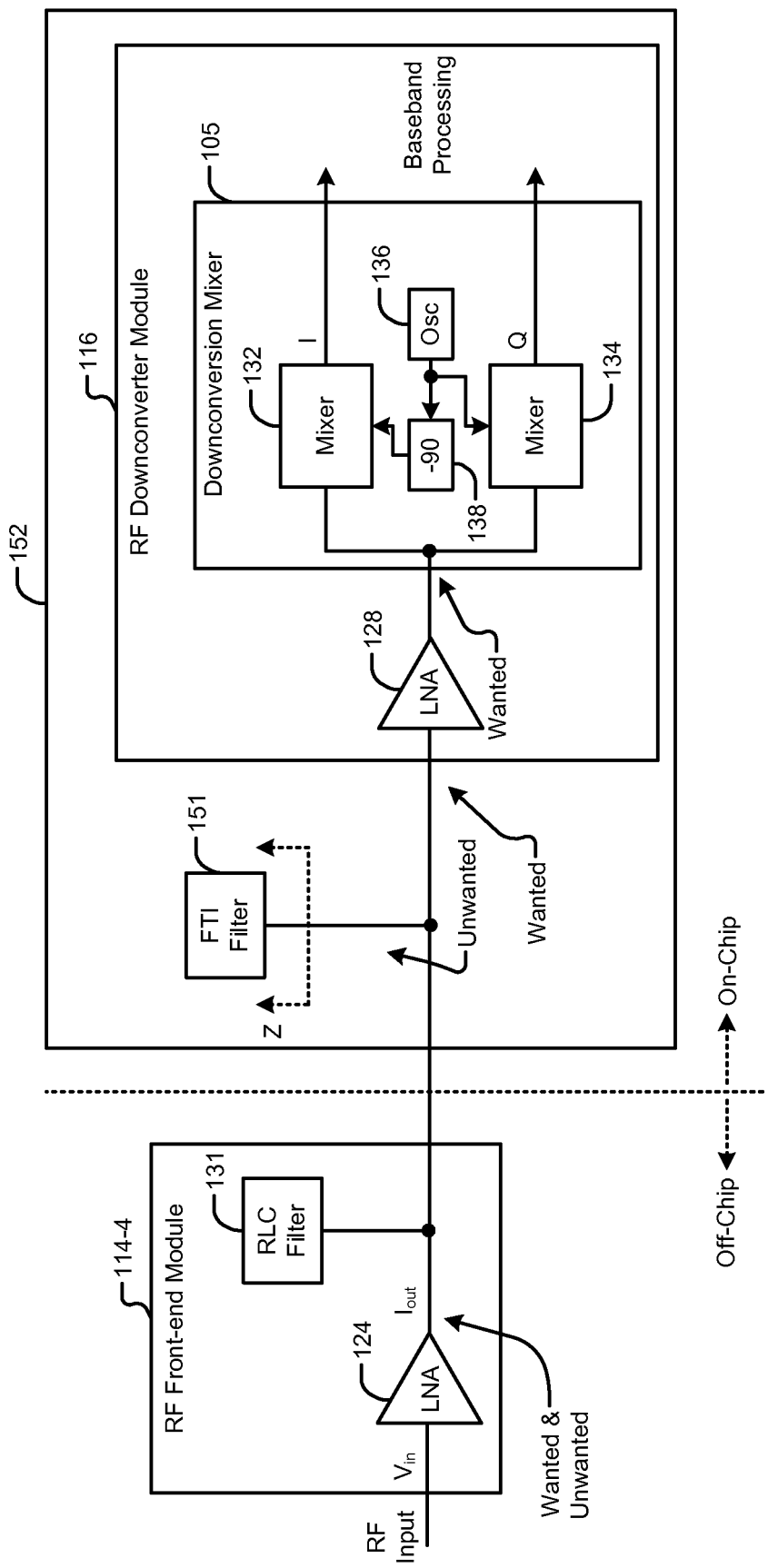
FIG. 7E shows a functional block diagram of an exemplary receiver using a FTI filter and a RLC filter circuit according to the present disclosure.

Referring now to FIGS. 7A-7D, an IC 152 comprising the RF downconverter 116 and a FTI filter 151 is shown. The LNA 124 can be integrated on the IC 152 with the FTI filter 151 as shown in FIG. 7A. Alternatively, Since the LNA 124 can be but does not have to be integrated with the FTI filter 151 on the IC 152, the LNA 124 can be implemented off-chip in the RF front-end module 114-1 (i.e., not in IC 152-a with the FTI filter 151) as shown in FIG. 7B. A receiver 104-2 may comprise the RF front end module 114-1 and the IC 152-a as shown in FIG. 7B. However, integrating the LNA 124 on-chip (i.e., in the IC 152) with the FTI filter 151 may be preferred.

In FIG. 7A, the IC 152 communicates with a RF front-end module 114-4 that receives RF input signals. In some implementations, the IC 152 may include the RF front-end module 114-4. A receiver (not shown) may comprise the IC-152 and the RF front-end module 114-4. A receiver 104-1 may comprise the RF front end module 114-1 and the IC 152 as shown in FIG. 7A.

The RF downconverter 116 may comprise the LNA 128 and the downconversion mixer 105. The downconversion mixer 105 may include the mixers 132 and 134. The mixers 132 and 134 and the FTI filter 151 may communicate with the LNA 128 as shown.

The LNA 124 may include a transconductance amplifier that converts an input voltage $V_{in}$ to an output current $I_{out}$. The FTI filter 151 may filter or attenuate blockers present in the output of the LNA 124. The output of the LNA 124 with blockers filtered or attenuated by the FTI filter 151 may be input to the mixers 132, 134. The mixers 132 and 134 may generate I and Q outputs, respectively. The I and Q outputs may be input to baseband processing modules (not shown) of the receiver for further processing.

Typically, most conventional filters are connected as in-line filters. That is, most conventional filters are connected in series to the RF downconverter module 116. In contrast, both the FTI filter 151 and the RF downconverter module 116 communicate with the input node. In other words, both the FTI filter 151 and the RF downconverter module 116 independently communicate with the input node and receive the input signals. The FTI filter 151 and the RF downconverter module 116 may be connected directly to the input node as well. When the FTI filter and the RF downconverter module 116 are connected to ground, the FTI filter 151 and the RF downconverter module 116 may be considered to be in parallel.

The FTI filter 151 may present a frequency dependent load to the LNA 124. Specifically, the FTI filter 151 may have an input impedance Z. The input impedance Z of the FTI filter 151 may vary based on the frequency of the output current $I_{out}$. For example, Z may be low at some frequencies and high at other frequencies.

In FIG. 7C, Z may be low at some frequencies. Effectively, the FTI filter 151 may dissipate energy of signals having frequencies at which Z is relatively low. Thus, the FTI filter 151 may filter out blockers when blockers have frequencies at which Z is relatively low. In other words, the FTI filter 151 may function as a notch filter at frequencies where Z is low and may filter blockers having frequencies at which Z is low.

On the other hand, in FIG. 7D, Z may be high at other frequencies. Consequently, the FTI filter 151 may pass signals that have frequencies at which Z is high to the RF downconverter module 116. Effectively, the FTI filter 151 may function as a band-pass filter at frequencies at which Z is high.

Thus, when wanted signals have frequencies at which Z is high, the FTI filter 151 may pass the wanted signals to the RF downconverter module 116.

Referring now to FIG. 7E, the FTI filter 151 and a conventional RLC filter circuit 131 are shown. An RF front-end module 114-4 may comprise the LNA 124 and the RLC filter circuit 131. The RLC filter circuit 131 may filter the output of the LNA 124. The RLC filter circuit 131 may comprise a resistance R, an inductance L, and/or a capacitance C that can be arranged in different configurations (e.g., RLC in series or RLC in parallel). The RLC filter circuit 131 may comprise additional components (e.g., diodes). The RLC filter circuit 131 may implement different types of filters (e.g., low-pass, high-pass, and band-pas filters) depending on the arrangement of R, L, C, and other components.

The FTI filter 151 may filter or attenuate blockers present in the output of the LNA 124. The output of the LNA 124 with blockers filtered or attenuated by the FTI filter 151 may be input to the mixers 132, 134. The mixers 132 and 134 may generate I and Q outputs, respectively. The I and Q outputs may be input to baseband processing modules (not shown) for further processing.

Referring now to FIGS. 8A and 8B, one or more FTI filters may be used to attenuate blockers at different frequencies. In FIG. 8A, an amplifier or a buffer 115 (e.g., a LNA) may receive the RF input signals. The FTI filter 151 is a shunt filter that attenuates blockers relative to the wanted channel. The FTI filter 151 may have a bandpass response and may be clocked at the wanted channel frequency. The RF downconverter module 116 may downconvert the wanted signal.

In FIG. 8B, a plurality of FTI filters 151 may be connected in parallel as shown. The FTI filters 151 may be clocked at different clock frequencies and may provide notches at respective clock frequencies thereby attenuating blockers at the notches. Additionally or alternatively, the FTI filters may be clocked with a multiphase clock (i.e., a clock having the same clock frequency but different phases). FTI filters implemented with a plurality of FTI filters connected in parallel and clocked with a multiphase clock can minimize the effects of charge injection and clock feedthrough from the clocked switches.

Blockers may be present in different frequency-bands. A single FTI filter 151 having tunable (i.e., programmable) Q-factor and center frequency can be programmed to filter blockers at different frequencies in different frequency-bands.

Referring now to FIGS. 9A-9C, an example of a component set of the FTI filter 151 with tunable Q-factor and center frequency is shown. In FIG. 9A, the FTI filter 151 may comprise clocked switches 160, a frequency selective impedance (FSI) 162, and a clock generator 164. The FSI 162 may have an input impedance Z1, and the FTI filter 151 may have an input impedance Z2.

In FIG. 9B, the clocked switches 160 may comprise four switches SW1, SW2, SW3, and SW4. The switches SW1-SW4 may be implemented with NMOS, PMOS, or transmission gates when implemented in conventional silicon complementary metal-oxide semiconductor (CMOS) technologies. The clock generator 164 may generate clock signals ILON and ILOP at a clock frequency $f_o$. The clock signals ILON and ILOP may clock the switches SW1-SW4 at a predetermined duty cycle. As an example, the FSI 162 is shown as a low-pass FSI comprising a RC circuit, wherein a resistance $R_f$ and a capacitance $C_f$ are connected in parallel.

As shown in FIG. 9C, the switches SW1-SW4 may be clocked at a 50% duty cycle. When the switches SW1-SW4 are clocked by clock signals ILON and ILOP at the clock frequency $f_o$ and 50% duty cycle, the clocked switches 160 may translate the impedance Z1 of the FSI 162 to the impedance Z2 of the FTI filter 151.

Figure 9E:
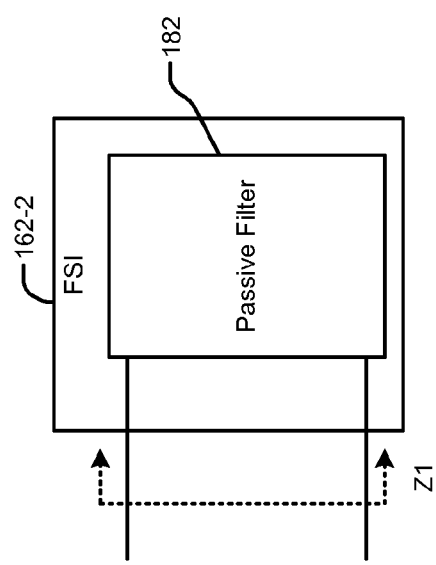
FIG. 9E illustrates a frequency selective impedance circuit including an $N^{th}$ order passive filter.

Any type of filter may be used for the FSI. Referring now to FIGS. 9D-9F, while the FSI 162 shown in FIG. 9A is a first order passive filter, first order passive filters, first order active filters, higher order passive filters and/or higher order active filters can be used in any of the implementations described herein. For example only in FIG. 9D, a frequency selective impedance circuit 162-1 includes an exemplary second order filter 180. The second order filter 180 may comprise a parallel-connected combination of a resistance $R_{f1}$, a series-connected capacitance $C_{f1}$ and resistance $R_{f2}$, and a capacitance $C_{f2}$.

Third order and higher order passive filters may be used. For example only, a frequency selective impedance circuit 162-2 in FIG. 9E includes an $N^{th}$ order passive filter 182, where N is an integer greater than zero. For example only in FIG. 9F, a frequency selective impedance circuit 162-3 includes an $M^{th}$ order active filter 184, where M is an integer greater than zero. The active filter 184 comprises one or more amplifiers such as an operational amplifier, a transistor, and/or an operation transconductance amplifier (OTA). The active filter 184 may also comprise one or more capacitances and resistances.

Referring now to FIGS. 10A-10B, exemplary frequency characteristics of impedances Z1 and Z2 are shown. As an example, in FIG. 10A, the impedance Z1 of the FSI 162 may have a low-pass characteristic. At low frequencies, Z1 may be approximately equal to R1 since capacitance $C_f$ may function as an open circuit at low frequencies. The impedance Z1 decreases as the frequency approaches and then exceeds a frequency called a –3 dB cutoff frequency ($f_{-3 dB}$), where $f_{3 dB}$ is defined by a time constant ($R_f*C_f$) of the FSI 162 where $R_f$ may be equal to $R_1$. In other words, the FSI 162 may dissipate energy at frequencies greater than $f_{-3 dB}$ when the impedance Z1 of the FSI 162 has a low-pass characteristic.

The FSI 162 may dissipate energy at different frequencies depending on the frequency characteristic of the impedance Z1. Impedance Z1 may have a low-pass, high-pass, notch, or a combination characteristic when the FSI 162 has a low-pass, high-pass, notch, or a combination characteristic, respectively.

In FIG. 10B, the clocked switches 160 may translate the low-pass characteristic of the impedance Z1 so that the impedance Z2 of the FTI filter 151 may have a band-pass characteristic centered at or near the clock frequency $f_o$. Specifically, the impedance Z2 may appear as impedance Z1 centered at or near the clock frequency $f_o$. Consequently, the FTI filter 151 may function as a band-pass filter when the FSI 162 has a low-pass characteristic. The wanted signal will see high impedance and pass through, while the blockers will see lower impedance and get attenuated. Accordingly, the FTI filter 151 may pass the signal of wanted frequency to the RF downconverter module 116 since the FSI 162 functions as a resistor in the wanted frequency-band in the vicinity of the clock frequency $f_o$.

The FTI filter 151 filters or attenuates blockers having frequencies outside the $f_{-3 dB}$ bandwidth (BW) since the FSI 162 dissipates energy at the frequencies outside the BW. In other words, the clocked switches 160 translate the frequency of the blockers to a frequency that the FSI 162 will filter. Alternatively, the clocked switches 160 translate the impedance of the FSI 162 to the clock frequency $f_o$ where the FSI 162 can filter the blockers having frequencies more than $f_{-3 dB}$ away from the frequency $f_o$.

When the FSI 162 has a low-pass impedance, the center frequency of the FTI filter 151 is determined by $f_o$, and the bandwidth of the FTI filter 151 is determined by the bandwidth of the FSI 162. The bandwidth of the FSI 162 may be determined by a time constant of the FSI 162. For example, when the FSI 162 includes an RC circuit comprising resistance $R_f$ and capacitance $C_f$ connected in parallel, the time constant of the FSI 162 is given by $\tau=(Rf*Cf)$. The –f–3 dB cutoff frequency of the FSI 162 is given by f–3 dB=$1/(2\pi*\tau)$.

The bandwidth BW of the FTI filter 151 is a function of the $f_{-3 dB}$ cutoff frequency of the FSI 162. For example, when the input impedance Z1 of the FSI 162 has a low-pass characteristic having a $-f_{-3 dB}$ cutoff frequency ($f_{-3 dB}$) and when the input impedance Z2 of the FTI filter 151 has a band-pass characteristic, the bandwidth BW of the FTI filter 151 is generally twice $f_{3 dB}$. Thus, the bandwidth BW of the FTI filter 151 may be determined based on the time constant of the FSI 162. This is a simplified analysis and excludes the effects of on-resistance of the clocked switches and finite rise and fall times of the clock signals.

The Q-factor of the FTI filter 151 in the case of a bandpass characteristic is defined as a ratio of the center frequency to the bandwidth of the FTI filter 151. That is, Q=$f_o$/BW. Thus, the Q-factor of the FTI filter 151 can be varied by setting the center frequency of the FTI filter 151 equal to the clock frequency $f_o$ and by varying the clock frequency $f_o$ and/or the time constant of the FSI 162. The clock frequency $f_0$ may be less than, equal to, or greater than the frequency of the wanted signal.

The impedance Z1 may be implemented by circuits comprising a combination of R, L, and C, active circuits, switched-capacitor circuits, and RF microwave filter circuits. Depending on the frequency of the blockers, the FSI 162 may be a low-pass, high-pass, notch, and/or a combination impedance, wherein the impedance Z1 may have a low-pass, high-pass, notch, and/or a combination frequency characteristic, respectively.

Impedance Z2 may have a band-pass characteristic when Z1 has a low-pass characteristic and may, over a desired frequency range, have a notch characteristic when Z1 has a high-pass characteristic. Depending on the frequency characteristics of the impedances Z1 and Z2, the FTI filter 151 may pass different wanted frequencies and may dissipate energy at frequencies of the blockers thereby attenuating the blockers.

FIG. 10C depicts an exemplary frequency response of the FSI of FIG. 9D according to the present disclosure. The second order filter of the FSI in FIG. 9D may exhibit slight peaking that can be used to compensate for roll in a passband edge. As can be appreciated, still other filter frequency response characteristics can be achieved using higher order active and/or passive filters.

Referring now to FIGS. 11A and 11B, characteristics of the FTI filter 151 of FIG. 9B are shown. In FIG. 11A, the clocked switches 160 that are clocked at the clock frequency $f_o$ may receive an input alternating current (AC) that is a tone at a frequency $f_a=f_o+f_{offset}$. In response, as shown in FIG. 11B, the FTI filter 151 of FIG. 9B may generate two signal components: A first signal component at the frequency $f_a$ and a second signal component at a frequency $f_b$, where $f_b=f_o-f_{offset}$. The second signal component $f_b$ is an image of the first signal component $f_a$.

When the FTI filter 151 has a bandpass response and the response is centered on the wanted signal, the wanted signal will mirror onto itself. This effect can be significantly minimized by using two sets of clocked switches and FSIs that are arranged in a quadrature configuration.

Referring now to FIGS. 12A and 12B, an FTI filter 200 that uses two sets of clocked switches and FSIs in a quadrature configuration is shown. In FIG. 12A, the FTI filter 200 comprises an in-phase section (I-section) 151-I and a quadrature-phase section (Q-section) 151-Q. The I-section 151-I may comprise first clocked switches 160-I and a first FSI 162-I. The Q-section 151-Q may comprise second clocked switches 160-Q and a second FSI 162-Q.

Additionally, the FTI filter 200 comprises a clock generator 166. The clock generator 166 may generate clock signals that clock the switches 160-I and 160-Q at the clock frequency $f_o$ in quadrature. Specifically, clock signals ILON and ILOP may clock the switches 160-I, and clock signals QLON and QLOP clock the switches 160-Q. When the duty cycle of the clock signals is 50% (as shown in FIG. 12B), a cancellation of input signal occurs.

Referring now to FIGS. 12A and 13, a FTI filter 151 comprises the I and Q sections, 151-I and 151-Q, respectively. A clock generator 165 may generate clock signals that clock the switches 160-I and 160-Q at the clock frequency $f_o$ in quadrature. Specifically, clock signals I25N and I25P may clock the clocked switches 160-I, and clock signals Q25N and Q25P may clock the clocked switches 160-Q. The duty cycle of the clock signals is 25% as shown in FIG. 13. Consequently, only one of the first and second FSIs 162-I, 162-Q is connected to the input at the same time. As a result, the clocked switches 160-I and 160-Q may generate only the signal component having the wanted frequency, and the signal component having the image frequency is eliminated.

Changes in the duty cycle may proportionately affect the performance of the FTI filter 151. The impedance of the FTI filter 151 may increase as the duty cycle decreases from 25% to 0%. Accordingly, the duty cycle may vary preferably within a narrow range around 25%. In other words, the clock signals I25N, I25P, Q25N, and Q25P may overlap or not overlap but preferably only by a small amount (e.g., by less than 5%).

The FTI filter 151 may be used as a high-Q band-pass filter with a center frequency centered at the clock frequency $f_o$ and bandwidth determined by the bandwidth of the first and second FSIs 162-I, 162-Q. Since the center frequency and the Q-factor of the FTI filter 151 may be varied by varying the clock frequency $f_o$ and/or the time constants of the first and second FSIs 162-I, 162-Q, the FTI filter 151 may be called a FTI filter having a tunable center frequency and tunable Q-factor.

The FTI filter 151 may be designed with Q-factors great than 100 by properly selecting the value $f_o$ and/or the values of the time constants of the first and second FSIs 162-I, 162-Q (i.e., values of $R_f$ and/or $C_f$). Specifically, the FTI filter 151 with a high Q-factor may be designed by using large values of $R_f$ and/or $C_f$ that can be easily implemented in ICs. Accordingly, the FTI filter 151 having a high O-factor may be easily implemented by ICs and may eliminate a need for traditional high-Q filters that cannot be implemented by ICs.

Referring back to FIG. 7A, different exemplary receiver configurations wherein the FTI filters 151 may be used as a high-Q filter are shown. In FIG. 7A, a receiver 104-1 comprising the RF front-end module 114-4, the FTI filter 151, and the RF downconverter module 116 is shown. The FTI filter 151 and the RF downconverter module 116 may be integrated in an IC 152 as shown. Preferably, the LNA 124 can be integrated on the IC 152 with the FTI filter 151 on the IC 152 instead of in the RF front-end module 114-4 as shown. The receiver 104-1 may be implemented by a single IC.

The LNA 124 may receive the RF input signal having blockers. The output of the LNA 124 may comprise the amplified input signal and amplified blockers. The FTI filter 151 may filter or attenuate blockers from the output of the LNA 124. The LNA 128 may amplify the output of the LNA 124 with blockers substantially attenuated by the FTI filter 151. The output of the LNA 128 may be input to the downconversion mixer 105. The LNA 128 may provide buffering between the FTI filter 151 and the downconversion mixer 105. Since the FTI filter 151 substantially attenuates blockers, the linearity ratings of the mixers 132, 134 and the LNA 128 may be relaxed.

The FTI filter 151 may be used in many other receiver configurations. For example, the FTI filter 151 may be used in television (TV) receivers (depending on TV standards, etc.). Additionally, the FTI filter 151 may be used in other applications where filters with high-Q factors can be beneficial.

Referring now to FIGS. 7A and 8B, a plurality of FTI filters 151-1, 151-2, . . . , and 151-N (collectively FTI filters 151) may be arranged in parallel to attenuate blockers at different frequencies. A combination of different impedance circuits such as notch, band-pass, etc. may be used together.

The FTI filters 151 may be arranged between the RF front-end module 114-4 or the LNA 124 and the RF downconverter module 116. The FTI filters 151, preferably the LNA 124, and the RF downconverter module 116 may be integrated in the IC 152 as shown.

Each FTI filters may comprise FSIs that implement different impedances (e.g., a low-pass FSI or a high-pass FSI). Accordingly, a FTI filter may have a frequency response of a notch filter or a band-pass filter depending on the FSIs used therein. Each FTI filter may comprise a clock generator that generates clock signals of a different clock frequency. The clock frequencies may be fixed, programmable, or adaptively controlled. Each FTI Filter may attenuate blockers at a different frequency.

The linearity of FTI filters may be increased by decreasing the on-resistance $R_{on}$ of the switches SW1-SW4. For example, when the FSI of the FTI filter comprises $R_f$ and $C_f$ connected in parallel, the on-resistance $R_{on}$ of the switches SW1-SW4 may appear in series with the resistance $R_f$. The linearity of the FTI filter can be increased if the voltage drop across the switches is kept small; i.e., $R_{on}$ of the switches is kept small.

$R_{on}$ may be decreased in many ways. For example, complementary transistors such as CMOS transistors may be used to implement the switches SW1-SW4, or the voltage swing of the clock signals that clock the switches SW1-SW4 may be increased with the use of AC-coupling or other methods.

Alternatively, FTI filters may be AC-coupled to the LNA 124, and a DC bias may be provided to the clocked switches in the FTI filters. AC coupling and DC biasing may allow the clocked switches to be at or near OV DC and may allow large overdrive on switches SW1-SW4.

Referring now to FIGS. 14, 15A and 15B, the FTI filter 151 may be AC-coupled to the LNA 124 using capacitance $C_{ac}$. The LNA 124 may be single-ended or differential. Accordingly, AC coupling may be implemented in single-ended and differential configurations. A single-ended implementation is shown in FIG. 14, wherein only an output transistor of the LNA 124 is shown for simplicity. A DC bias generator 170 may provide a DC bias voltage to the FSI 162 in the FTI filter 151. The DC bias voltage may be a low voltage (e.g., $V_{ss}$) or a high voltage (e.g., $V_{dd}$) when the switches SW1-SW4 are implemented by N-type MOS (NMOS) or P-type MOS (PMOS) transistors, respectively.

In FIG. 15A, a differential implementation is shown. Alternatively, the input stage of the LNA 124-1 may receive a single-ended input (not shown), wherein one of the inputs of the LNA 124-1 may be connected to ground or $V_b$. The LNA 124-1 may be implemented using one of many different structures that may have single-ended or differential inputs. The output stage of the LNA 124-1 may include biasing circuits having an impedance $Z_{bias}$, where the impedance of $Z_{bias}$ may be greater than, lower than, or equal to $R_f$. For example, the biasing circuits may comprise load resistances or current sources. In the case where current sources are utilized, common-mode feedback may be used. Alternatively, impedances $Z_{bias}$ may include inductive loads. The output stage of the LNA 124-1 may provide a differential output as shown.

In FIG. 15B, the input stage of an LNA 124-2 may receive a single-ended input. The output stage of the LNA 124-2 may include a balun. The output stage may convert a single-ended output of the LNA 124-2 to a differential output. In the example shown, a combination of the FTI filter 151 having a band-pass impedance and the LNA 124-2 having the balun effectively achieves a band-pass balun.

In FIGS. 15A and 15B, the input stages of the LNAs 124-1, 124-2 may provide impedance matching with an external filter (e.g., a SAW filter) and/or an antenna that precede the LNAs 124-1 and 124-2. Additional external components may be used for impedance matching. The differential outputs of the LNAs 124-1 and 124-2 are AC-coupled to the clocked switches 160-I and 160-Q of a FTI filter 151-I via two capacitances $C_{ac}$. Additionally, the differential outputs are input to the downconversion mixer 105 of the RF downconverter module 116 as shown.

The FTI filter 151-I may comprise the clocked switches 160-I and 160-Q, FSIs 163-I and 163-Q, the clock generator 165, and the DC bias generator 170. The FSIs 163-1 and 163-Q may include two resistances $R_{f2}$ connected in series to each other and in parallel to the capacitance $C_f$ as shown. The DC bias generator 170 may generate a DC bias voltage $V_b$ suitable for the switches SW1-SW4. For example, the DC bias generator 170 may generate $V_b$=when when SW1-SW4 are NMOS transistors. The bias voltage $V_b$ may be applied to an interconnecting point of the resistances $R_{f2}$ of the FSIs 163-I and 163-Q as shown.

Figure 15C:
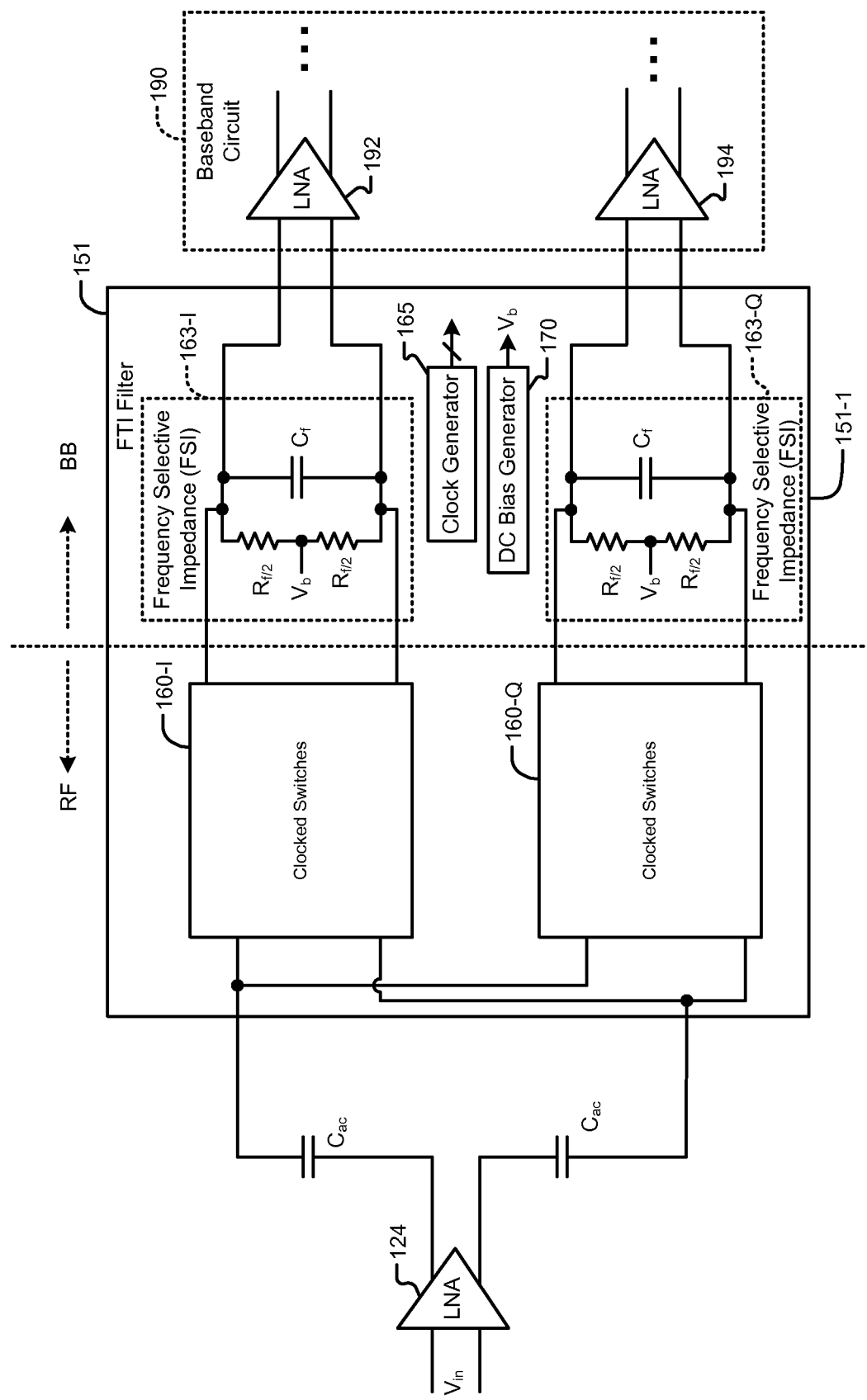
FIG. 15C is a functional block diagram of a FTI filter that is AC-coupled to an LNA and that outputs baseband signals directly to baseband LNAs.
Figure 16B:
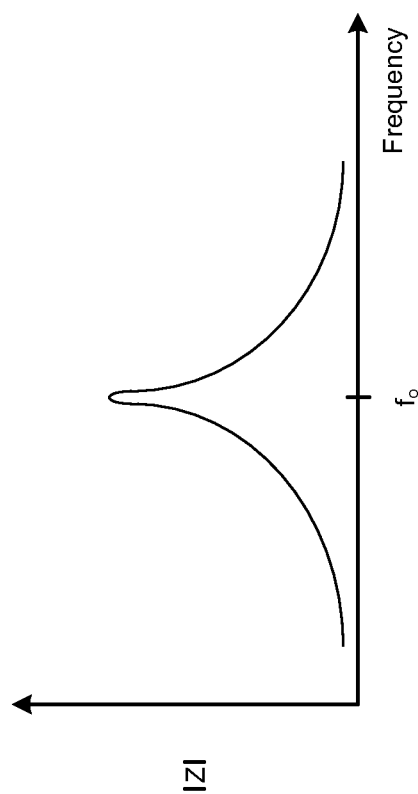
FIG. 16B is a frequency response of the FTI filter of FIG. 12A according to the present disclosure.
Figure 16A:
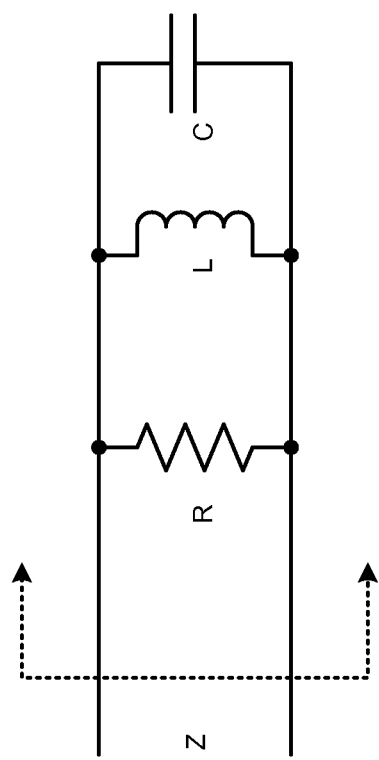
FIG. 16A is a schematic of a RLC circuit that is equivalent to the FTI filter of FIG. 12A according to the present disclosure.

Referring now to FIG. 15C, an FTI filter 151 is AC-coupled to an LNA 124. Baseband signals are output by the FTI filter 151 and are input to a baseband circuit 190 including I and Q LNAs 192 and 194. This arrangement eliminates a RF downconverting module as shown in other implementations described herein. In other words, the FTI filter 151 performs downconversion.

Referring now to FIGS. 12A and 16A-16E, additional exemplary characteristics of the FTI filter 200 and AC coupling are shown. In FIG. 12A, the FTI filter 200 without AC-coupling is shown. As an example, the FTI filter 200 is shown to implement a band-pass impedance Z. The FTI filter 200 may be equivalent to a parallel RLC resonant circuit shown in FIG. 16A and may have a frequency response shown in FIG. 16B.

In FIG. 16C, the FTI filter 151 with AC coupling capacitances $C_{ac}$ is shown. In FIG. 16D, a RLC circuit that is equivalent to the FTI filter 151 of FIG. 16C is shown. The AC coupling capacitances $C_{ac}$ introduce a series resonance that precedes a parallel resonance of the RLC circuit. The series resonance creates a notch frequency response for the FTI filter 151 as shown in FIG. 16E. Modification of the FTI filter component values and characteristics may move the notch into different frequency locations.

When the FTI filter 151 is AC-coupled, the FTI filter 151 may filter or substantially attenuate blockers having frequencies less than the peak of the frequency response as shown in FIG. 16E. Accordingly, the AC-coupled FTI filter 151 may be used in applications such as wideband code division multiple access (WCDMA) systems. In WCDMA systems, for example, the AC-coupled FTI filter 151 may filter or attenuate blockers that are generated by transmit signals since the blockers may have frequencies less than the desired receive frequency band.

Figure 17A:
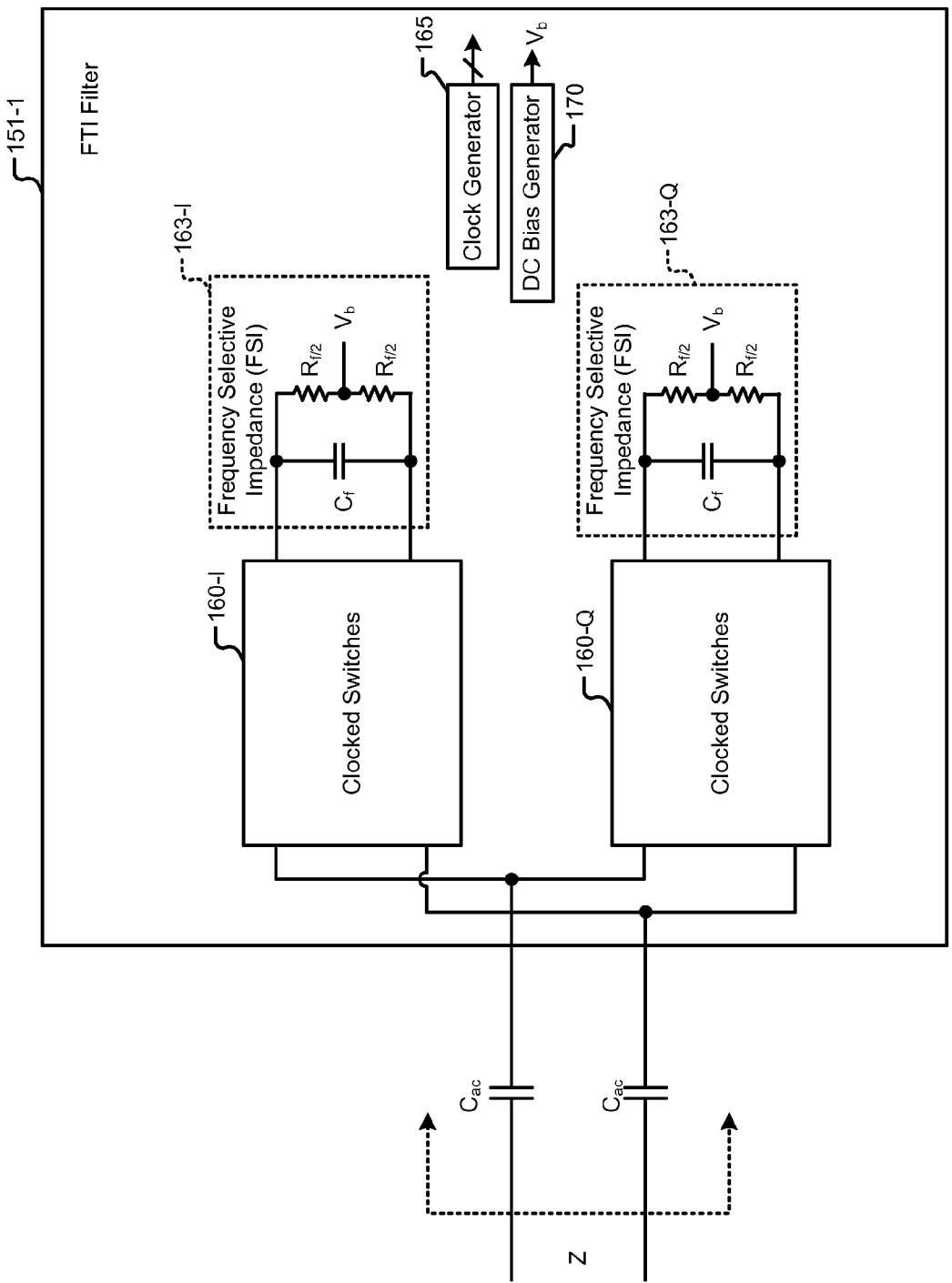
FIGS. 17A-17E are schematics of different configurations of AC-coupled FTI filters according to the present disclosure.
Figure 17B:
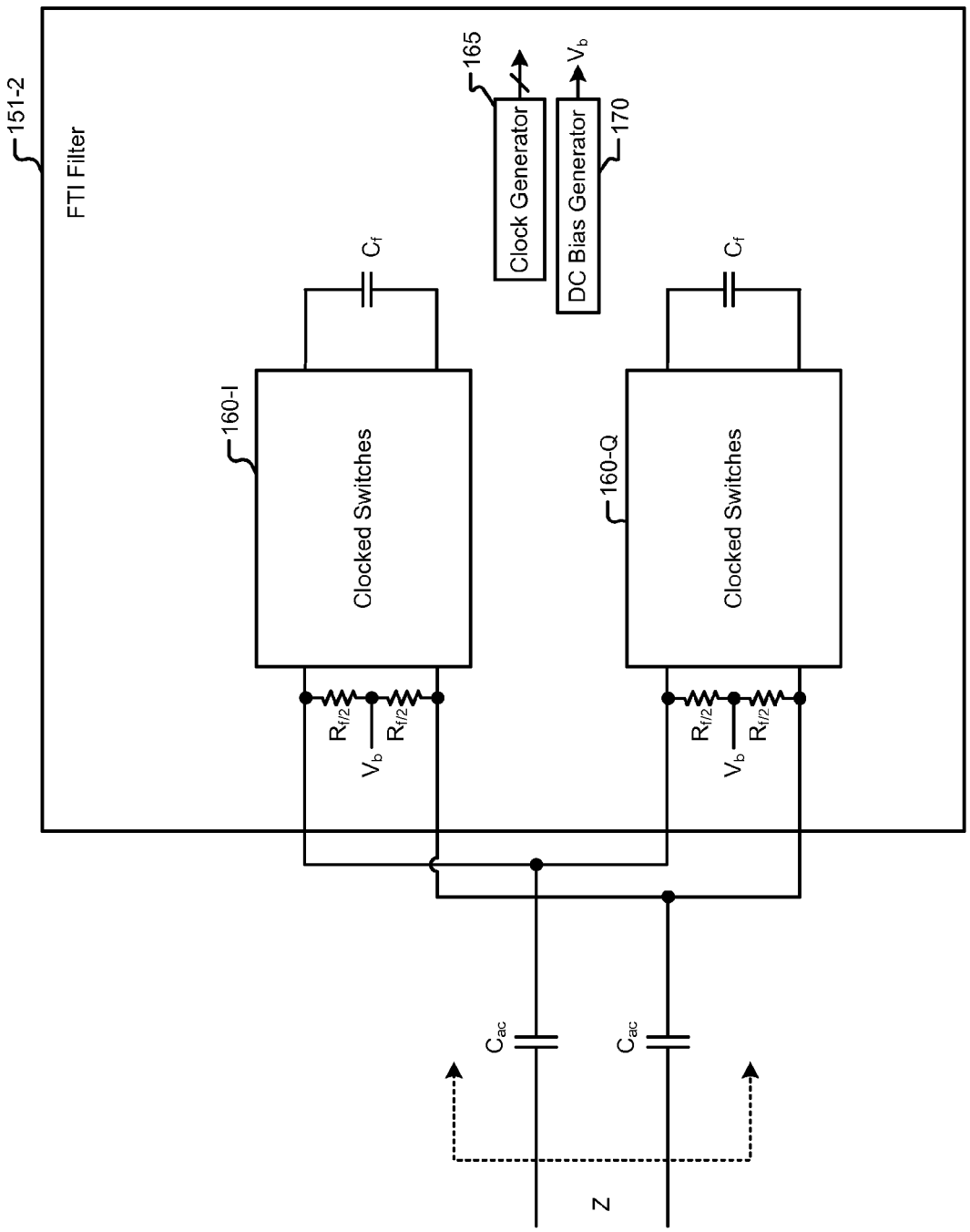
Figure 17C:
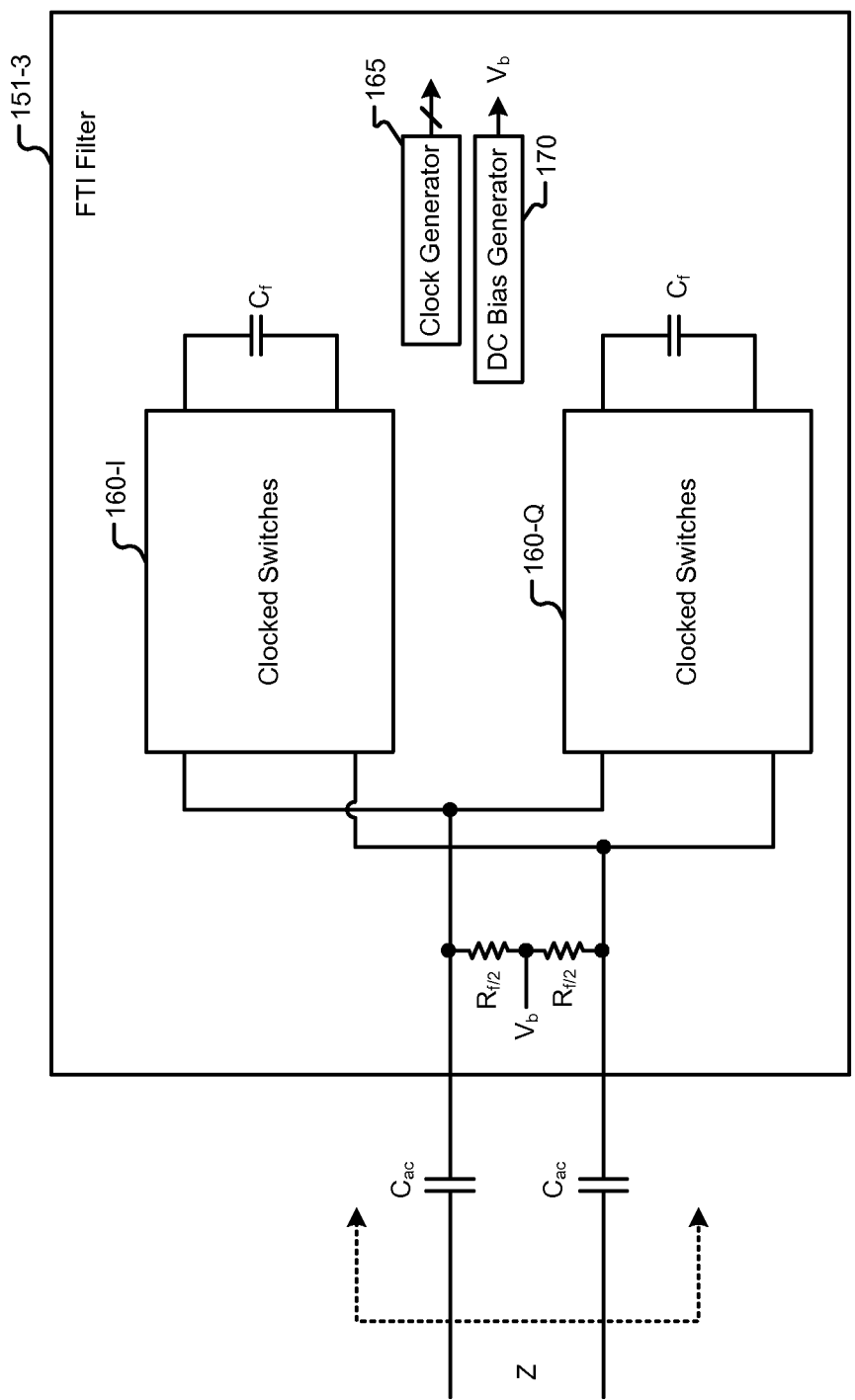
Figure 17D:
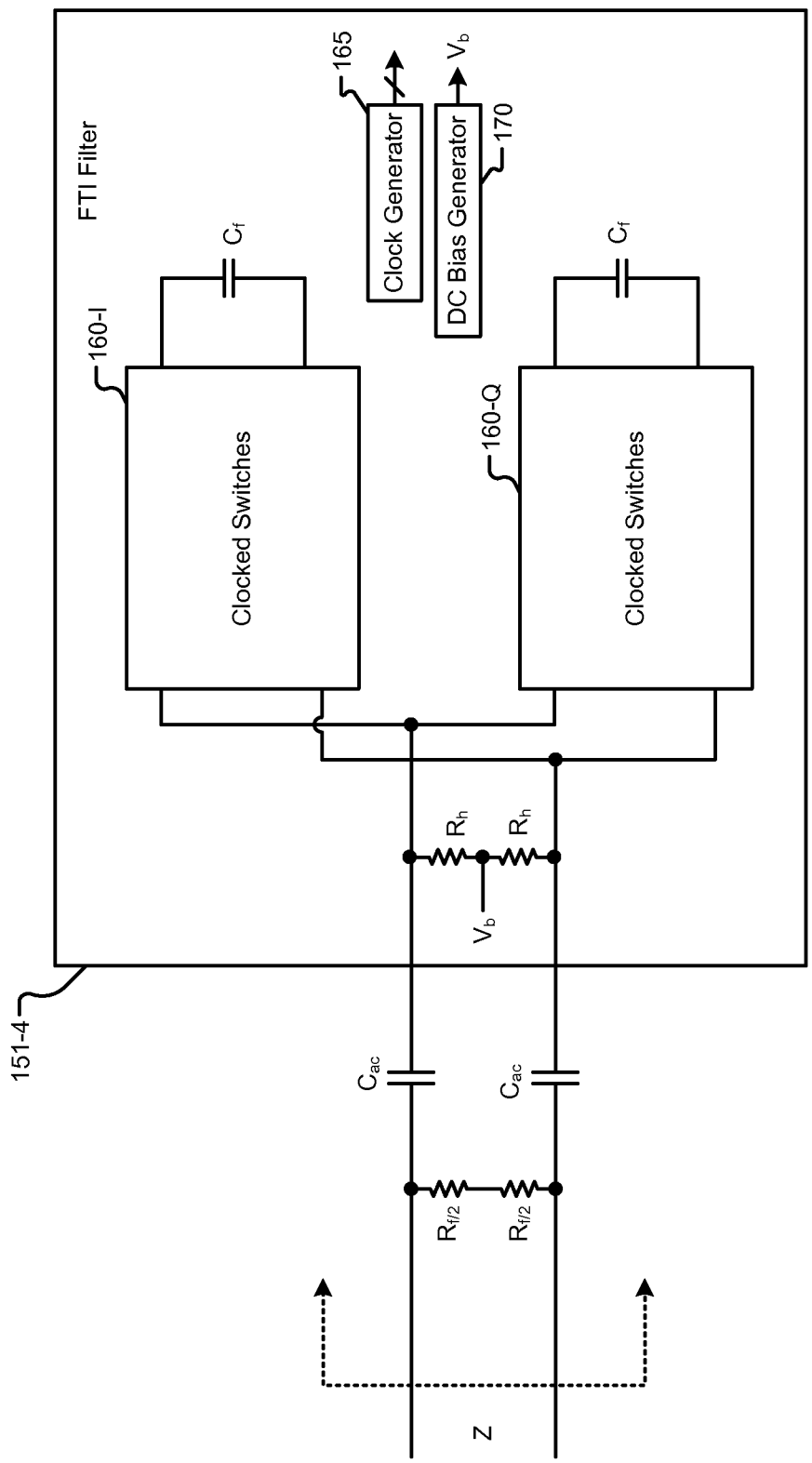

Referring now to FIGS. 17A-17E, AC-coupled FTI filters may be configured differently by rearranging resistances $R_{f2}$ of the FSIs 162-I and 162-Q as shown. In FIG. 17A, the FTI filter 151-1 may implement a band-pass impedance Z. In FIGS. 17B and 17C, the FTI filters 151-2 and 151-3 may include resistances $R_{f2}$ arranged as shown, respectively. In FIG. 17D, a FTI filter 151-4 may include biasing resistances $R_h$ having high resistance values relative to $R_f$. Resistances $R_h$ may provide a path for supplying the DC bias $V_b$.

Figure 17E:
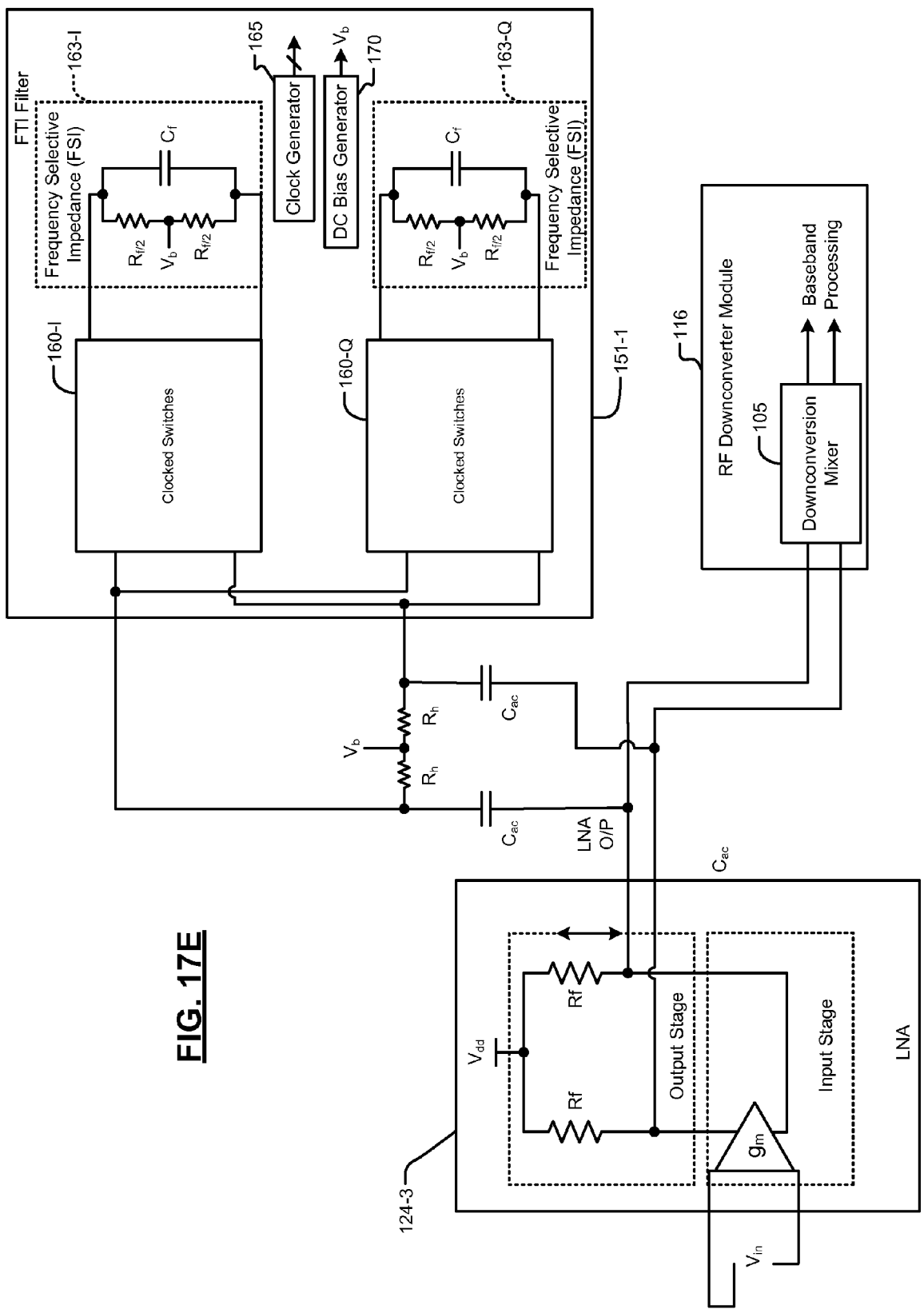
Figure 18A:
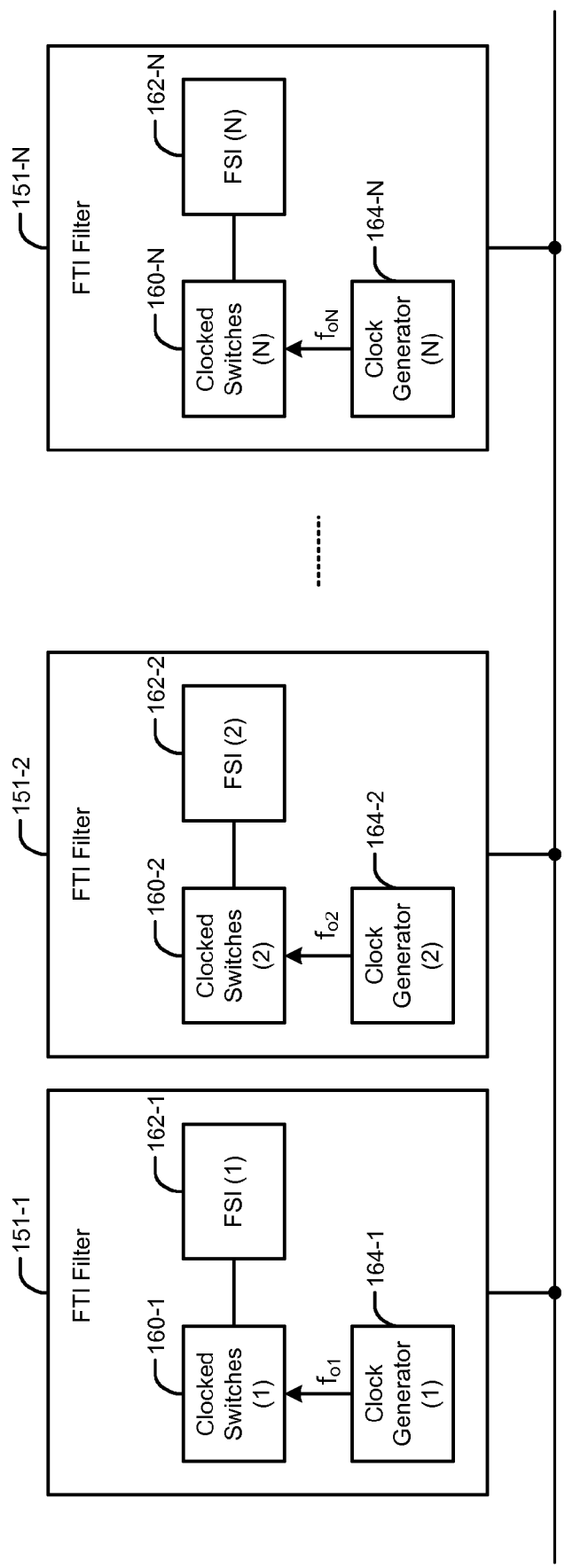
FIG. 18A depicts an exemplary configuration of the FTI filters of FIG. 7B according to the present disclosure.
Figure 18B:
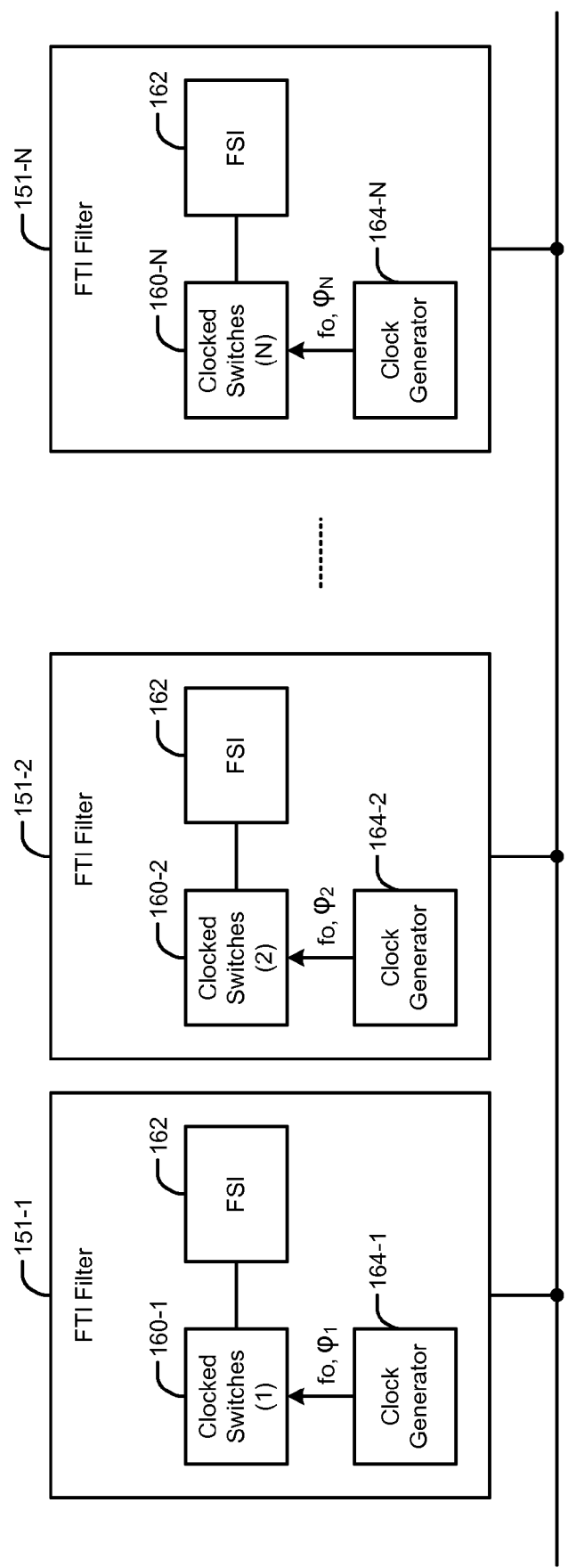
FIG. 18B depicts an exemplary configuration of the FTI filters of FIG. 7B according to the present disclosure.

Other configurations for supplying DC bias to the switches in the FTI filters are possible. In each of the FIGS. 17A-17D, values of $R_{f2}$ may be different. In FIG. 17E, resistances $R_f$ may be used as load resistors in the output stage of LNA 124-3. The parallel combination of the load impedance of the LNA 124-3 and the FTI biasing resistance, and the capacitances $C_f$ of a FTI filter 151-5 may determine a time constant of the FTI filter 151-5.

Another strategy can be utilized to attenuate blockers in different frequency bands. Notch filters may be used to attenuate the blockers at different known frequencies. Referring now to FIGS. 18A-18C, multiple FTI filters 151 may be arranged in parallel to attenuate blockers having different frequencies. In FIG. 8B, FTI filters 151-1, 151-2, ..., and FTI filter 151-N (collectively FTI filters 151) may be arranged between the amplifier 115 and the RF downconverter module 116. The FTI filters 151 and the RF downconverter module 116 and preferably the LNA 124 may be integrated in an IC.

Figure 17F:
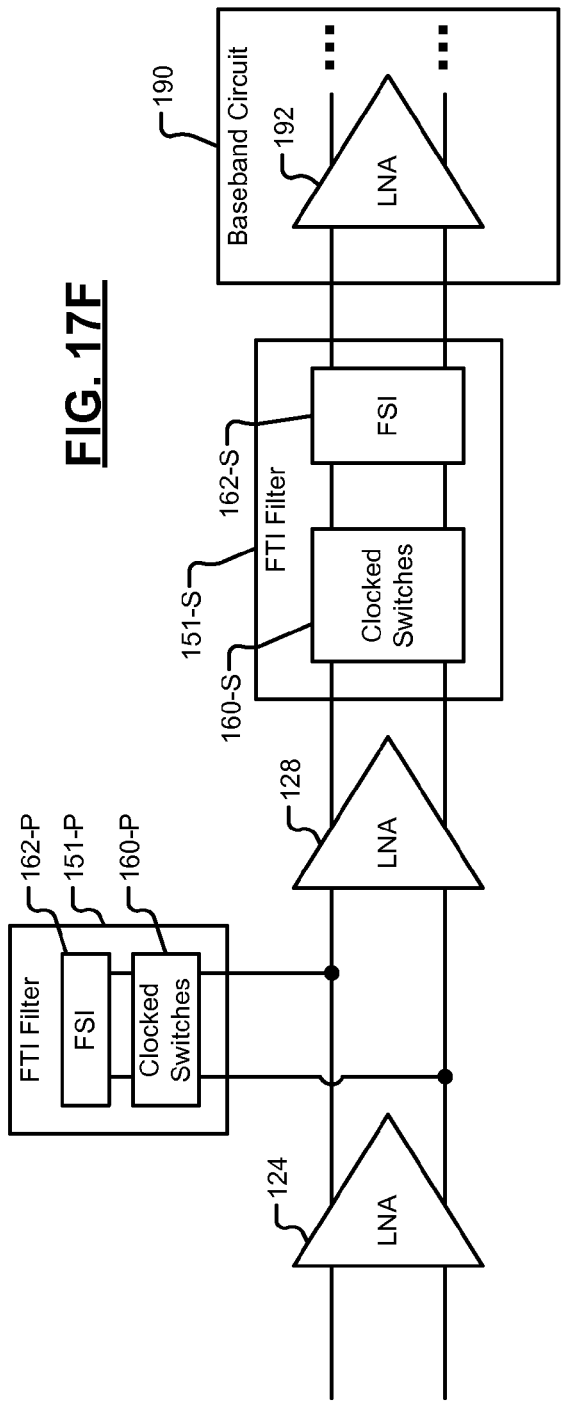
FIGS. 17F-17G are a functional block diagrams of FTI filters that output baseband signals to baseband LNAs.
Figure 17G:
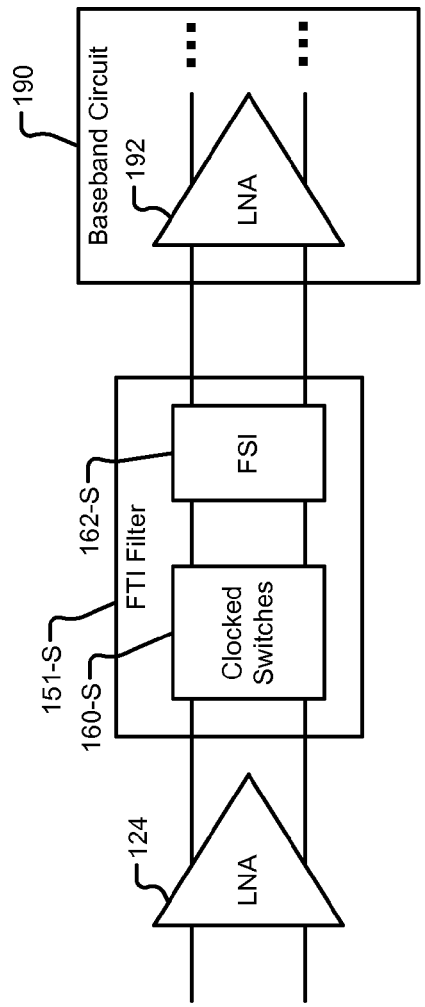

Referring now to FIGS. 17F and 17G, the FTI filters may also be arranged in other configurations. In FIG. 17F, an FTI filter 151-P is arranged between the LNA 124 and the LNA 128 as shown above. In addition, an FTI filter 151-S is arranged in series between the LNA 128 and the LNA 192 of the baseband circuit 190. The signal output by or across the FSI 162-S is a baseband signal that may be amplified by the LNA 192 of the baseband circuit 190. An RF downconverting module may be eliminated. The FTI filters 151-S and 151-P include clocked switches 160-S and 160-P and FSI 162-S and 162-P, respectively, as described herein. For example only, the FSI 162-S and 162-P can comprise capacitances, inductances, resistances, $N^{th}$ order passive filters and/or $M^{th}$ order active filters, where N and M are integers greater than zero. The baseband circuit 190 may comprise additional components as described herein. Gain provided by the arrangement in FIG. 17F is based on a product of gains of the LNA 124, 128 and 192.

For applications requiring lower gain, the LNA 128 and FTI filter 151-P may be omitted. In FIG. 17G, the FTI filter 151-S is arranged in series between the LNA 124 and the LNA 192 of the baseband circuit 190. The FTI filter 151-S includes clocked switches 160-S and FSI 162-S as described herein. The baseband circuit 190 may comprise additional components as described herein. The gain provided by the arrangement in FIG. 17F is based on a product of gains of the LNA 124 and 192. For example only, the FSI filters can be inductances, capacitances, $N^{th}$ order passive filters and/or $M^{th}$ order active filters, where N and M are integers greater than zero. The baseband circuit 190 may comprise additional components as described herein.

In FIG. 18A, each of the FTI filters 151 may comprise clocked switches 160-1, 160-2, ..., and 160-N (collectively clocked switches 160) that is clocked at a different clock frequency and that drives a different FSI 162-1, 162-2, ..., and 162-N (collectively FSI 162). Each FSI 162 may implement a different filter (e.g., a low-pass or a high-pass filter). Each of the FTI filters 151 may comprise a clock generator 164-1, 164-2, ..., and 164-N (collectively clock generators 164) that generates clock signals of a different clock frequency. The clock frequencies may be fixed, programmable, or adaptively controlled. Each of the FTI filters 151 may attenuate or filter blockers at a different frequency.

Alternatively, in FIG. 18B, each of the FTI filters 151 may comprise a set of clocked switches 160 that is clocked at a predetermined clock frequency $f_o$ that is the same in each filter. The phase $\phi_i$ of the clock signals that clock each set of clocked switches 160 may, however, be different or offset as shown in FIG. 18C. Each FSI 162 may have a predetermined time constant that is the same in each filter. Therefore, each FSI 162 is simply shown as FSI 162 in FIG. 18B. In some implementations, the clock generators 164 may generate clock signals having 25% duty cycle. (i.e., a clock having the same clock frequency but different phases). FTI filters implemented with a plurality of FTI filters connected in parallel and clocked with a multiphase clock (i.e., a clock with the same clock frequency but different phases) can minimize effects of charge injection and clock feedthrough from the clocked switches.

Referring now to FIG. 19, a method 300 for filtering blockers begins at step 302. The clock frequency $f_o$ of the clock generator 165 is selected based on the frequency $f_w$ of the wanted signal in step 304. The center frequency of the FTI filter comprising sections 151-I and 151-Q is determined based on $f_o$ in step 306. The time constant of the FSIs 162-I and 162-Q (e.g., values of $R_f$ and/or $C_f$) is selected based on frequency $f_o$ and the desired Q-factor of the FTI filter in step 308.

The clock generator 165 generates clock signals of frequency $f_o$ and 25% duty cycle in step 312. The clock signals clock the switches SW1-SW4 in the clocked switches 160-I and 160-Q in quadrature in step 314. The FTI filter attenuates blockers that may be present in the input signal by dissipating energy in the FSIs 162-I and 162-Q at the frequency of blockers in step 316. The FTI filter passes the wanted signal of frequency $f_w$ to the mixers 132, 134 in the receiver 104 in step 318. Steps 314 through 318 are repeated.

Referring now to FIG. 20, a method 350 for filtering blockers at multiple frequencies begins at step 352. Different clock frequencies are selected for clocking switches 160 in each FTI filter 151 in step 354. A different time constant is selected for each FSI 162 in each FTI filter 151 in step 356. The clock generator 164 generates clock signals of respective frequencies in each FTI filter 151 in step 360. The clock signals clock switches SW1-SW4 in the clocked switches 160 at respective clock frequencies in step 362. Each FTI filter 151 attenuates blockers having a different frequency by dissipating energy in the FSI 162 at the respective blocker frequency in step 364. The FTI filters 151 pass the wanted signal of frequency $f_w$ to the mixers 132, 134 in the receiver 104 in step 366. Steps 362 through 366 are repeated.

Referring now to FIG. 21, a method 400 for filtering blockers at multiple frequencies begins at step 402. A predetermined clock frequency is selected for clocking switches 160 in each FTI filter 151 in step 404. A predetermined time constant is selected for the FSI 162 in each FTI filter 151 in step 406. The clock generator 164 generates clock signals of the predetermined clock frequency but different phase in each filter 151 in step 410. The clock signals clock switches SW1-SW4 in the FSI 160 at the predetermined clock frequency but different phase in step 412. Each FTI filter 151 attenuates blockers having a different frequency by dissipating energy in the FSI 162 at the respective blocker frequency in step 414. The FTI filters 151($i$) pass the wanted signal of frequency $f_w$ to the mixers 132, 134 in the receiver 104 in step 416. Steps 412 through 416 are repeated.

Referring now to FIGS. 22A-23B, various exemplary implementations incorporating the teachings of the present disclosure are shown. Specifically, the exemplary implementations show that FTI filters can be implemented by ICs, thereby minimizing or eliminating the need for off-chip filters. Additionally, FTI filters can be used to attenuate blockers in receivers and unwanted spurious energy in transmitters that utilize mixers and other circuitry with more relaxed linearity requirements than would otherwise be needed without the use of FTI filters. For purposes of illustration, simplified block diagrams of super-heterodyne and direct conversion receiver and transmitter architectures will be discussed, although other architectures may be used. Although FTI filter 151 is used as an example, other FTI filters described above may be used.

Figure 22A:
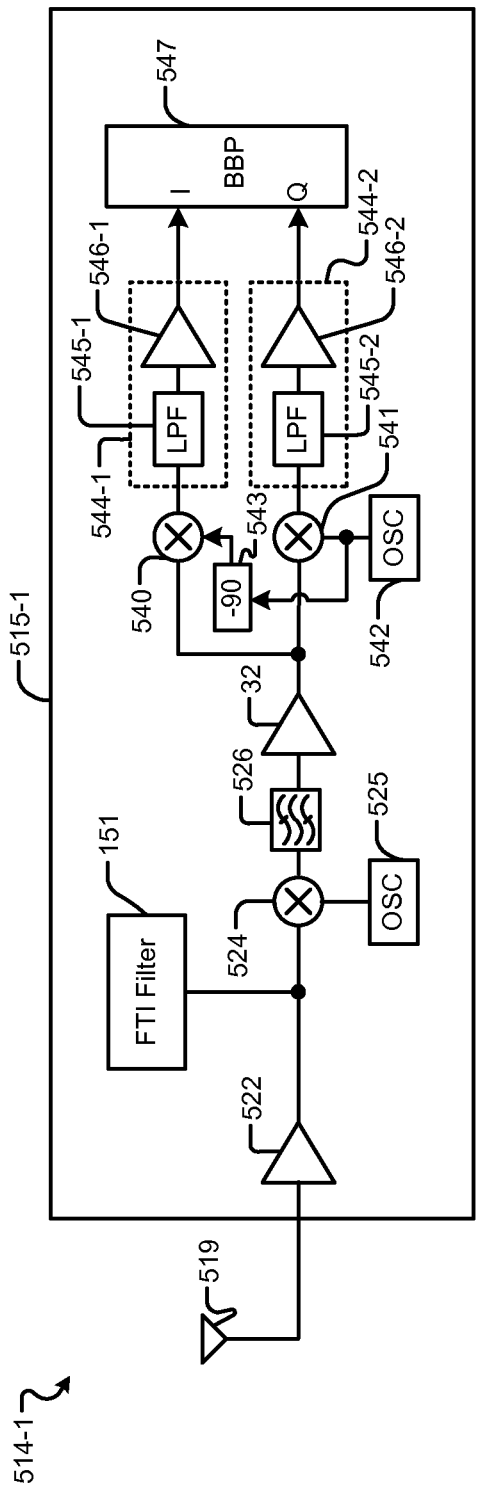
FIG. 22A is a functional block diagram of an exemplary receiver according to the present disclosure.

In FIG. 22A, the FTI filter 151 may used in an exemplary super-heterodyne receiver 514-1 as shown. Specifically, the receiver 514-1 including the FTI filter 151 may be implemented by an IC 515-1 as shown. The receiver 514-1 may communicate via an antenna 519 that is coupled to a low-noise amplifier (LNA) 522 that can be implemented on-chip as shown. An output of the LNA 522 is coupled to the FTI filter 151. The FTI filter 151 filters any blockers that may be present in the output of the LNA 522. The FTI filter 151 eliminates the need for any off-chip filters that may otherwise be necessary preceding and/or following the LNA 522 to attenuate blockers, particularly those at the image frequency. Although one FTI filter 151 is shown, more than one FTI filter 151 may be used. When having a bandpass response, the FTI filter 151 functions as the image rejection filter and may be clocked at the frequency of the desired channel.

The output of the LNA 522 with blockers filtered by the FTI filter 151 is coupled to a first input of a mixer 524. A second input of the mixer 524 is connected to an oscillator 525, which provides a reference frequency. The mixer 524 converts RF signals to intermediate frequency (IF) signals.

An output of the mixer 524 is connected to an optional IF filter 526, which has an output that is coupled to an automatic gain control amplifier (AGCA) 532. The IF filter 526 can also be an FTI filter. When the IF filter 526 is an FTI filter with a bandpass response, it may be clocked at the IF frequency.

An output of the AGCA 532 is coupled to first inputs of mixers 540 and 541. The mixers 540 and 541 may have relaxed linearity requirements since the FTI filter(s) will have filtered blockers. A second input of the mixer 541 is coupled to an oscillator 542 that provides a reference frequency. A second input of the mixer 540 is connected to the oscillator 542 through a −90° phase shifter 543.

The mixers 540 and 541 convert the IF signals to baseband (BB) signals. Outputs of the mixers 540 and 541 are coupled to BB circuits 544-1 and 544-2, respectively. The BB circuits 544-1 and 544-2 may include low pass filters (LPF) 545-1 and 545-2 and gain blocks 546-1 and 546-2, respectively, although other BB circuits may be used. Mixer 540 generates an in-phase (I) signal that is output to a BB processor 547. The mixer 541 generates a quadrature-phase (Q) signal that is output to the BB processor 547.

Figure 22B:
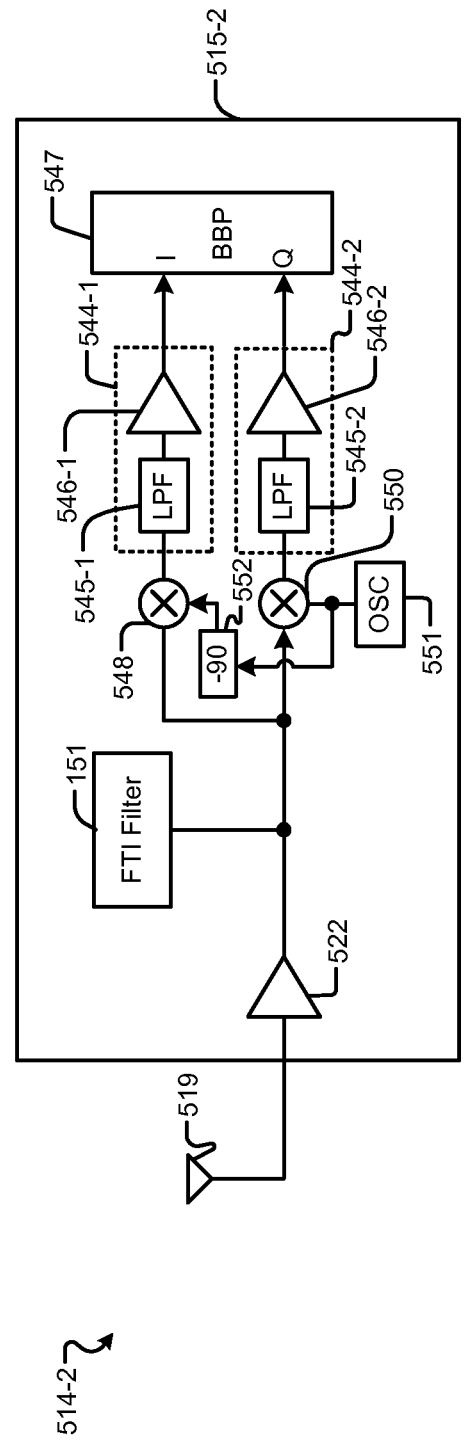
FIG. 22B is a functional block diagram of an exemplary receiver according to the present disclosure.

In FIG. 22B, the FTI filter 151 may be used in an exemplary direct conversion receiver 514-2 as shown. Specifically, the receiver 514-2 including the FTI filter 151 may be implemented by an IC 515-2 as shown. The receiver 514-2 may communicate via the antenna 519 that is coupled to the LNA 522 that can be integrated on-chip. An output of the LNA 522 is coupled to the FTI filter 151 that filters any blockers that may be present in the output of the LNA 522. The FTI filter 151 eliminates the need for any off-chip filters that may otherwise be necessary preceding and/or following the LNA 522 to attenuate blockers.

The output of the LNA 522 with blockers filtered by the FTI filter 151 is coupled to first inputs of RF-to-BB mixers 548 and 550. Since the FTI filter 151 filters the blockers, the mixers 548 and 550 and associated circuitry may have relaxed linearity ratings.

For example, when mixers 548 and 550 are implemented with passive mixers, the passive mixers may be preceded by transconductors (not shown) that convert the input voltage to an output current. The output current of the transconductors are input to the passive mixers. The output of the passive mixers may be connected to transimpedance amplifiers (not shown) which convert the current output from the passive mixers to voltages. The FTI filter may relax linearity ratings of each of these circuits.

A second input of the mixer 550 is connected to an oscillator 551 that provides a reference frequency. A second input of the mixer 548 is connected to the oscillator 551 through a −90° phase shifter 552. The mixer 458 outputs the I-signal to the BB circuit 544-1, which may include the LPF 545-1 and the gain block 546-1. An output of the BB circuit 544-1 is input to the BB processor 547. The mixer 550 outputs the Q-signal to the BB circuit 544-2, which may include the LPF 545-2 and the gain block 546-2. An output of the BB circuit 544-2 is input to the BB processor 547. Similar techniques with the associated advantages may also be utilized in low-IF architectures.

Figure 23A:
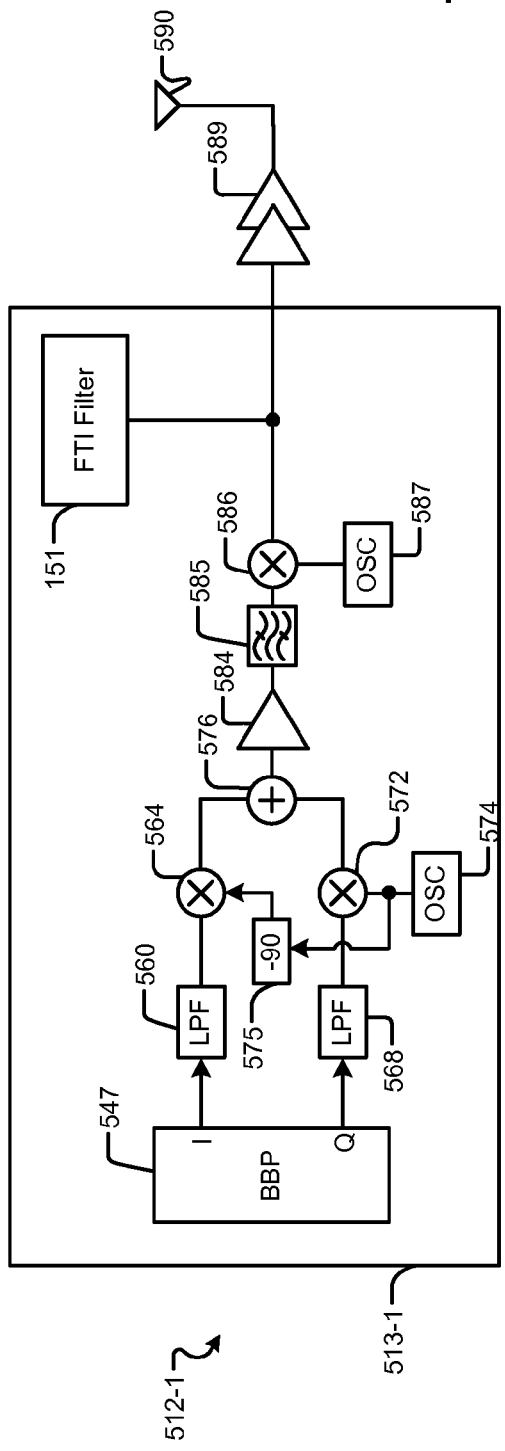
FIG. 23A is a functional block diagram of an exemplary transmitter according to the present disclosure.

Referring now to FIG. 23A, the FTI filter 151 may be used in an exemplary super-heterodyne transmitter 512-1 as shown. Specifically, the transmitter 512-1 and the FTI filter 151 may be implemented by an IC 513-1 as shown. The transmitter 512-1 receives an I-signal from the BB processor 547. The I-signal is input to a LPF 60 that is coupled to a first input of a BB to IF mixer 564. A Q-signal of the BB processor 547 is input to a LPF 568 that is coupled to a first input of a BB to IF mixer 572. The mixer 572 has a second input that is coupled to an oscillator 574, which provides a reference frequency. The mixer 564 has a second input that is coupled to the oscillator through a −90° phase shifter 575.

Outputs of the mixers 564 and 552 are input to a summer 576. The summer 576 combines the signals into a signal that is input to a variable gain amplifier (VGA) 584. The VGA 584 is coupled to an optional IF filter 585. The optional IF filter 585 may be implemented with an FTI filter. The optional IF filter 585 is connected to a first input of an IF to RF mixer 586. A second input of the mixer 586 is connected to an oscillator 587, which provides a reference frequency. An output of the mixer 586 is coupled to a power amplifier 589, which may include a driver. The power amplifier 589 drives an antenna 590. Additionally, the output of the mixer 586 may be coupled to the FTI filter 151.

The FTI filter 151 may filter residual signals that may result in spurious transmissions. The FTI filter 151 may also reduce residual signals that may otherwise be input to a receiver (not shown) if the transmitter 512-1 and the receiver are implemented in the IC 513-1 to transmit and receive data simultaneously.

Figure 23B:
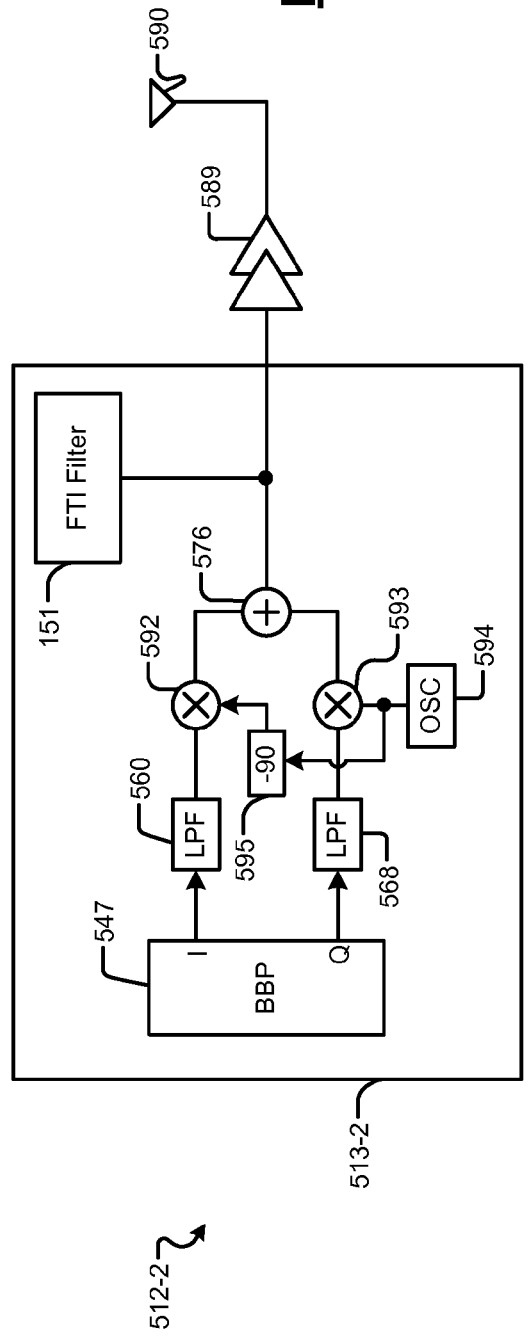
FIG. 23B is a functional block diagram of an exemplary transmitter according to the present disclosure.

Referring now to FIG. 23B, the FTI filter 151 may be used in an exemplary direct transmitter 512-2 as shown. Specifically, the transmitter 512-2 and the FTI filter 151 may be implemented by an IC 513-2 as shown. The transmitter 512-2 receives the I-signal from the BB processor 547. The I-signal is input to the LPF 560, which has an output that is coupled to a first input of a BB to RF mixer 592. The Q-signal of the BB processor 547 is input to the LPF 568, which is coupled to a first input of a BB to RF mixer 593. The mixer 593 has a second input that is coupled to an oscillator 594, which provides a reference frequency. The mixer 592 has a second input that is connected to the oscillator 594 through a −90° phase shifter 595.

Outputs of the mixers 592 and 593 are input to the summer 576. The summer 576 combines the signals into a signal that is input the power amplifier 589. The power amplifier 589 drives the antenna 590. Additionally, the output of summer 576 is input to the FTI filter 151. The FTI filter 151 may filter residual signals that may result in spurious transmissions. The FTI filter 151 may also filter residual signals that may otherwise be input to a receiver (not shown) if the transmitter 512-2 and the receiver are implemented in the IC 513-2 to transmit and receive data simultaneously.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

Figure 24:
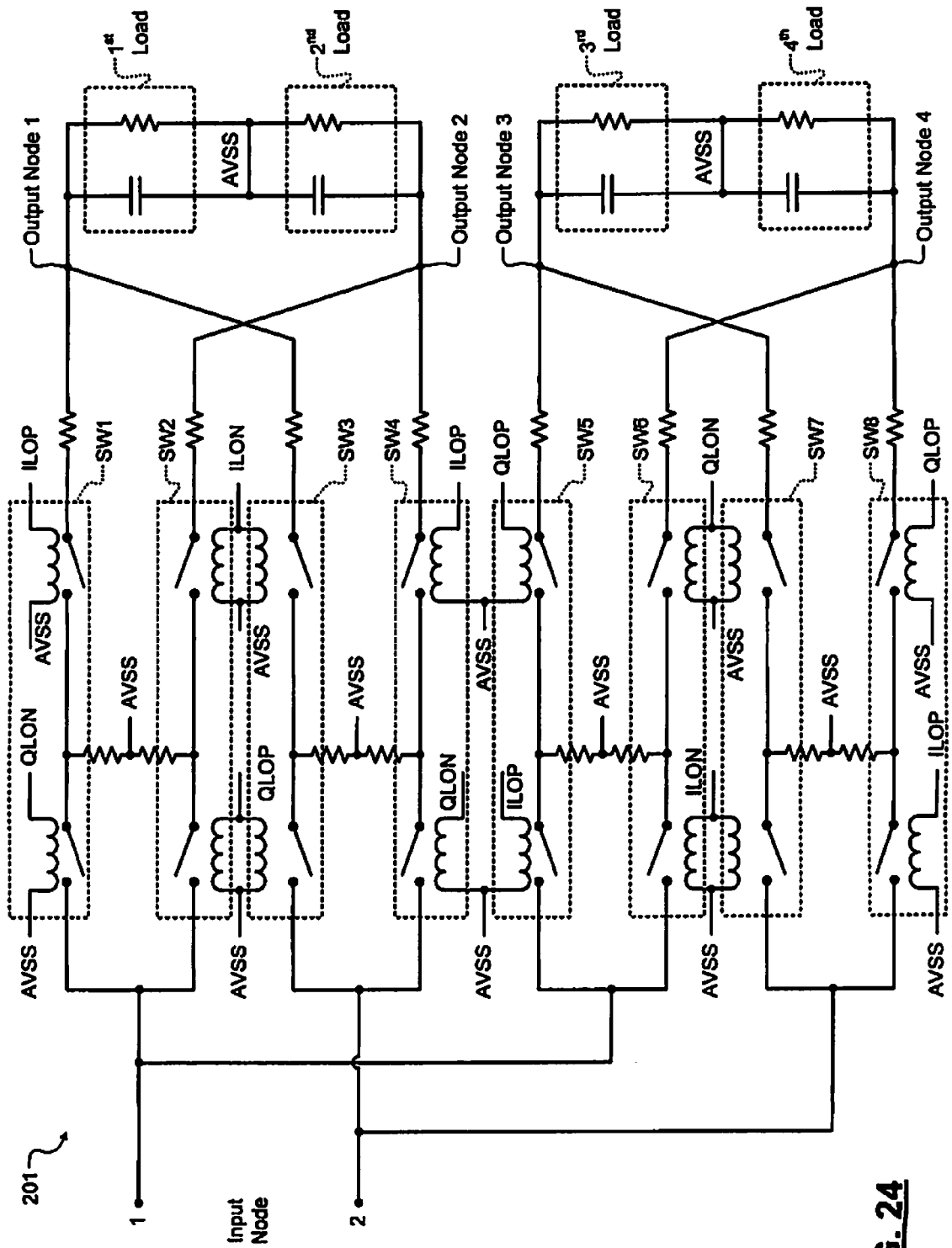
FIG. 24 is an example of a schematic of an FTI filter according to the present disclosure.

Referring now to FIGS. 24, 12B, and 13, a FTI filter 201 is shown for example only. In FIG. 24, the FTI filter 201 includes eight switches SW1 through SW8 that can be clocked by the clock signals shown in FIGS. 12B and 13. The switches SW1 through SW8 are configured to communicate with an input node of the FTI filter 201. The input node has a first terminal and a second terminal that are configured to receive a differential input signal. Each of the switches SW1 through SW8 has a first terminal and a second terminal. The first terminals of the first, second, fifth, and sixth switches (SW1, SW2, SW5, and SW6) are connected to the first terminal of the input node. The first terminals of the third, fourth, seventh, and eighth switches (SW3, SW4, SW7, and SW8) are connected to the second terminal of the input node. The second terminals of the first and third switches (SW1 and SW3) are connected to a first output node of the FTI filter 201. The second terminals of the second and fourth switches (SW2 and SW4) are connected to a second output node of the FTI filter 201. The second terminals of the fifth and seventh switches (SW5 and SW7) are connected to a third output node of the FTI filter 201. The second terminals of the sixth and eighth switches (SW6 and SW8) are connected to a fourth output node of the FTI filter 201.

A third load has a first terminal connected to a reference potential (AVSS) and a second terminal that is connected to the first output node and that communicates with the input node via the first and third switches SW1 and SW3 (i.e., via the output node). A second load has a first terminal connected to the reference potential and a second terminal that is connected to the second output node and that communicates with the input node via the second and fourth switches SW2 and SW4 (i.e., via the second output node). A third load has a first terminal connected to the reference potential and a second terminal that is connected to the third output node and that communicates with the input node via the fifth and seventh switches SW5 and SW7 (i.e., via the third output node). A fourth load has a first terminal connected to the reference potential and a second terminal that is connected to the fourth output node and that communicates with the input node via the sixth and eighth switches SW6 and SW8 (i.e., via the fourth output node).

The first output node connects to the first terminal of the input node and the second output node connects to the second terminal of the input node when the first and fourth switches SW1 and SW4 are turned on by a first clock signal (e.g., ILOP). The first output node connects to the first terminal of the input node when the second and third switches SW2 and SW3 are turned on by a second clock signal (e.g., ILON) and when the first and fourth switches SW1 and SW4 are turned off by the first clock signal (e.g., ILOP). The third output node connects to the first terminal of the input node when the fifth and eighth switches SW5 and SW8 are turned on by a third clock signal (e.g., QLOP). The third output node connects to the second terminal of the input node and the fourth output node connects to the first terminal of the input node when the sixth and seventh switches SW6 and SW7 are turned on by a fourth clock signal (e.g., QLON) and when the fifth and eighth switches SW5 and SW8 are turned off by the third signal (e.g., QLOP).

The second terminal of the first load connects to the first terminal of the input node and the second terminal of the second load connects to the second terminal of the input node when the first and fourth switches SW1 and SW4 are turned on by the first clock signal (e.g., ILOP). The second terminal of the first load connects to the second terminal of the input node and the second terminal of the second load connects to the first terminal of the input node when the second and third switches SW2 and SW3 are turned on by the second clock signal (e.g., ILON) and when the first and fourth switches SW1 and SW4 are turned off by the first clock signal (e.g., ILOP). The second terminal of the third load connects to the first terminal of the input node and the second terminal of the fourth load connects to the second terminal of the input node when the fifth and eighth switches SW5 and SW8 are turned on by the third clock signal (e.g., QLOP). The second terminal of the third load connects to the second terminal of the input node and the second terminal of the fourth load connects to the first terminal of the input node when the sixth and seventh switches SW6 and SW7 are turned on by the fourth clock signal (e.g., QLON) and when the fifth and eighth switches SW5 and SW8 are turned off by the third clock signal (e.g., QLOP).

What is claimed is:

1. A system comprising:
   a filter configured to
   receive, from a node, (i) a first signal and (ii) a second signal, and
   filter the second signal, wherein the filter includes a first input impedance, and wherein the filter comprises
   a first plurality of switches configured to communicate with the node, wherein the first plurality of switches is clocked at a first frequency, and wherein the first frequency is based on a frequency of the first signal, and
   a first circuit configured to communicate with an output of the plurality of switches, wherein the first circuit includes a second input impedance, and wherein the second input impedance is different than the first input impedance; and
   a downconverter configured to (i) receive the first signal and (ii) downconvert the first signal,
   wherein (i) the filter and (ii) the downconverter are connected in parallel to the node.

2. The system of claim 1, wherein the first input impedance has a first frequency response, wherein the second input impedance has a second frequency response, and wherein the first frequency response is based on:
   the second frequency response translated to the first frequency and mirrored around the first frequency.

3. The system of claim 1, wherein the first input impedance has a band-pass frequency response when the second input impedance has a low-pass frequency response, and wherein the first input impedance has a notch frequency response when the second input impedance has a high-pass frequency response.

4. The system of claim 2, wherein the filter further comprises:
   a second plurality of switches configured to communicate with the node, wherein the second plurality of switches is clocked at the first frequency; and
   a second circuit configured to communicate with an output of the second plurality of switches, wherein the second circuit includes a third input impedance, and wherein the third input impedance is different than the first input impedance.

5. The system of claim 4, further comprising a clock generator configured to generate:
   a first plurality of clock signals having (i) a first phase and (ii) the first frequency, wherein the first plurality of clock signals clocks the first plurality of switches at a predetermined duty cycle, and
   a second plurality of clock signals having (i) a second phase and (ii) the first frequency, wherein the second plurality of clock signals clocks the second plurality of switches at the predetermined duty cycle, and
   wherein the second phase is offset relative to the first phase, and
   wherein the predetermined duty cycle is 25%.

6. The system of claim 4, wherein:
   the third input impedance has a third frequency response,
   the first frequency response is based on at least one of the second frequency response and the third frequency response, and
   the at least one of the second frequency response and the third frequency response is translated to the first frequency and mirrored around the first frequency.

7. The system of claim 4, wherein each of the first circuit and the second circuit has (i) a low-pass frequency response, (ii) a high-pass frequency response, or (iii) a notch frequency response.

8. The system of claim 4, wherein the first input impedance has a band-pass frequency response when at least one of the second input impedance and the third input impedance has a low-pass frequency response, and wherein the first input impedance has a notch frequency response when at least one of the second input impedance and the third input impedance has a high-pass frequency response.

9. The system of claim 4, wherein:
   the first circuit has a first time constant;
   a quality factor (Q-factor) of the filter is based on the first time constant and the first frequency;
   the second circuit has a second time constant; and
   the quality factor (Q-factor) of the filter is based on the second time constant and the first frequency.

10. The system of claim 4, wherein:
    the first plurality of switches is coupled to the node via a first coupling capacitance;
    the second plurality of switches is coupled to the node via a second coupling capacitance; and
    the first input impedance has a notch frequency response at frequencies less than the first frequency.

11. The system of claim 4, wherein the first plurality of switches is coupled to the node via a first coupling capacitance, and the second plurality of switches is coupled to the node via a second coupling capacitance, the system further comprising:
 a bias generator configured to generate a bias voltage to bias the first circuit and the second circuit,
 wherein each of the first circuit and the second circuit comprises a filter capacitance, a first filter resistance, and a second filter resistance,
 wherein the filter capacitance is connected in parallel to a series connection of the first filter resistance and the second filter resistance, and
 wherein the bias voltage is applied at an interconnection of the first filter resistance and the second filter resistance.

12. The system of claim 4, wherein the first plurality of switches is coupled to the node via a first coupling capacitance, and the second plurality of switches is coupled to the node via a second coupling capacitance, the system further comprising:
 a bias generator configured to generate a bias voltage to bias the first circuit and the second circuit,
 wherein each of the first circuit and the second circuit comprises a filter capacitance,
 wherein each switch of the first plurality of switches and the second plurality of switches includes a first end and a second end,
 wherein first ends of the first plurality of switches and the second plurality of switches communicate with the first coupling capacitance, and
 wherein second ends of the first plurality of switches and the second plurality of switches communicate with the second coupling capacitance.

13. The system of claim 12, further comprising:
 a first filter resistance connected in series with a second filter resistance; and
 a third filter resistance connected in series with a fourth filter resistance,
 wherein the bias voltage is applied at an interconnection of the first filter resistance and the second filter resistance and at an interconnection of the third filter resistance and the fourth filter resistance,
 wherein the first ends of the first plurality of switches and the second plurality of switches communicate with the first filter resistance and the third filter resistance; and
 the second ends of the first plurality of switches and the second plurality of switches communicate with the second filter resistance and fourth filter resistance.

14. The system of claim 12, further comprising:
 a first filter resistance connected in series with a second filter resistance,
 wherein the bias voltage is applied at an interconnection of the first filter resistance and the second filter resistance,
 wherein the first ends of the first plurality of switches and the second plurality of switches communicate with the first filter resistance, and
 wherein the second ends of the first plurality of switches and the second plurality of switches communicate with the second filter resistance.

15. The system of claim 12, further comprising:
 a first coupling resistance connected in series with a second coupling resistance,
 wherein the bias voltage is applied at an interconnection of the first coupling resistance and the second coupling resistance,
 wherein the first ends of the first plurality of switches and the second plurality of switches communicate with the first coupling resistance; and
 wherein the second ends of the first plurality of switches and the second plurality of switches communicate with the second coupling resistance.

16. The system of claim 15, further comprising:
 a first filter resistance connected in series with a second filter resistance,
 wherein the first filter resistance communicates with the node and the first coupling capacitance, and
 wherein the second filter resistance communicates with the node and the second coupling capacitance.

17. The system of claim 15, further comprising:
 a differential input low-noise amplifier configured to generate (i) the first signal and (ii) the second signal,
 wherein the low-noise amplifier includes an output stage, and
 wherein the output stage includes filter resistances of the first circuit and the second circuit as load resistances.

18. The system of claim 4, wherein the first plurality of switches is coupled to the node via a first coupling capacitance, and the second plurality of switches is coupled to the node via a second coupling capacitance, the system further comprising:
 a bias generator configured to generate a bias voltage to bias the first circuit and the second circuit; and
 a differential input low-noise amplifier configured to generate the (i) the first signal and (ii) the second signal,
 wherein the low-noise amplifier includes an output stage, and
 wherein the output stage includes biasing circuits.

19. The system of claim 18, wherein:
 each of the biasing circuits includes a biasing impedance, and
 wherein a time constant of the filter is based on the biasing impedance, the second input impedance, and the third input impedance.

* * * * *